US012666782B2

(12) United States Patent
Cho et al.

(10) Patent No.: US 12,666,782 B2
(45) Date of Patent: Jun. 23, 2026

(54) DISPLAY DEVICE AND TILED DISPLAY DEVICE INCLUDING THE SAME

(71) Applicant: Samsung Display Co., LTD., Yongin-si (KR)

(72) Inventors: Sung Won Cho, Hwaseong-si (KR); Yun Jong Yeo, Hwaseong-si (KR); Hyun Min Cho, Hwaseong-si (KR); Dae Hwan Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 695 days.

(21) Appl. No.: 17/350,846

(22) Filed: Jun. 17, 2021

(65) Prior Publication Data

US 2022/0013576 A1     Jan. 13, 2022

(30) Foreign Application Priority Data

Jul. 9, 2020     (KR) ........................ 10-2020-0084608

(51) Int. Cl.
H10H 29/85 (2025.01)

(52) U.S. Cl.
CPC ................................. H10H 29/857 (2025.01)

(58) Field of Classification Search
CPC ... H01L 33/62; H01L 25/0753; H10H 20/857; H10H 29/30–49; H10H 29/857
See application file for complete search history.

(56) References Cited

U.S. PATENT DOCUMENTS

| 10,617,005 | B2 | 4/2020 | Lee |
| 11,171,194 | B2 | 11/2021 | Ryu et al. |
| 11,239,300 | B2 | 2/2022 | Lee et al. |
| 11,658,165 | B2 | 5/2023 | Kim |
| 12,408,519 | B2 | 9/2025 | Lee et al. |

(Continued)

FOREIGN PATENT DOCUMENTS

| CN | 107546242 | A | 1/2018 |
| CN | 107946339 | A | 4/2018 |

(Continued)

OTHER PUBLICATIONS

Extended European search report for European Patent Application or Patent No. 21182752.2 dated Apr. 4, 2022.

*Primary Examiner* — Lauren R Bell
(74) *Attorney, Agent, or Firm* — Womble Bond Dickinson (US) LLP

(57)     ABSTRACT
A display device includes a substrate including a first contact hole disposed on a surface of the substrate, a first connection line disposed on the surface of the substrate and electrically connected to a pad unit disposed on another surface opposite to the surface of the substrate through the first contact hole, a filling part filling a depression of the first connection line formed in the first contact hole to planarize an upper surface of the first connection line, a thin film transistor layer disposed on the substrate and the first connection line, the thin film transistor layer comprising at least one thin film transistor, and a light emitting element layer disposed on the thin film transistor layer, the light emitting element layer including a light emitting element electrically connected to the at least one thin film transistor. The thin film transistor layer comprises a second connection line.

10 Claims, 31 Drawing Sheets

(56)  References Cited

U.S. PATENT DOCUMENTS

| | | | |
|---|---|---|---|
| 12,444,724 B2 | 10/2025 | Kim | |
| 2003/0034497 A1* | 2/2003 | Yamazaki | H10K 71/00 |
| | | | 257/86 |
| 2014/0319496 A1* | 10/2014 | Kim | H10K 77/111 |
| | | | 257/40 |
| 2015/0021081 A1* | 1/2015 | Mitarai | H05K 3/4697 |
| | | | 29/846 |
| 2015/0362165 A1 | 12/2015 | Chu et al. | |
| 2015/0372065 A1* | 12/2015 | Yamazaki | H10K 59/131 |
| | | | 257/89 |
| 2016/0248399 A1* | 8/2016 | Oikawa | H10N 30/40 |
| 2017/0338246 A1* | 11/2017 | Kubota | G02F 1/136286 |
| 2018/0012549 A1* | 1/2018 | Lee | G09G 3/3266 |
| 2019/0074324 A1 | 3/2019 | Kim et al. | |
| 2019/0164854 A1 | 5/2019 | Liu et al. | |
| 2019/0324577 A1 | 10/2019 | Pan | |
| 2020/0075814 A1* | 3/2020 | Park | H01L 25/0753 |
| 2020/0105847 A1* | 4/2020 | Park | H10K 59/124 |
| 2020/0203462 A1* | 6/2020 | Oh | H10K 59/40 |
| 2020/0321488 A1* | 10/2020 | Leng | G06F 3/04144 |
| 2021/0074798 A1* | 3/2021 | Kim | H10K 50/844 |
| 2021/0202530 A1 | 7/2021 | Yao et al. | |
| 2021/0217806 A1* | 7/2021 | Xi | H01L 33/62 |
| 2022/0052078 A1* | 2/2022 | Kim | H01L 25/0753 |
| 2022/0093649 A1* | 3/2022 | Kim | H01L 25/167 |
| 2022/0115572 A1* | 4/2022 | Yang | H01L 25/167 |
| 2022/0121072 A1* | 4/2022 | Chen | H10K 59/131 |
| 2022/0181384 A1* | 6/2022 | Park | H10H 20/857 |
| 2022/0285428 A1* | 9/2022 | Jo | H10H 20/851 |
| 2022/0293636 A1* | 9/2022 | Lee | H01L 25/0753 |
| 2022/0293670 A1* | 9/2022 | Lee | G09F 9/3026 |
| 2022/0320395 A1* | 10/2022 | Ryu | H01L 25/167 |
| 2022/0328724 A1* | 10/2022 | Jang | H10H 20/831 |

FOREIGN PATENT DOCUMENTS

| | | | | |
|---|---|---|---|---|
| CN | 110021620 A | 7/2019 | | |
| CN | 111244136 A | 6/2020 | | |
| JP | 6320713 | 5/2018 | | |
| JP | 2019-66604 | 4/2019 | | |
| KR | 2001-0041001 | 5/2001 | | |
| KR | 10-2006-0001661 | 1/2006 | | |
| KR | 10-2006-0072737 | 6/2006 | | |
| KR | 10-2012-0059575 | 6/2012 | | |
| KR | 10-2015-0141392 | 12/2015 | | |
| KR | 10-2016-0038959 | 4/2016 | | |
| KR | 20160038959 A * | 4/2016 | | H10K 77/111 |
| WO | 2018/223696 | 12/2018 | | |

* cited by examiner

LA: LA1, LA2, LA3
BA: BA1, BA2, BA3

WLC1
BS1 SCT1 WLS1

WLC2
BS2 SCT2 WLS2

LTU
BS3 SCT3 CF3

CF1

CF2

TFE
PAS3 ⎫
BK2 ⎬ CFL

OC3 ⎫
CAP2
BK1 ⎬ WLCL
CAP1 ⎭

OC2 ⎫
CE ED AE

IL1

PAS2
BNK2 ⎬ EML
BNK1 ⎭

TFTL

CNE

BF

SUB

DE GE ACT SE GI ILD    PAS1 OC1

TFT

DISPLAY DEVICE AND TILED DISPLAY DEVICE INCLUDING THE SAME

CROSS-REFERENCE TO RELATED APPLICATION(S)

This application claims priority to and the benefit of Korean Patent Application No. 10-2020-0084608 under 35 U.S.C. § 119, filed in the Korean Intellectual Property Office (KIPO) on Jul. 9, 2020, the entire contents of which are incorporated herein by reference.

BACKGROUND

1. Technical Field

The disclosure relates to a tiled display device and a tiled display device including the same.

2. Description of the Related Art

With the development of information society, requirements for display devices for displaying images have increased in various forms. For example, display devices are applied to various electronic appliances such as smart phones, digital cameras, notebook computers, navigators, and smart televisions. A display device may be a flat panel display device such as a liquid crystal display device, a field emission display device, or a light emitting display device. Since the light emitting display device, among flat panel display devices, includes light emitting elements by which each of the pixels in a display panel emits light by itself, the light emitting display device may display an image without a backlight unit providing light to the display panel.

In case that a display device is manufactured in a large size, the defective rate of light emitting elements may increase due to an increase in the number of pixels, and productivity or reliability may deteriorate. In order to solve the above and other problems, a tiled display device may be configured to include a large-sized screen by connecting display devices having relatively small sizes. The tiled display device may include a boundary portion called a seam between the display devices because of the non-display area or bezel area of each of the display devices adjacent to each other. In case that a single image is displayed on the entire screen, the boundary portion between the display devices gives a disconnection feeling on the entire screen, thereby reducing the immersion of the image.

SUMMARY

Aspects of the disclosure are to provide a tiled display device that prevents boundaries between the display devices from being visually recognized such that a user would view a non-disconnected image on the tiled display device and be more immersed in viewing the image.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a substrate comprising a first contact hole disposed on a surface of the substrate, a first connection line disposed on the surface of the substrate and electrically connected to a pad unit disposed on another surface opposite to the surface of the substrate through the first contact hole, a filling part filling a depression of the first connection line formed in the first contact hole to planarize an upper surface of the first connection line, a thin film transistor layer disposed on the substrate and the first connection line, the thin film transistor comprising at least one thin film transistor, and a light emitting element layer disposed on the thin film transistor layer, the light emitting element layer including a light emitting element electrically connected to the at least one thin film transistor. The thin film transistor layer may include a second connection line electrically connected between the first connection line and the at least one thin film transistor.

The filling part may include at least one of acrylic resin, epoxy resin, phenolic resin, polyamide resin, and polyimide resin.

The thin film transistor layer may comprise a gate insulating film disposed on the first connection line and the substrate, an interlayer insulating film disposed on the gate insulating film, and a connection electrode disposed on the interlayer insulating film and electrically connected to the at least one thin film transistor. The second connection line and the connect electrode may be disposed on a same layer.

The second connection line may be electrically connected to the first connection line through a second contact hole penetrating the interlayer insulating film and the gate insulating film.

The substrate may comprise a third contact hole disposed on the another surface of the substrate and connected to the first contact hole. The pad unit may be electrically connected to the first connection line through the third contact hole.

The first connection line may be exposed to the another surface of the substrate through the first contact hole and be electrically connected to the pad unit.

The substrate may comprise a plurality of light emitting areas and a plurality of light blocking areas surrounding the plurality of light emitting areas. The display device may further comprise a wavelength conversion layer disposed on the light emitting element layer, the wave length conversion layer including a wavelength conversion unit corresponding to a part of the plurality of light emitting areas and a light transmission unit corresponding to another part of the plurality of light emitting areas, and a color filter layer disposed on the wavelength conversion layer and including a plurality of color filters respectively corresponding to the plurality of light emitting areas.

The display device may further comprise a flexible film disposed on the another surface of the substrate and connected to the pad unit, and a source driver disposed on the flexible film and supplying a voltage to the second connection line.

According to an embodiment, a display device may include a substrate comprising a first contact hole disposed on a surface of the substrate, a first connection line disposed on the surface of the substrate and filling the first contact hole to include a flat upper surface, a thin film transistor layer disposed on the substrate and the first connection line, the thin film transistor layer comprising at least one thin film transistor, a light emitting element layer disposed on the thin film transistor layer, the light emitting element layer including a light emitting element electrically connected to the at least one thin film transistor, and a pad unit disposed on another surface opposite to the surface of the substrate and electrically connected to the first connection line. The thin film transistor layer may comprise a second connection line electrically connected between the first connection line and the at least one thin film transistor.

3

The thin film transistor layer may comprise a gate insulating film disposed on the first connection line and the substrate, an interlayer insulating film disposed on the gate insulating film, and a connection electrode disposed on the interlayer insulating film and electrically connected to the at least one thin film transistor. The second connection line and the connection electrode may be disposed on a same layer.

The second connection line may be electrically connected to the first connection line through a second contact hole penetrating the interlayer insulating film and the gate insulating film.

The second contact hole may overlap the first contact hole in a thickness direction of the substrate.

The substrate may comprise a third contact hole disposed on the another surface of the substrate and connected to the first contact hole. The pad unit may be electrically connected to the first connection line through the third contact hole.

The first connection line may be exposed to the another surface of the substrate through the first contact hole and be electrically connected to the pad unit.

According to an embodiment, a display device may include a first substrate comprising a first contact hole disposed on a surface of the substrate, a first connection line disposed on the surface of the first substrate and electrically connected to a pad unit disposed on another surface opposite to the surface of the first substrate through the first contact hole, a second substrate planarizing upper portions of the first substrate and the first connection line, the first and second substrates including a same material, a thin film transistor layer disposed on the second substrate, the thin film transistor comprising at least one thin film transistor, and a light emitting element layer disposed on the thin film transistor layer, the light emitting element layer including a light emitting element electrically connected to the at least one thin film transistor. The thin film transistor layer may comprise a second connection line electrically connected between the first connection line and the at least one thin film transistor.

The thin film transistor layer may comprise a gate insulating film disposed on the second substrate, an interlayer insulating film disposed on the gate insulating film, and a connection electrode disposed on the interlayer insulating film and electrically connected to the at least one thin film transistor. The second connection line and the connection electrode may be disposed on a same layer.

The second connection line may be electrically connected to the first connection line through a second contact hole penetrating the interlayer insulating film, the gate insulating film, and the second substrate.

The first substrate may comprise a third contact hole disposed on the another surface of the first substrate and connected to the first contact hole. The pad unit may be electrically connected to the first connection line through the third contact hole.

The first connection line may be exposed to the another surface of the first substrate through the first contact hole and be electrically connected to the pad unit.

According to an embodiment, a display device may include a plurality of display devices each including a display area including a plurality of pixels and a non-display area adjacent to the display area, and a coupling member connecting the plurality of devices. Each of the plurality of devices may include a substrate comprising a first contact hole disposed on a surface of the substrate, a first connection line disposed on the surface of the substrate and electrically connected to a pad unit disposed on another surface opposite to the surface of the substrate through the first contact hole, a filling part filling a depression of the first connection line formed in the first contact hole to planarize an upper surface of the first connection line, a thin film transistor layer disposed on the substrate and the first connection line, the thin film transistor layer comprising at least one thin film transistor, and a light emitting element layer disposed on the thin film transistor layer, the light emitting element layer including a light emitting element electrically connected to the at least one thin film transistor. The thin film transistor layer may include a second connection line electrically connected between the first connection line and the at least one thin film transistor.

BRIEF DESCRIPTION OF THE DRAWINGS

The above and other aspects and features of the disclosure will become more apparent by describing in detail exemplary embodiments thereof with reference to the attached drawings, in which:

FIG. 15 a schematic cross-sectional view of a tiled display device according to another embodiment taken along line III-III' of FIG. 7;

FIG. 25 is a schematic cross-sectional view of a tiled display device according to another embodiment taken along line III-III' of FIG. 7;

FIG. 28 is a schematic cross-sectional view of a tiled display device according to another embodiment taken along line III-III' of FIG. 7;

DETAILED DESCRIPTION OF THE EMBODIMENTS

Figure 1:
FIG. 1 is a schematic plan view of a tiled display device according to an embodiment.

In the following description, for the purposes of explanation, numerous specific details are set forth in order to provide a thorough understanding of various exemplary embodiments or implementations of the disclosure. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different but do not have to be exclusive. For example, specific shapes, configurations, and characteristics of an embodiment may be used or implemented in another embodiment without departing from the disclosure.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. In case that an embodiment is implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

Unless otherwise defined or implied herein, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and the disclosure, and should not be interpreted in an ideal or excessively formal sense unless clearly defined herein.

FIG. 1 is a schematic plan view of a tiled display device according to an embodiment.

Referring to FIG. 1, a tiled display device TD may include display devices 10. The display devices 10 may be arranged in a grid shape, but the disclosure is not limited thereto. The display devices 10 may be connected in a first direction (X-axis direction) or a second direction (Y-axis direction), and the tiled display device TD may have a specific shape. For example, each of the display devices 10 may have the same size as each other, but the disclosure is not limited thereto. For another example, the display devices 10 may have different sizes from each other.

Each of the display devices 10 may have a rectangular shape including long sides and short sides. The display devices 10 may be arranged with long sides or short sides connected to each other. Some display devices 10 may be disposed on the edge of the tiled display device TD to form one side of the tiled display device TD. Some other display devices 10 may be disposed at corners of the tiled display device TD to form two adjacent sides of the tiled display device TD. Another display device 10 may be disposed inside the tiled display device TD to be surrounded by other display devices 10.

Each of the display devices 10 may include a display area DA and a non-display area NDA. The display area DA may include pixels to display an image. The non-display area NDA may be disposed adjacent to the display area DA or around the display area DA to surround the display area DA and may not display an image.

The tiled display device TD may have a planar shape as a whole, but the disclosure is not limited thereto. The tiled display device TD may have a three-dimensional shape, thereby providing a three-dimensional effect to a user. For example, in case that the tiled display device TD has a three-dimensional shape, at least some of the display devices 10 may have a curved shape. For another example, the display devices 10 have a planar shape and area connected to each other at a predetermined angle, so that the tiled display device TD may have a three-dimensional shape.

The tiled display device TD may be formed by connecting the non-display areas NDA of the adjacent display devices 10. The display devices 10 may be connected to each other through a connection member or an adhesive member. Accordingly, the non-display area NDA between the display devices 10 may be surrounded by the adjacent display areas DA. The distance between the display areas DA of each of the display devices 10 may be close to such a degree that the non-display area NDA between the display devices 10 or the boundary between the display devices 10 may not be recognized by a user. The external light reflectance of the display area DA of each of the display devices 10 may be substantially identical to the external light reflectance of the non-display area NDA between the display devices 10. Accordingly, the tiled display device TD may remove the disconnection feeling between the display devices and improving the immersion of an image by preventing the boundary portion or the non-display area between the display devices from being visually recognized.

Figure 2:
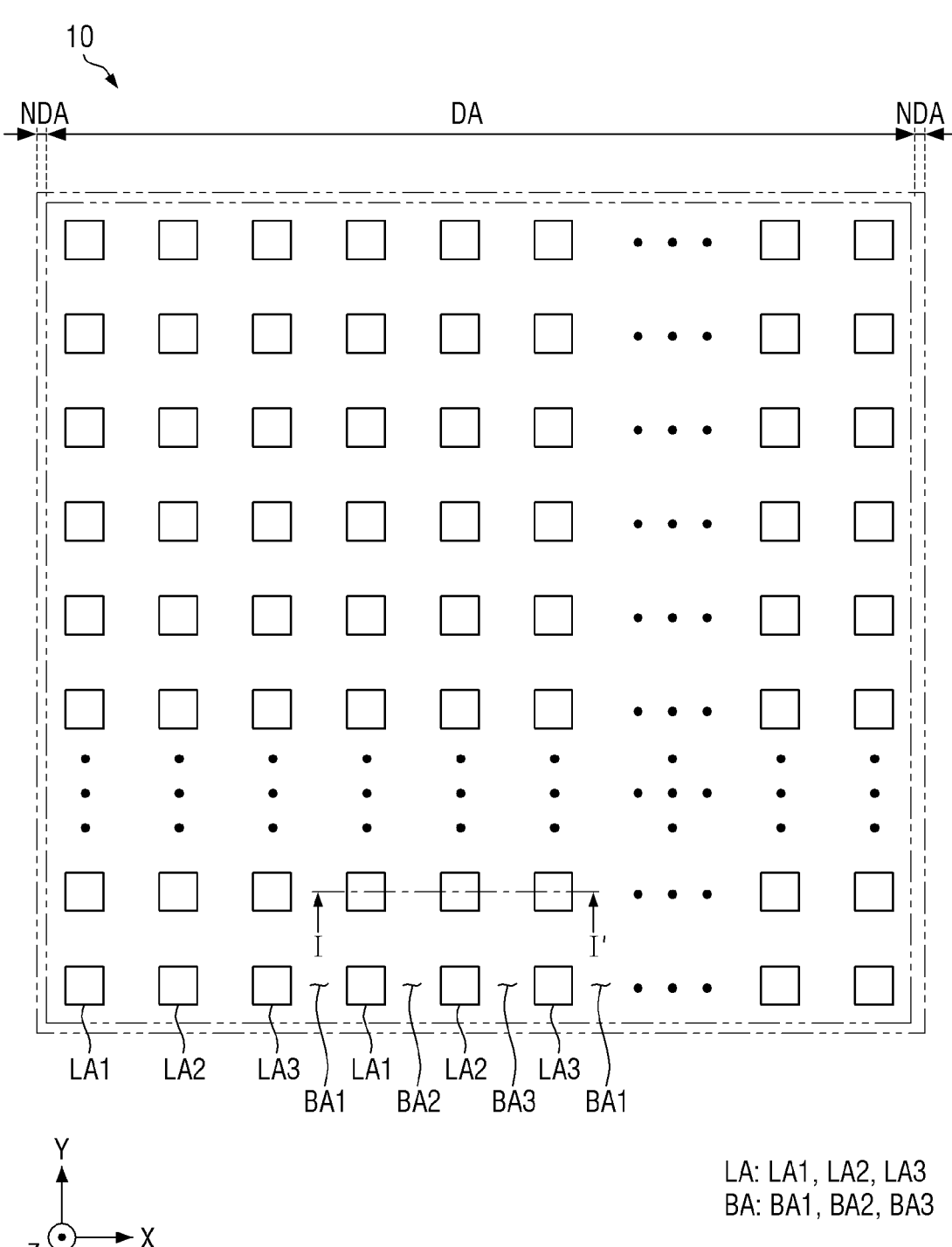
FIG. 2 is a schematic plan view of a display device according to an embodiment.

FIG. 2 is a plan view illustrating a display device according to an embodiment.

Referring to FIG. 2, the display device 10 may include pixels arranged in the display area DA along rows and columns. Each of the pixels may include a light emitting area defined by the pixel defining layer and may emit light having a predetermined peak wavelength through the light emitting area. For example, the display area DA of the display device 10 may include first to third light emitting areas LA1, LA2, and LA3. Each of the first to third light emitting areas LA1, LA2, and LA3 may be an area in which light generated by the light emitting element of the display device 10 is emitted to the outside of the display device 10.

The first to third light emitting areas LA1, LA2, and LA3 may emit light having a predetermined peak wavelength to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm. However, the disclosure is not limited thereto.

The first to third light emitting areas LA1, LA2, and LA3 may be repeatedly arranged sequentially along the first direction (X-axis direction) of the display area DA. For example, the width of the first light emitting area LA1 in the first direction may be greater than the width of the second light emitting area LA2 in the first direction, and the width of the second light emitting area LA2 in the first direction may be greater than the width of the third light emitting area LA3 in the first direction. For another embodiment, the width of the first light emitting area LA1 in the first direction, the width of the second light emitting area LA2 in the first direction, and the width of the third light emitting area LA3 in the first direction may be substantially the same as each other.

For example, the area of the first light emitting area LA1 may be larger than the area of the second light emitting area LA2, and the area of the second light emitting area LA2 may be larger than the area of the third light emitting area LA3.

For another example, the area of the first light emitting area LA1, the area of the second light emitting area LA2, and the area of the third light emitting area LA3 may be substantially equal to each other.

The display area DA of the display device 10 may include light blocking areas BA surrounding the light emitting areas LA. For example, the display area DA may include first to third light blocking areas BA1, BA2, and BA3. The first to third light-blocking areas BA1, BA2, and BA3 may be disposed at a side of each of the first to third light emitting areas LA1, LA2, and LA3, respectively, and may prevent the combination of colors of light emitted from the first to third light emitting areas LA1, LA2, and LA3.

Figure 3:
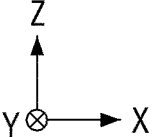
FIG. 3 is a schematic cross-sectional view taken along line I-I' of FIG. 2.

FIG. 3 is a schematic cross-sectional view taken along line I-I' in FIG. 2.

Referring to FIG. 3, the display area DA of the display device 10 may include first to third light emitting areas LA1, LA2, and LA3. Each of the first to third light emitting areas LA1, LA2, and LA3 may be an area in which light generated from the light emitting diode ED of the display device 10 is emitted to the outside of the display device 10.

The display device 10 may include a substrate SUB, a buffer layer BF, a thin film transistor layer TFTL, a light emitting element layer EML, a wavelength conversion layer WLCL, a color filter layer CFL, and an encapsulation layer TFE.

The substrate SUB may be a base plate or a base member and may be made of an insulating material such as a polymer resin. For example, the substrate SUB may be a flexible substrate capable of bending, folding, rolling, etc. The substrate SUB may include polyimide PI, but the material thereof is not limited thereto.

The buffer layer BF may be disposed on the substrate SUB. The buffer layer BF may be formed of (or include) an inorganic film capable of preventing the infiltration of air or moisture. For example, the buffer layer BF may include inorganic films alternately stacked.

The thin film transistor layer TFTL may include a thin film transistor TFT, a gate insulating film GI, an interlayer insulating film ILD, a connection electrode CNE, a first passivation layer PAS1, and a first planarization layer OC1.

The thin film transistor TFT may be disposed on the buffer layer BF and may form (or constitute) a pixel circuit of each of pixels. For example, the thin film transistor TFT may be a driving transistor or a switching transistor of a pixel circuit. The thin film transistor TFT may include a semiconductor region ACT, a gate electrode GE, a source electrode SE, and a drain electrode DE.

The semiconductor region ACT, the source electrode SE, and the drain electrode DE may be provided on the buffer layer BF. The semiconductor region ACT may overlap the gate electrode GE in a thickness direction and may be insulated from the gate electrode GE by the gate insulating film GI. The source electrode SE and the drain electrode DE may be provided by making a material of the semiconductor region ACT into a conductor.

The gate electrode GE may be disposed on the gate insulating film GI. The gate electrode GE may overlap the semiconductor region ACT with the gate insulating film GI interposed therebetween.

The gate insulating film GI may be provided on the semiconductor region ACT, the source electrode SE, and the drain electrode DE. For example, the gate insulating film GI may overlap or cover the semiconductor region ACT, the source electrode SE, the drain electrode DE, and the buffer layer BF, and may insulate the semiconductor region ACT and the gate electrode GE from each other. The gate insulating film GI may include a contact hole through which the connection electrode CNE passes.

The interlayer insulating film ILD may be disposed on the gate electrode GE. For example, the interlayer insulating film ILD may include a contact hole through which the connection electrode CNE passes. Here, the contact hole of the interlayer insulating film ILD may be connected to the contact hole of the gate insulating film GI.

The connection electrode CNE may be disposed on the interlayer insulating film ILD. The connection electrode CNE may electrically connect the drain electrode DE of the thin film transistor TFT and a first electrode AE of a light emitting element EL. The connection electrode CNE may contact the drain electrode DE through a contact hole provided in the gate insulating film GI and the interlayer insulating film ILD.

The first passivation layer PAS1 may be provided on the thin film transistor TFT to protect the thin film transistor TFT. For example, the first passivation layer PAS1 may include a contact hole through which the first electrode AE passes.

The first planarization layer OC1 may be provided on the first passivation layer PAS1 to planarize the upper portion of the thin film transistor TFT. For example, the first planarization layer OC1 may include a contact hole through which the first electrode AE of the light emitting element EL passes. Here, the contact hole of the first planarization layer OC1 may be connected to the contact hole of the first passivation layer PAS1.

The light emitting element layer EML may include a light emitting diode ED, a first bank BAK1, a second bank BNK2, a second passivation layer PAS2, and a second planarization layer OC2.

The light emitting element EL may be provided on the thin film transistor TFT. The light emitting element EL may include a first electrode AE, a second electrode CE, and a light emitting diode ED.

The first electrode AE may be provided on the first planarization layer OC1. For example, the first electrode AE may be disposed on the first bank BNK1 disposed on the first planarization layer OC1 to cover or overlap the first bank BNK1. The first electrode AE may be disposed to overlap one of the first to third light emitting areas LA1, LA2, and LA3 defined by the second bank BNK2. The first electrode AE may be electrically connected to the drain electrode DE of the thin film transistor TFT. The first electrode AE may be an anode electrode of the light emitting element EL but is not limited thereto.

The second electrode CE may be provided on the first planarization layer OC1 to be spaced apart from the first electrode AE. For example, the second electrode CE may be disposed on the first bank BNK1 disposed on the first planarization layer OC1 to overlap the first bank BNK1. The second electrode CE may be disposed to overlap one of the first to third light emitting areas LA1, LA2, and LA3 defined by the second bank BNK2. For example, the second electrode CE may receive a common voltage supplied to all pixels. The second electrode CE may be a cathode electrode of the light emitting element EL but is not limited thereto.

The first insulating layer IL1 may overlap a part of the first electrode AE and a part of the second electrode CE, which are adjacent to each other, and may insulate the first electrode AE and the second electrode CE from each other.

The light emitting diode ED may be disposed between the first electrode AE and the second electrode CE on the first planarization layer OC1. The light emitting diode ED may be disposed on the first insulating layer IL1. One end of the light emitting diode ED may be electrically connected to the first electrode AE, and the other end of light emitting diode ED may be electrically connected to the second electrode CE. For example, the light emitting diodes ED may include an active layer having the same material to emit light of the same wavelength or light of the same color. The light emitted from each of the first to third light emitting areas LA1, LA2, and LA3 may have the same color. For example, the light emitting diodes ED may emit light of a third color or blue light having a peak wavelength ranging from about 440 nm to about 480 nm. Accordingly, the light emitting element layer EML may emit light of a third color or blue light.

The second bank BNK2 may be disposed on the first planarization layer OC1 to define the first to third light emitting areas LA1, LA2, and LA3. For example, the second bank BNK2 may surround each of the first to third light emitting areas LA1, LA2, and LA3, but the disclosure is not limited thereto. The second bank BNK2 may separate and insulate the first electrode AE or the second electrode CE of each of the light emitting elements EL. The second bank BNK2 may be disposed in the first to third light blocking areas BA1, BA2, and BA3.

The second passivation layer PAS2 may be disposed on the light emitting elements EL and the second bank BNK2. The second passivation layer PAS2 may overlap the light emitting elements EL, and may protect the light emitting elements EL. The second passivation layer PAS2 may prevent the penetration of impurities such as moisture or air from the outside to prevent damage to the light emitting elements EL.

The second planarization layer OC2 may be provided on the second passivation layer PAS2 to planarize the upper portion of the light emitting element layer EML. The second planarization layer OC2 may include an organic material. For example, the second planarization layer OC2 may include at least one of acrylic resin, epoxy resin, phenolic resin, polyamide resin, and polyimide resin.

The wavelength conversion layer WLCL includes a first capping layer CAP1, a first light blocking member BK1, a first wavelength conversion unit WLC1, a second wavelength conversion unit WLC2, a light transmission unit LTU, a second capping layer CAP2, and a third planarization layer OC3.

The first capping layer CAP1 may be disposed on the second planarization layer OC2 of the light emitting element layer EML. The first capping layer CAP1 may seal the lower surfaces of the first and second wavelength conversion units WLC1 and WLC2 and the light transmission unit LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking member BK1 may be disposed in the first to third light blocking areas BA1, BA2, and BA3 on the first capping layer CAP1. The first light blocking member BK1 may overlap the second bank BNK2 in the thickness direction. The first light blocking member BK1 may block the transmission of light. The first light blocking member BK1 may prevent light from invading between the first to third light emitting areas LA1, LA2, and LA3 and mixing colors, thereby improving color reproducibility. The first light blocking member BK1 may be disposed in a lattice shape surrounding the first to third light emitting areas LA1, LA2, and LA3 on a plane.

The first light blocking member BK1 may include an organic light blocking material and a liquid repellent component. Here, the liquid repellent component may include a fluorine-containing monomer or a fluorine-containing polymer, and specifically, may include a fluorine-containing aliphatic polycarbonate. For example, the first light blocking member BK1 may be made of a black organic material including a liquid repellent component. The first light blocking member BK1 may be formed through a coating and exposure process of an organic light blocking material including a liquid repellent component.

The first light blocking member BK1 may include a liquid repellent component, thereby separating the first and second wavelength conversion units WLC1 and WLC2 and the light transmission unit LTU into the corresponding light emitting areas LA. For example, in case that the first and second wavelength conversion units WLC1 and WLC2 and the light transmission unit LTU are formed by an inkjet method, an ink composition may flow on the upper surface of the first light blocking member BK1. In this case, the first light blocking member BK1 may include the liquid repellent component, so that the ink composition may be induced to flow to the respective light emitting areas. Therefore, the first light blocking member BK1 may prevent the ink composition from being mixed.

The first wavelength conversion unit WLC1 may be disposed in the first light emitting area LA1 on the first capping layer CAP1. The first wavelength conversion unit WLC1 may be surrounded by the first light blocking member BK1. The first wavelength conversion unit WLC1 may include a first base resin BS1, a first scatterer SCT1, and a first wavelength shifter WLS1.

The first base resin BS1 may include a material having relatively high light transmittance. The first base resin BS1 may include a transparent organic material. For example, the first base resin BS1 may include at least one of organic materials such as epoxy resin, acrylic resin, cardo resin, and imide resin.

The first scatterer SCT1 may have a different refractive index from the first base resin BS1 and may form an optical interface with the first base resin BS1. For example, the first scatterer SCT1 may include a light scattering material or light scattering particles that scatter at least a part of transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or may include organic particles such as acrylic resin particles or urethane resin particles. The first scatterer SCT1 may scatter light in a random direction irrespective of the incident direction of incident light, without substantially changing the peak wavelength of incident light.

The first wavelength shifter WLS1 may convert or shift the peak wavelength of incident light to a first peak wavelength. For example, the first wavelength shifter WLS1 may convert blue light provided from the display device 10 into red light having a single peak wavelength ranging from about 610 nm to about 650 nm and may emit the red light. The first wavelength shifter WLS1 may be a quantum dot, a quantum rod, or a phosphor. The quantum dot may be a particulate material that emits light of a specific color as electrons transition from a conduction band to a valence band.

For example, the quantum dot may be a semiconductor nanocrystalline material. The quantum dot may have a specific band gap according to its composition and size to absorb light and then emit light having a unique wavelength.

Examples of semiconductor nanocrystals of the quantum dot include group IV nanocrystals, group II-VI compound nanocrystals, group III-V compound nanocrystals, group IV-VI compound nanocrystals, and combinations thereof.

For example, the quantum dot may have a core-shell structure including a core including the above-described nanocrystals and a shell surrounding the core. The shell of the quantum dot may serve as a protective layer for maintaining semiconductor properties by preventing the chemical denaturation of the core and may serve as a charging layer for imparting electrophoretic properties to the quantum dot. The shell may be a monolayer or multiple layers. The interface between the core and the shell may have a concentration gradient in which the concentration of elements in the shell decreases toward the center of the shell. The shell of the quantum dot may be made of a metal or non-metal oxide, a semiconductor compound, or a combination thereof.

The light emitted by the first wavelength shifter WLS1 may have a full width at half maximum (FWHM) of a light emission wavelength spectrum of about 45 nm or less, or about 40 nm or less, or about 30 nm or less, and the color purity and color reproducibility of the color displayed by the display device 10 may be further improved. The light emitted by the first wavelength shifter WLS1 may be emitted toward various directions regardless of an incident direction of incident light. Therefore, the side visibility of the red color displayed in the first light emitting area LA1 may be improved.

A part of the blue light provided from the light emitting element layer EML may transmit the first wavelength conversion unit WLC1 without being converted into red light by the first wavelength shifter WLS1. In the blue light provided from the display substrate 100, light having been incident on the first color filter CF1 without being converted by the first wavelength conversion unit WLC1 may be blocked by the first color filter CF1. Further, in the blue light provided from the light emitting element layer EML, red light converted by the first wavelength conversion unit WLC1 may be transmitted to the outside through the first color filter CF1. Therefore, the first light emitting area LA1 may emit red light.

The second wavelength conversion unit WLC2 may be disposed in the second light emitting area LA2 on the first capping layer CAP1. The second wavelength conversion unit WLC2 may be surrounded by the first light blocking member BK1. The second wavelength conversion unit WLC2 may include a second base resin BS2, a second scatterer SCT2, and a second wavelength shifter WLS2.

The second base resin BS2 may include a material having relatively high light transmittance. The second base resin BS2 may include a transparent organic material. For example, the second base resin BS2 and the first base resin BS1 may include the same material, or the second base resin BS2 may include any material discussed herein with reference to the first base resin BS1.

The second scatterer SCT2 may have a different refractive index from the second base resin BS2 and may form an optical interface with the second base resin BS2. For example, the second scatterer SCT2 may include a light scattering material or light scattering particles that scatter at least a part of transmitted light. For example, the second scatterer SCT2 and the first scatterer SCT1 may include the same material, or the second scatterer SCT2 may include any material discussed herein with reference to the first scatterer SCT1. The second scatterer SCT2 may scatter light in a random direction irrespective of the incident direction of incident light, without substantially changing the peak wavelength of incident light.

The second wavelength shifter WLS2 may convert or shift the peak wavelength of incident light to a second peak wavelength different from the first peak wavelength of the first wavelength shifter WLS1. For example, the second wavelength shifter WLS2 may convert blue light provided from the display substrate 100 into green light having a single peak wavelength ranging from about 510 nm to about 550 nm and may emit the green light. The second wavelength shifter WLS2 may be a quantum dot, a quantum rod, or a phosphor. The second wavelength shifter WLS2 may include any material discussed herein with reference to the first wavelength shifter WLS1. The second wavelength shifter WLS2 may be formed as a quantum dot, a quantum rod, or a phosphor such that the wavelength conversion range of the second wavelength shifter WLS2 is different from the wavelength conversion range of the first wavelength shifter WLS1.

The light transmission unit LTU may be disposed in the third light emitting area LA3 on the first capping layer CAP1. The light transmission unit LTU may be surrounded by the first light blocking member BK1. The light transmission unit LTU may transmit incident light while maintaining the peak wavelength of the incident light. The light transmission unit LTU may include a third base resin BS3 and a third scatterer SCT3.

The third base resin BS3 may include a material having relatively high light transmittance. The third base resin BS3 may include a transparent organic material. For example, the third base resin BS3 and the first base resin BS1 or the second base resin BS2 may include the same material, or the third base resin BS3 may include any material discussed herein with reference to the first base resin BS1 or the second base resin BS2.

The third scatterer SCT3 may have a different refractive index from the third base resin BS3 and may form an optical interface with the third base resin BS3. For example, the third scatterer SCT3 may include a light scattering material or light scattering particles that scatter at least a part of transmitted light. For example, the third scatterer SCT3 and the first scatterer SCT1 or the second scatterer SCT2 may include the same material, or the third scatterer SCT3 may include any material discussed herein with reference to the first scatterer SCT1 or the second scatterer SCT2. The third scatterer SCT3 may scatter light in a random direction irrespective of the incident direction of incident light, without substantially changing the peak wavelength of incident light.

The wavelength conversion layer WLCL is directly disposed on the second planarization layer OC2 of the light emitting element layer EML, so that the display device 10 may not require a separate substrate for the first and second wavelength conversion units WLC1 and WLC2 and the light transmission unit LTU. Accordingly, the first and second wavelength conversion units WLC1 and WLC2 and the light transmission unit LTU may be easily aligned with each of the first to third light emitting areas LA1, LA2, and LA3, and the thickness of the display device 10 may be relatively reduced.

The second capping layer CAP2 may overlap the first and second wavelength conversion units WLC1 and WLC2, the light transmission unit LTU, and the first light blocking member BK1. For example, the second capping layer CAP2 may encapsulate the first and second wavelength conversion units WLC1 and WLC2 and the light transmission unit LTU to prevent the damage or contamination of the first and second wavelength conversion units WLC1 and WLC2 and the light transmission unit LTU. The second capping layer CAP2 and the first capping layer CAP1 may include the same material, or the second capping layer CAP2 may include any material discussed herein with reference to the first capping layer CAP1.

The third planarization layer OC3 may be provided on the second capping layer CAP2 to planarize the upper portions of the first and second wavelength conversion units WLC1 and WLC2 and the light transmission unit LTU. The third planarization layer OC3 may include an organic material. For example, the third planarization layer OC3 may include at least one of acrylic resin, epoxy resin, phenolic resin, polyamide resin, and polyimide resin.

The color filter layer CFL may include a second light blocking member BK2, first to third color filters CF1, CF2, and CF3, and a third passivation layer PAS3.

The second light blocking member BK2 may be disposed in the first to third light blocking areas BA1, BA2, and BA3 on the third planarization layer OC3 of the wavelength conversion layer WLCL. The second light blocking member BK2 may overlap the first light blocking member BK1 or the second bank BNK2 in the thickness direction. The second light blocking member BK2 may block the transmission of light. The second light blocking member BK2 may prevent light from invading between the first to third light emitting areas LA1, LA2, and LA3 and mixing colors, thereby improving color reproducibility. The second light blocking member BK2 may be disposed in a lattice shape surrounding the first to third light emitting areas LA1, LA2, and LA3 on a plane.

The first color filter CF1 may be disposed in the first light emitting area LA1 on the third planarization layer OC3. The first color filter CF1 may be surrounded by the second light blocking member BK2. The first color filter CF1 may overlap the first wavelength conversion unit WLC1 in the thickness direction. The first color filter CF1 may selectively transmit light of a first color (for example, red light) and may block or absorb light of a second color (for example, green light) and light of a third color (for example, blue light). For example, the first color filter CF1 may be a red color filter and may include a red colorant. The red colorant may be made of a red dye or a red pigment.

The second color filter CF2 may be disposed in the second light emitting area LA2 on the third planarization layer OC3. The second color filter CF2 may be surrounded by the second light blocking member BK2. The second color filter CF2 may overlap the second wavelength conversion unit WLC2 in the thickness direction. The second color filter CF2 may selectively transmit light of a second color (for example, green light) and may block or absorb light of a first color (for example, red light) and light of a third color (for example, blue light). For example, the second color filter CF2 may be a green color filter and may include a green colorant. The green colorant may be made of a green dye or a green pigment.

The third color filter CF3 may be disposed in the third light emitting area LA3 on the third planarization layer OC3. The third color filter CF3 may be surrounded by the second light blocking member BK2. The third color filter CF3 may overlap the light transmission unit LTU in the thickness direction. The third color filter CF3 may selectively transmit light of a third color (for example, blue light), and may block or absorb light of a first color (for example, red light) and light of a second color (for example, green light). For example, the third color filter CF3 may be a blue color filter and may include a blue colorant. The blue colorant may be made of a blue dye or a blue pigment.

The first to third color filters CF1, CF2, and CF3 may absorb a part of light flowing from the outside of the display device 10 to reduce an amount of reflected light due to external light. Therefore, the first to third color filters CF1, CF2, and CF3 may prevent color distortion due to external light reflection.

The first to third color filters CF1, CF2, and CF3 are directly disposed on the third planarization layer OC3 of the wavelength conversion layer WLCL, so that the display device 10 may not require a separate substrate for the first to third color filters CF1, CF2, and CF3. Accordingly, the thickness of the display device 10 may be relatively reduced.

The third passivation layer PAS3 may overlap the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may overlap the upper and side surfaces of a display layer. For example, the encapsulation layer TFE may include at least one inorganic film to prevent the permeation of oxygen or moisture. Further, the encapsulation layer TFE may include at least one organic film to protect the display device 10 from foreign matter such as dust.

Figure 4:
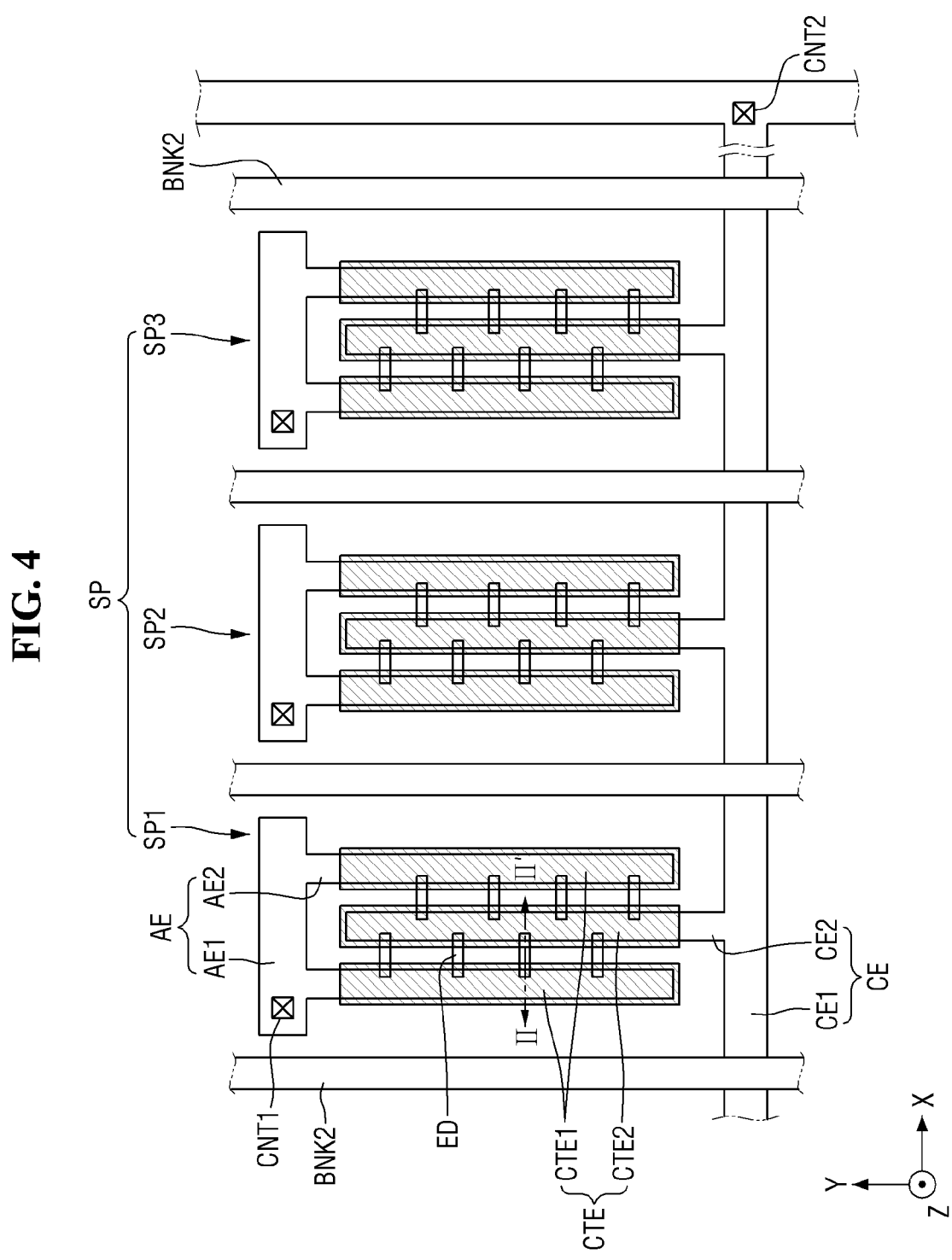
FIG. 4 is a schematic plan view illustrating a pixel of a display device according to an embodiment.

FIG. 4 is a schematic plan view illustrating a pixel of a display device according to an embodiment.

Referring to FIG. 4, each of the pixels SP may include first to third sub-pixels SP1, SP2, and SP3. The first to third sub-pixels SP1, SP2, and SP3 may correspond to the first to third light emitting areas LA1, LA2, and LA3, respectively. The light emitting diodes ED of the first to third sub-pixels SP1, SP2, and SP3 may emit light through the first to third light emitting areas LA1, LA2, and LA3, respectively.

Each of the first to third sub-pixels SP1, SP2, and SP3 may emit light of the same color. For example, each of the first to third sub-pixels SP1, SP2, and SP3 may include the same type of light emitting diode ED and may emit light of a third color or blue light. For another example, the first sub-pixel SP1 may emit light of a first color or red light, the second sub-pixel SP2 may emit light of a second color or green light, and the third sub-pixel SP3 may emit light of a third color or blue light.

Each of the first to third sub-pixels SP1, SP2, and SP3 may include first and second electrodes AE and CE, a light emitting diode ED, contact electrodes CTE, and second banks BNK2.

The first and second electrodes AE and CE may be electrically connected to the light emitting diode ED to receive a predetermined voltage, and the light emitting diode ED may emit light of a specific wavelength band. At least a portion of the first electrode AE and at least a portion of the second electrode CE may form an electric field in the pixel SP, and the light emitting diodes ED may be aligned by the electric field.

For example, the first electrode AE may be a pixel electrode separated for each of the first to third sub-pixels SP1, SP2, and SP3, and the second electrode CE may be a common electrode electrically connected to the first to third sub-pixels SP1, SP2, and SP3 in common. Any one of the first electrode AE and the second electrode CE may be an anode electrode of the light emitting diode ED, and the other thereof may be a cathode electrode of the light emitting diode ED.

The first electrode AE may include a first electrode stem portion AE1 extending in the first direction (X-axis direction), and at least one first electrode branch portion AE2 branched from the first electrode stem portion AE1 and extending in the second direction (Y-axis direction).

The first electrode stem portion AE1 of each of the first to third sub pixels SP1, SP2, and SP3 may be spaced apart from the first electrode stem portion AE1 of the adjacent sub-pixel and may be disposed on a virtual extension line of the first electrode stem portion AE1 of the sub-pixel adjacent in the first direction (X-axis direction). The first electrode stem portions AE1 of the first to third sub-pixels SP1, SP2, and SP3 may receive different signals from each other and may be independently driven.

The first electrode branch portion AE2 may be branched from the first electrode stem portion AE1 and extend in the second direction (Y-axis direction). One end of the first electrode branch portion AE2 may be electrically connected to the first electrode stem portion AE1, and the other end of the first electrode branch portion AE2 may be spaced apart from the second electrode stem portion CE1 facing the first electrode stem portion AE1.

The second electrode CE may include a second electrode stem portion CE1 extending in the first direction (X-axis direction), and a second electrode branch portion CE2 branched from the second electrode stem portion CE1 and extending in the second direction (Y-axis direction). The second electrode stem portion CE1 of each of the first to third sub-pixels SP1, SP2, and SP3 may be electrically connected to the second electrode stem portion CE1 of the adjacent sub-pixel. The second electrode stem portion CE1 may extend in the first direction (X-axis direction) to traverse the pixels SP. The second electrode stem portion CE1 may be connected to an outer portion of the display area DA or a portion extending from the non-display area NDA in a direction.

The second electrode branch portion CE2 may be spaced apart from the first electrode branch portion AE2 and face the first electrode branch portion AE2. One end of the second electrode branch portion CE2 may be electrically connected to the second electrode stem portion CE1, and the other end of the second electrode branch portion CE2 may be spaced apart from the first electrode stem portion AE1.

The first electrode AE may be electrically connected to the thin film transistor layer TFTL of the display substrate 100 through a first contact hole CNT1, and the second electrode CE may be electrically connected to the thin film transistor layer TFTL of the display substrate 100 through a second contact hole CNT2. For example, the first contact hole CNT1 may be disposed in each of the first electrode stem portions AE1, and the second contact hole CNT2 may be disposed in the second electrode stem portion CE1, but the disclosure is not limited thereto.

The second bank BNK2 may be disposed at the boundary between the pixels SP. The first electrode stem portions AE1 may be spaced apart from each other based on the second bank BNK2. The second bank BNK2 may extend in the second direction (Y-axis direction) and may be disposed at the boundary of the pixels SP arranged in the first direction (X-axis direction). The second bank BNK2 may also be arranged at the boundary of the pixels SP arranged in the second direction (Y-axis direction). The second bank BNK2 may define a boundary of the pixels SP.

The second bank BNK2 may prevent ink from overflowing the boundary of the pixels SP when the ink in which the light emitting diodes ED are dispersed is ejected during the process of manufacturing the display substrate 100. The second bank BNK2 may separate the inks in which different light emitting diodes ED are dispersed so as not to be mixed with each other.

The light emitting diode ED may be disposed between the first electrode AE and the second electrode CE. One end of the light emitting diode ED may be electrically connected to the first electrode AE, and the other end of the light emitting diode ED may be electrically connected to the second electrode CE. For example, the light emitting diode ED may be electrically connected to the first electrode AE through the first contact electrode CTE1 and may be electrically connected to the second electrode CE through the second contact electrode CTE2.

The light emitting diodes ED may be disposed to be spaced apart from each other and may be aligned to be substantially parallel to each other. The distance between the light emitting diodes ED is not particularly limited. Some of the light emitting diodes ED may be disposed adjacent to each other, other some of the light emitting diodes ED may be spaced apart from each other at regular intervals, and other some of the light emitting diodes ED may have non-uniform density and may be aligned in a specific direction. For example, each of the light emitting diodes ED may be disposed in a direction perpendicular to the direction in which the first electrode branch portion AE2 or the second electrode branch portion CE2 extends. For another example, each of the light emitting diodes ED may be disposed in a direction oblique to the direction in which the first electrode branch portion AE2 or the second electrode branch portion CE2 extends.

Each of the light emitting diodes ED may include an active layer having the same material to emit light of the same wavelength band or light of the same color. The first to third sub-pixels SP1, SP2, and SP3 may emit light of the same color. For example, the light emitting diodes ED may emit light of a third color or blue light having a peak wavelength ranging from about 440 nm to about 480 nm. Accordingly, each of the first to third light emitting areas LA1, LA2, and LA3 of the display substrate 100 may emit light of a third color or blue light. For another example, each of the first to third sub-pixels SP1, SP2, and SP3 may include the light emitting diodes ED having different active layers to emit light of different colors.

The contact electrode CTE may include first and second contact electrodes CTE1 and CTE2. The first contact electrode CTE1 may overlap a portion of the first electrode branch portion AE2 and a portion of the light emitting diode ED and may electrically connect the first electrode branch portion AE2 and the light emitting diode ED to each other. The second contact electrode CTE2 may overlap a portion of the second electrode branch portion CE2 and other portion of the light emitting diode ED and may electrically connect the second electrode branch portion CE2 and the light emitting diode ED to each other.

The first contact electrode CTE1 may be disposed on the first electrode branch portion AE2 and extend in the second direction (Y-axis direction). The first contact electrode CTE1 may electrically contact one end of the light emitting diode ED. The light emitting diode ED may be electrically connected to the first electrode AE through the first contact electrode CTE1.

The second contact electrode CTE2 may be disposed on the second electrode branch CE2 and extend in the second direction (Y-axis direction). The second contact electrode CTE2 may be spaced apart from the first contact electrode CTE1 in the first direction (X-axis direction). The second contact electrode CTE2 may electrically contact the other end of the light emitting diode ED. The light emitting diode ED may be electrically connected to the second electrode CE through the second contact electrode CTE2.

For example, the width of each of the first and second contact electrodes CTE1 and CTE2 may be greater than the width of each of the first and second electrode branch portions AE2 and CE2. For another example, each of the first and second contact electrodes CTE1 and CTE2 may overlap a part of corresponding one of the first and second electrode branch portions AE2 and CE2.

Figure 5:
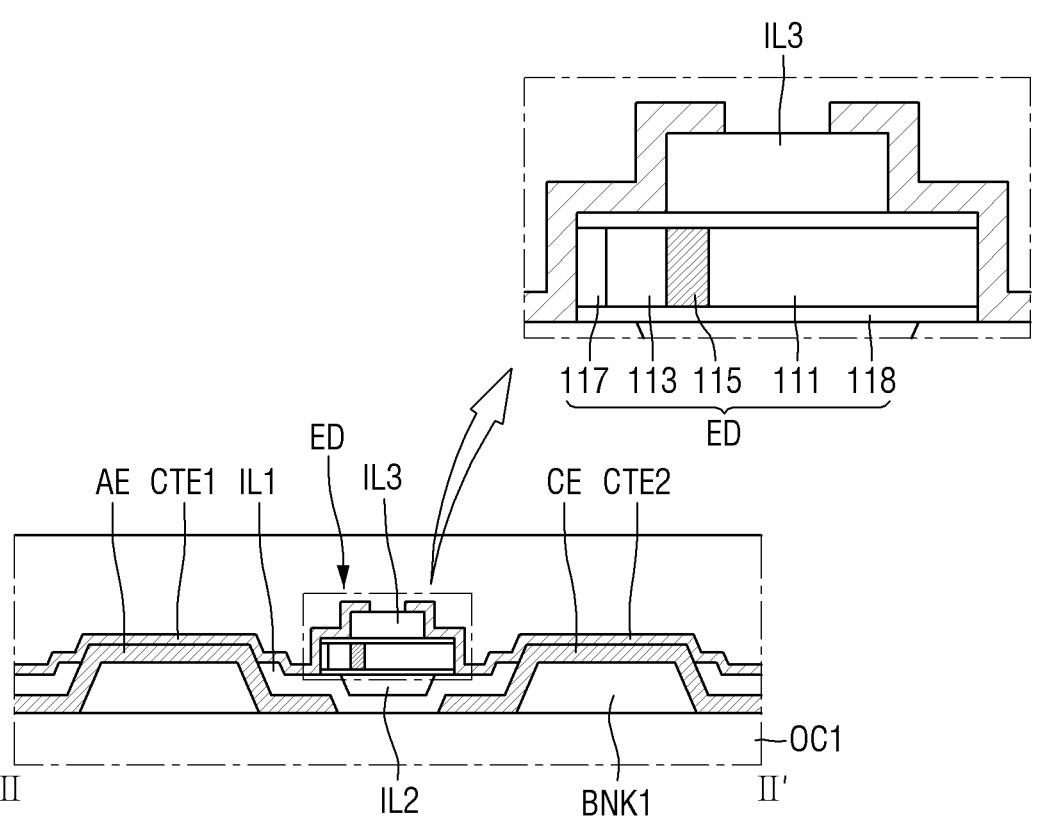
FIG. 5 is a schematic cross-sectional view taken along line II-II' of FIG. 4.

FIG. 5 is a schematic cross-sectional view taken along line II-II' of FIG. 4.

Referring to FIG. 5, the light emitting element layer EML of the display substrate 100 may be disposed on the thin film transistor layer TFTL and may include first to third insulating layers IL1, IL2, and IL3.

The first banks BNK1 may be disposed in each of the first to third light emitting areas LA1, LA2, and LA3. Each of the first banks BNK1 may correspond to the first electrode AE or the second electrode CE. Each of the first and second electrodes AE and CE may be disposed on the corresponding first bank BNK1. For example, each of the first and second electrode branch portions AE2 and CE2 may be disposed on the corresponding first bank BNK1. The first bank BNK1 may include polyimide (PI), but the material thereof is not limited thereto.

The first banks BNK1 may protrude from the first planarization layer OC1, and the side surface of each of the first banks BNK1 may be inclined from the first planarization layer OC1. The inclined surface of the first bank BNK1 may reflect light emitted from the light emitting diode ED. For example, each of the first and second electrodes AE and CE may include a material having high reflectance and may be disposed on the inclined surface of the first bank BNK1 to reflect light emitted from the light emitting diode ED in an upward direction of the substrate 100.

Referring to FIG. 5 together with FIG. 4, the first electrode stem portion AE1 may include the first contact hole CNT1 penetrating the planarization layer OC. The first electrode stem portion AE1 may be electrically connected to the thin film transistor TFT through the first contact hole CNT1. Accordingly, the first electrode AE may receive a predetermined electrical signal from the thin film transistor TFT.

The second electrode stem portion CE1 may extend in the first direction (X-axis direction) and may be disposed even in the non-light emitting area in which the light emitting diode ED is not disposed. The second electrode stem portion CE1 may include the second contact hole CNT2 penetrating the planarization layer OC. The second electrode stem portion CE1 may be electrically connected to a power electrode through the second contact hole CNT2. The second electrode CE may receive a predetermined electrical signal from the power electrode.

The first and second electrodes AE and CE may include a transparent conductive material. For example, each of the first and second electrodes AE and CE may include at least one of indium tin oxide (ITO), indium zinc oxide (IZO), and indium tin-zinc oxide (ITZO), but the material thereof is not limited thereto.

The first and second electrodes AE and CE may include a conductive material having high reflectance. For example, the first and second electrodes AE and CE may include a metal such as silver (Ag), copper (Cu), or aluminum (Al), which has high reflectance. The first and second electrodes AE and CE may reflect light incident from the light emitting diode ED to the upper portion of the display substrate 100.

The first and second electrodes AE and CE may have a structure in which a transparent conductive material and a metal having high reflectance are stacked as one or more layers or may be formed as a single layer including the transparent conductive material and the metal having high reflectance. For example, the first and second electrodes AE and CE have a stacked structure of ITO/silver (Ag)/ITO/IZO or may be an alloy including aluminum (Al), nickel (Ni), or lanthanum (La), but the material thereof is not limited thereto.

The first insulating layer IL1 may be disposed on the first planarization layer OC1, the first electrode AE, and the second electrode CE. The first insulating layer IL1 may overlap a part of each of the first and second electrodes AE and CE. For example, the first insulating layer IL1 may expose parts of the first and second electrodes AE and CE corresponding to the upper surface of the first bank BNK1 and may overlap parts of the first and second electrodes AE and CE not corresponding to the upper surface of the first bank BNK1. Accordingly, the first insulating layer IL1 may include an opening exposing parts of the first and second electrodes AE and CE corresponding to the upper surface of the first bank BNK1.

For example, the first insulating layer IL1 may include an inorganic insulating material and may include a depressed step between the first and second electrodes AE and CE. The second insulating layer IL2 may fill the depressed step of the first insulating layer IL1. Accordingly, the second insulating layer IL2 may planarize the upper surface of the first insulating layer IL1, and the light emitting diode ED may be disposed on the first and second insulating layers IL1 and IL2.

The first insulating layer IL1 may protect the first and second electrodes AE and CE and insulate the first and second electrodes AE and CE from each other. The first insulating layer IL1 may prevent the light emitting diode ED from being damaged by a contact with other members.

The light emitting diode ED may be disposed between the first electrode AE and the second electrode CE on the first and second insulating layers IL1 and IL2. One end of the light emitting diode ED may be electrically connected to the first electrode AE, and the other end of the light emitting diode ED may be electrically connected to the second electrode CE. For example, the light emitting diode ED may be electrically connected to the first electrode AE through the first contact electrode CTE1 and may be electrically connected to the second electrode CE through the second contact electrode CTE2.

The third insulating layer IL3 may be partially disposed on the light emitting diode ED disposed between the first and second electrodes AE and CE. The third insulating layer IL3 may partially overlap the outer surface of the light emitting diode ED. The third insulating layer IL3 may protect the light emitting diode ED.

The contact electrode CTE may include first and second contact electrodes CTE1 and CTE2. The first contact electrode CTE1 may overlap the first electrode branch portion AE2 and a part of the light emitting diode ED and may electrically connect the first electrode branch portion AE2 and the light emitting diode ED to each other. The second contact electrode CTE2 may overlap the second electrode branch portion CE2 and another of the light emitting diode ED and may electrically connect the second electrode branch portion CE2 and the light emitting diode ED to each other.

The contact electrode CTE may include a conductive material. For example, the contact electrode CTE may include ITO, IZO, ITZO, or aluminum (Al), but the material thereof is not limited thereto.

Figure 6:
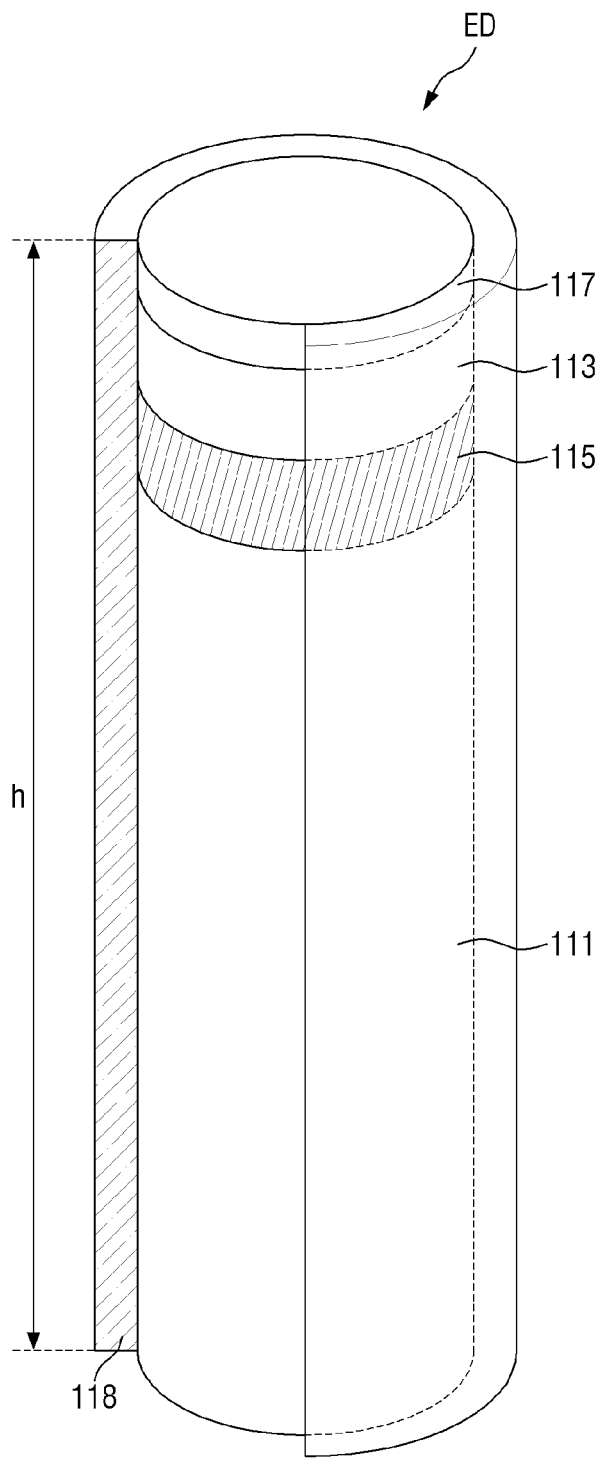
FIG. 6 is a schematic perspective view of a light emitting diode according to an embodiment.

FIG. 6 is a schematic perspective view of a light emitting element according to an embodiment.

Referring to FIG. 6, the light emitting diode ED may have a size of a micrometer or nanometer and may be an inorganic light emitting diode including an inorganic material. The inorganic light emitting diode may be aligned between two electrodes according to an electric field formed in a specific direction between the two electrodes facing each other.

The light emitting diode ED may have a shape extending in a direction. The light emitting diode ED may have a shape of a rod, wire, tube, or the like. For example, the light emitting diode ED may have a cylindrical shape or a rod shape. For another example, the light emitting diode ED may have a polygonal columnar shape such as a cube, a rectangular parallelepiped, or a hexagonal column, or may have various shapes extending in one direction and partially inclined. The semiconductor layers of the light emitting diode ED may be sequentially arranged or stacked along a direction.

The light emitting diode ED may include a first semiconductor layer 111, a second semiconductor layer 113, an active layer 115, an electrode layer 117, and an insulating layer 118.

The first semiconductor layer 111 may include an n-type semiconductor. For example, in case that the light emitting diode ED emits blue light, the first semiconductor layer 111 may include a semiconductor material having the formula $Al_xGa_yIn_{1-x-y}N$ ($0 \leq x \leq 1$, $0 \leq y \leq 1$, $0 \leq x+y \leq 1$). The first semiconductor layer 111 may include at least one semiconductor material of AlGaInN, GaN, AlGaN, InGaN, AlN, and InN, which are doped with an n-type dopant. The first semiconductor layer 111 may be doped with an n-type dopant such as Si, Ge, or Sn. The first semiconductor layer 111 may include n-GaN doped with Si, which is an n-type dopant. The length of the first semiconductor layer 111 may have a range of about 1.5 μm to about 5 μm but is not limited thereto.

The second semiconductor layer 113 may be disposed on the active layer 115. For example, in case that the light emitting diode ED emits blue light or green light, the second semiconductor layer 113 may include a semiconductor material having the formula $Al_xGa_yIn_{1-x-y}N$($0 \leq x \leq 1$, $0 \leq y \leq 1$, $0 \leq x+y \leq 1$). The second semiconductor layer 113 may include at least one semiconductor material of AlGaInN, GaN, AlGaN, InGaN, AlN, and InN, which are doped with a p-type dopant. The second semiconductor layer 113 may be doped with a p-type dopant such as Mg, Zn, Ca, Se, or Ba. The second semiconductor layer 113 may include p-GaN doped with Mg, which is a p-type dopant. The length of the second semiconductor layer 113 may have a range of about 0.05 μm to about 0.10 μm but is not limited thereto.

Each of the first and second semiconductor layers 111 and 113 may be formed as a layer, but the disclosure is not limited thereto. For example, each of the first and second semiconductor layers 111 and 113 may have multiple layers including a clad layer or a TSBR (tensile strain barrier reducing) layer.

The active layer 115 may be disposed between the first and second semiconductor layers 111 and 113. The active layer 115 may include a material having a single or multiple quantum well structure. In case that the active layer 115 includes a material having a multiple quantum well structure, quantum layers and well layers may be alternately stacked. The active layer 115 may emit light by the combination of electron-hole pairs according to electrical signals applied through the first and second semiconductor layers 111 and 113. For example, in case that the active layer 115 emits blue light, the active layer 115 may include a material such as AlGaN or AlGaInN. In case that the active layer 115 is a multiple quantum well structure in which quantum layers and well layers are alternately stacked, the quantum layers may include a material such as AlGaN or AlGaInN, and the well layers may include a material such as GaN or AlInN. The active layer 115 may emit blue light by including quantum layers containing AlGaInN and well layers containing AlInN.

For another example, the active layer 115 may have a structure in which semiconductor materials having large band gap energy and semiconductor materials having small band gap energy are alternately stacked, and may include group III to group V semiconductor materials according to a wavelength band of emitted light. The light emitted by the active layer 115 is not limited to blue light and may be red light or green light in some cases. The length of the active layer 115 may have a range of about 0.05 μm to about 0.10 μm but is not limited thereto.

The light emitted from the active layer 115 may be emitted in the length direction h of the light emitting diode ED and may also be emitted to both sides of the light emitting diode ED. The direction of the light emitted from the active layer 115 may not be limited.

The electrode layer 117 may include an ohmic contact electrode. For another example, the electrode layer 117 may include a Schottky contact electrode. The light emitting diode ED may include at least one electrode layer 117. In the electrode layer 117, in case that the light emitting diode ED is electrically connected to the electrode or the contact electrode CTE, the resistance between the light emitting diode ED and the electrode or the contact electrode CTE may be reduced. The electrode layer 117 may include a conductive metal. For example, the electrode layer 117 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 117 may include a semiconductor material doped with n-type or p-type dopant.

The insulating layer 118 may surround the outer surfaces of the semiconductor layers and the electrode layers. The insulating layer 118 may surround the outer surface of the active layer 115 and may extend in a direction in which the light emitting diode ED may extends. The insulating layer 118 may protect the light emitting diode ED. For example, the insulating layer 118 may surround the side surface of the light emitting diode ED and may expose both ends of the light emitting diode ED in the length direction h.

The insulating layer 118 may include materials having insulating properties, for example, silicon oxide ($SiO_x$), silicon nitride ($SiN_x$), silicon oxynitride ($SiO_xN_y$), aluminum nitride (AlN), and aluminum oxide ($Al_2O_3$). Accordingly, the insulating layer 118 may prevent an electrical short circuit that may occur in case that the active layer 115 directly contacts an electrode through which an electrical signal is transmitted to the light emitting diode ED. Further, the insulating layer 118 may include the active layer 115 to protect the outer surface of the light emitting diode ED, thereby preventing the reduction in light emission efficiency.

Figure 7:
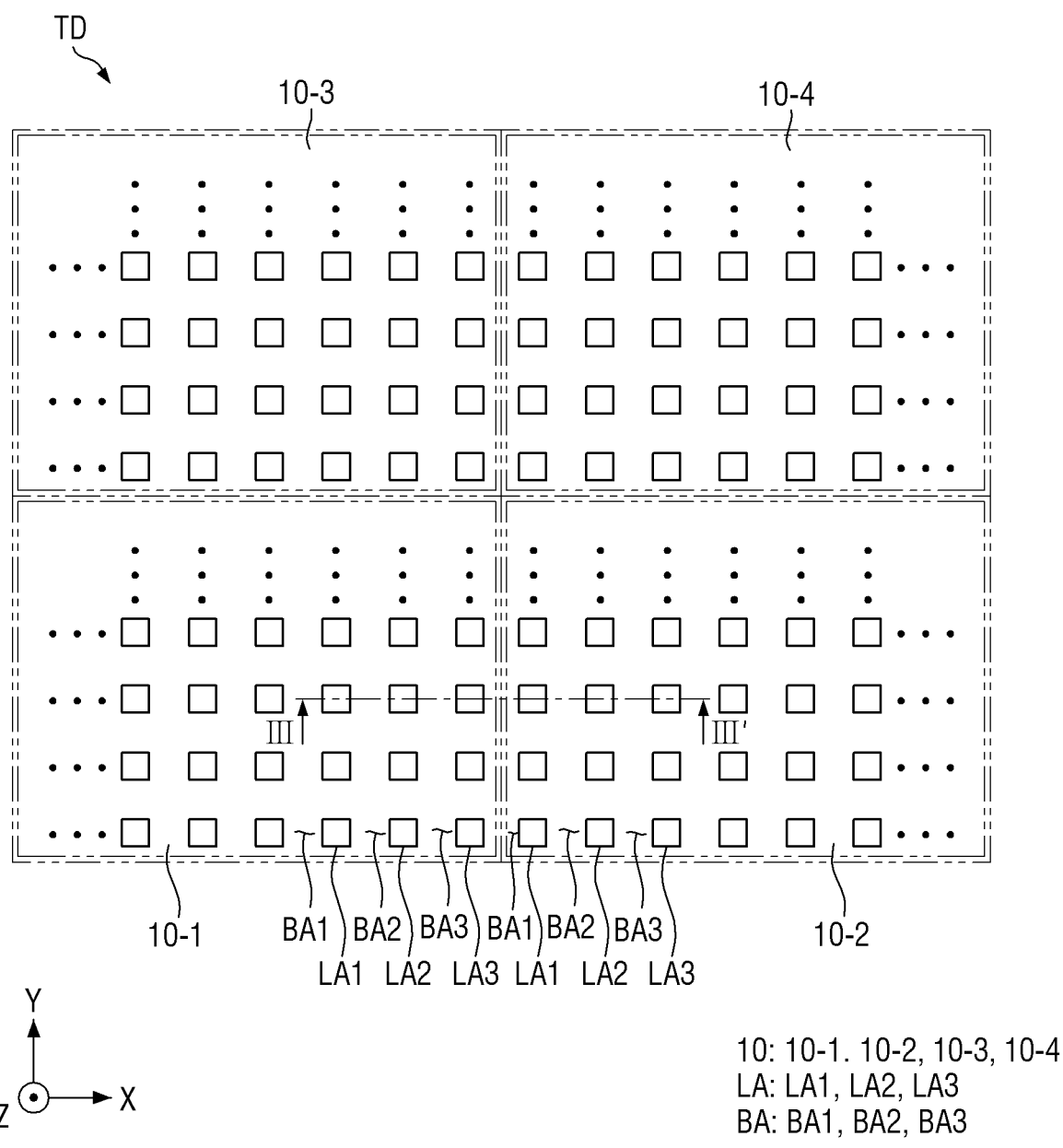
FIG. 7 is a schematic plan view illustrating a coupling structure of a tiled display device according to an embodiment.
Figure 8:
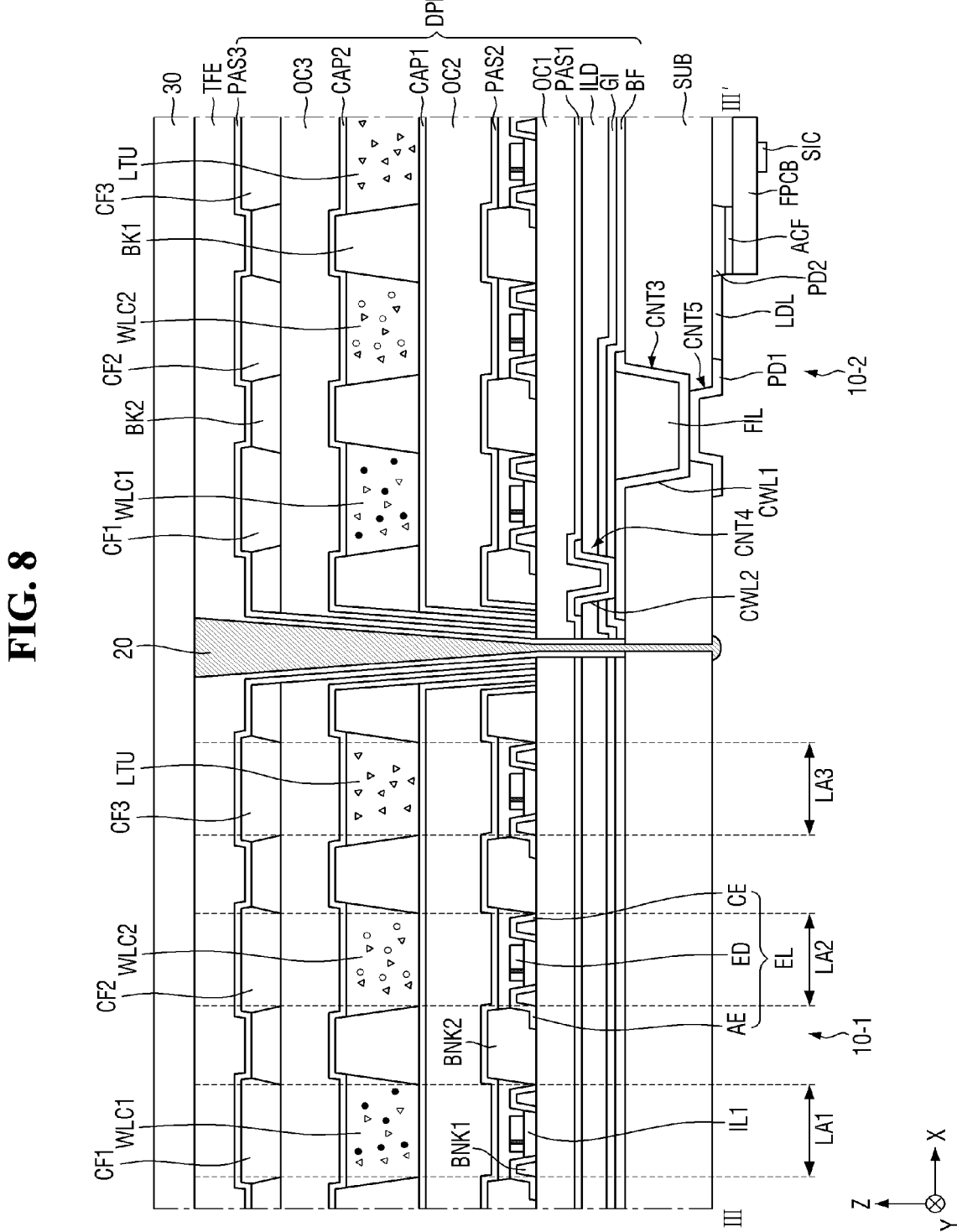
FIG. 8 is a schematic cross-sectional view of a tiled display device according to an embodiment taken along line III-III' of FIG. 7.

FIG. 7 is a schematic plan view illustrating a coupling structure of a tiled display device according to an embodiment, and FIG. 8 is a schematic cross-sectional view of a tiled display device according to an embodiment taken along line III-III' of FIG. 7.

Referring to FIGS. 7 and 8, the tiled display device TD may include display devices 10, a coupling member 20, and a cover member 30. For example, the tiled display device TD may include first to fourth display devices 10-1 to 10-4, but the number of the display devices 10 is not limited to that of the embodiment of FIG. 7. The number of the display devices 10 may be determined according to the size of each of the display device 10 and the tiled display device TD.

The display device 10 may include a substrate SUB, a first connection line CWL1, a filling part FIL, a display layer DPL, an encapsulation layer TFE, a first pad unit PD1, a second pad unit. PD2, a flexible film FPCB, and a source driver SIC.

The substrate SUB may be a base plate or a base member and may be made of (or include) an insulating material such as a polymer resin. For example, the substrate SUB may be a flexible substrate capable of bending, folding, rolling, or the like. The substrate SUB may include polyimide PI, but the material thereof is not limited thereto.

The substrate SUB may include a third contact hole CNT3 provided at a surface and a fifth contact hole CNT5 provided at another surface opposite to the surface. For example, the third contact hole CNT3 may penetrate a part of the substrate SUB from the upper surface of the substrate SUB, and the fifth contact hole CNT5 may penetrate another part of the substrate SUB from the lower surface of the substrate SUB. The third contact hole CNT3 and the fifth contact hole CNT5 may be connected to each other. Accordingly, the substrate SUB may be penetrated through the third contact hole CNT3 and the fifth contact hole CNT5.

The third contact hole CNT3 and the fifth contact hole CNT5 may be disposed to overlap the display area DA. The first connection line CWL1 inserted into the third contact hole CNT3 and the first pad unit PD1 inserted into the fifth contact hole CNT5 may be disposed in the display area DA. Accordingly, the display device 10 may not include a separate pad unit disposed at the outermost side, and the bezel area or dead space of the display device 10 may be reduced or minimized. Since the first paid unit PD1 is disposed on the lower surface of the display device 10, the distance between the display devices 10 may be further reduced compared to when the pad unit 10 is disposed on the outermost side of the substrate SUB or when a flexible film is disposed on the side surface of the substrate SUB.

For example, the depth of the third contact hole CNT3 may be greater than the depth of the fifth contact hole CNT5, but the disclosure is not limited thereto. The third contact hole CNT3 may be formed before a display layer DPL is stacked, and the fifth contact hole CNT5 may be formed after the display layer DPL is stacked. The area of the third contact hole CNT3 may be larger than the area of the fifth contact hole CNT5, but the disclosure is not limited thereto.

The first connection line CWL1 may be disposed on a surface of the substrate SUB and may be connected to the first pad unit PD1 provided on another surface of the substrate SUB through the third contact hole CNT3. For example, the first connection line CWL1 may be inserted into the third contact hole CNT3 and may include a depression or a step corresponding to the size of the third contact hole CNT3. The first connection line CWL1 may supply an electric signal received from the first pad unit PD1 to the thin film transistor layer TFTL through the second connection line CWL2.

The filling part FIL may fill the depression of the first connection line CWL1 formed by the third contact hole CNT3 to planarize the upper portion of the first connection line CWL1. The upper surface of the filling part FIL and the upper surface of the first connection line CWL1 may be disposed on the same plane (or layer). The filling part FIL may fill the depression of the first connection line CWL1 provided by the third contact hole CNT3, so that the buffer layer BF may readily overlap the upper surfaces of the first connection line CWL1, the filling part FIL, and the substrate SUB while having a relatively small thickness.

The filling part FIL may include an organic material. For example, the filling part FIL may include at least one of acrylic resin, epoxy resin, phenolic resin, polyamide resin, and polyimide resin.

The display layer DPL may be disposed on the substrate SUB. The display layer DPL may include the buffer layer BF, the thin film transistor layer TFTL, the light emitting element layer EML, the wavelength conversion layer WLCL, and the color filter layer CFL, which are shown in FIG. 3. Hereinafter, descriptions of the components described with reference to FIG. 3 will be omitted.

The buffer layer BF may be disposed on the substrate SUB, the first connection line CWL1, and the filling part FIL. The buffer layer BF may be formed as an inorganic film capable of preventing the permeation of air or moisture. For example, the buffer layer BF may include inorganic films alternately stacked.

The gate insulating film GI may be disposed on the buffer layer BF and the semiconductor region ACT, source electrode SE, and drain electrode DE of the thin film transistor TFT.

The interlayer insulating film ILD may be disposed on the gate insulating film GI and the gate electrode GE of the thin film transistor TFT.

The interlayer insulating film ILD, the gate insulating film GI, and the buffer layer BF may include a fourth contact hole CNT4 through which the second connection line CWL2 passes. The fourth contact hole CNT4 may be spaced apart from the third contact hole CNT3 on a plane (or layer).

The thin film transistor layer TFTL may further include the second connection line CWL2 disposed on the interlayer insulating film ILD. The second connection line CWL2 may be electrically connected to the first connection line CWL1 disposed on the substrate SUB through the fourth contact hole CNT4. The second connection line CWL2 may be electrically connected to data lines to supply a data voltage and may be electrically connected to scan lines to supply a scan signal. For example, the second connection line CWL2 and the connection electrode CNE of the thin film transistor TFT may be formed of (or include) the same material on the same layer, but the disclosure is not limited thereto. For another example, the second connection line CWL2 and the gate electrode GE of the thin film transistor TFT may be formed of the same material on the same layer.

The display device 10 may include the third contact hole CNT3 provided on a surface of the substrate SUB, the buffer layer BF, the gate insulating film GI, and the fourth contact hole CNT4 provided in the interlayer insulating film ILD, thereby supplying a signal of the first pad unit PD1 to the thin film transistor layer TFTL by using the first connection line CWL1 and the second connection line CWL2.

In the display device 10, double contact holes including the third contact hole CNT3 and the fourth contact hole CNT4 spaced apart from each other on a plane may be formed, and thus the depth of a contact hole may be reduced as compared with a case where only one contact hole penetrating the substrate SUB from the interlayer insulating film ILD is formed. Accordingly, in the display device 10, the thicknesses of the first and second connection lines CWL1 and CWL2 respectively inserted into the third and fourth contact holes CNT3 and CNT4 may be reduced.

The first pad unit PD1 may be disposed on another surface of the substrate SUB and may be electrically connected to the first connection line CWL1 exposed in or through the fifth contact hole CNT5. The third contact hole CNT3 through which the first connection line CWL1 passes and the fifth contact hole CNT5 through which the first pad unit PD1 passes may be connected to each other.

The second pad unit PD2 may be disposed on another surface of the substrate SUB and may be spaced apart from the first pad unit PD1. The second pad unit PD2 may be connected to the first pad unit PD1 through a lead line LDL. The second pad unit PD2 may receive various voltages or signals from the flexible film FPCB may and transmit the voltage or signals to the first pad unit PD1, the first connection line CWL1, and the second connection line CWL2.

An adhesive film ACF may attach the flexible film FPCB to the second pad unit PD2. One surface of the adhesive film ACF may be attached to the second pad unit PD2, and another surface of the adhesive film ACF may be attached to the flexible film FPCB. For example, the adhesive film ACF may overlap the entire second pad unit PD2, but the disclosure is not limited thereto.

The adhesive film ACF may include an anisotropic conductive film. In case that the adhesive film ACF includes an anisotropic conductive film, the adhesive film ACF may have conductivity in an area where the second pad unit PD2 contacts the contact pad of the flexible film FPCB and may electrically connect the flexible film FPCB to the second pad unit PD2.

The flexible film FPCB may be disposed on the another surface of the substrate SUB. A side of the flexible film FPCB may be connected to the second pad unit PD2, and another side of the flexible film FPCB may be connected to a source circuit board (not shown) on the another of the substrate SUB. The flexible film FPCB may transmit a signal of the source driver SIC to the display device 10. For example, the source driver SIC may be an integrated circuit (IC). The source driver SIC may convert digital video data into an analog data voltage based on a source control signal of a timing controller and may supply the analog data voltage to a data line of the display area DA through the flexible film FPCB.

In the tiled display device TD, the side surfaces of the adjacent display substrates may be coupled or connected to each other using the coupling member 20 disposed between the display devices 10. The coupling member 20 may implement the tiled display device TD by connecting the side surfaces of the display devices 10-1 to 10-4 arranged in a grid shape to each other. The coupling member 20 may connect the side surfaces of the substrate SUB and the encapsulation layer TFE of each of the display devices 10 adjacent to each other.

For example, the coupling member 20 may be formed as an adhesive or double-sided tape having a relatively thin thickness, thereby reducing or minimizing the distance between the display devices 10. For another example, the coupling member 300 may be formed as a coupling frame having a relatively thin thickness, thereby reducing or minimizing the distance between the display devices 10. Accordingly, the tiled display device TD may prevent a user from recognizing the non-display area NDA or boundary portion between the display devices 10.

The cover member 30 may be disposed on the upper surfaces of the display devices 10 and the coupling member 20 to overlap the display devices 10 and the coupling member 20. For example, the cover member 30 may be disposed on the upper surface of the encapsulation layer TFE of each of the display devices 10. The cover member 30 may protect the upper surface of the tile type display device TD.

FIGS. 9 to 14 are schematic cross-sectional views illustrating a process of manufacturing the tiled display device of FIG. 8.

Figure 9:
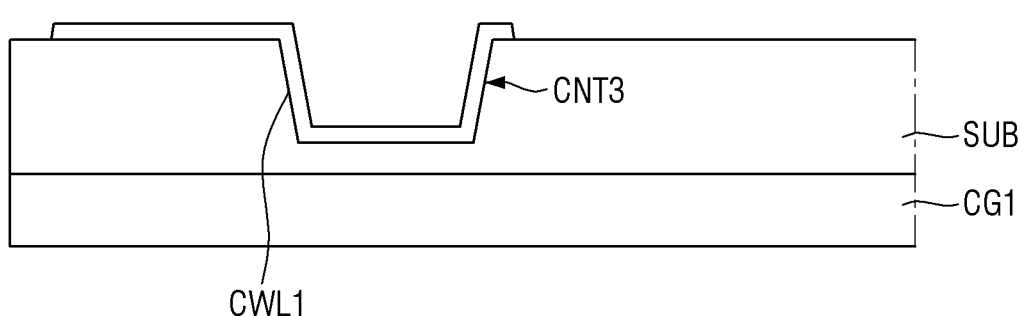
FIGS. 9 to 14 are schematic cross-sectional views illustrating a process of manufacturing the tiled display device of FIG. 8.

In FIG. 9, a substrate SUB may be provided on a first carrier substrate CG1. For example, the first carrier substrate CG1 may be a carrier glass but is not limited thereto. The first carrier substrate CG1 may support the substrate SUB in the process of forming a display layer DPL and an encapsulation layer TFE on the substrate SUB.

A third contact hole CNT3 may penetrate a part of the substrate SUB from a surface of the substrate SUB. Another part of the substrate SUB that is not penetrated by the third contact hole CNT3 may separate a first connection line CWL1 inserted into the third contact hole CNT3 from the first carrier substrate CG1.

The first connection line CWL1 may be disposed on a surface of the substrate SUB and may be inserted into the third contact hole CNT3. The first connection line CWL1 may include a depression or a step corresponding to the size of the third contact hole CNT3.

Figure 10:
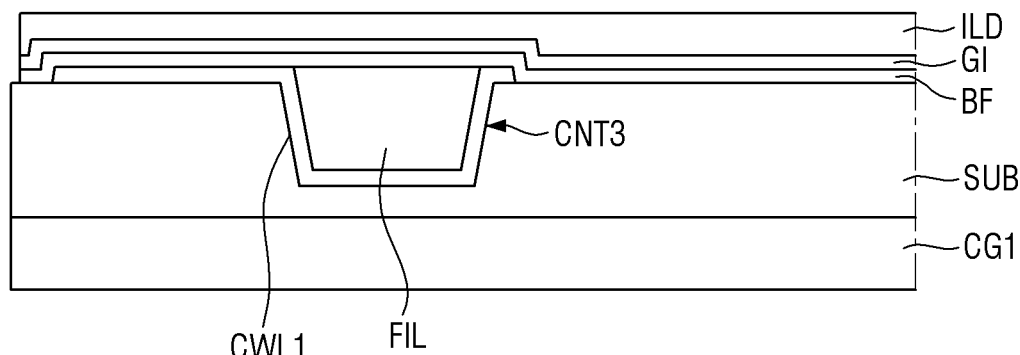

In FIG. 10, a filling part FIL may fill the depression of the first connection line CWL1 formed by the third contact hole CNT3 to planarize the upper portion of the first connection line CWL1. The upper surface of the filling part FIL and the upper surface of the first connection line CWL1 may be disposed on the same plane. The filling part FIL may fill the depression of the first connection line CWL1 provided by the third contact hole CNT3, so that a buffer layer BF may readily overlap the upper surfaces of the first connection line CWL1, the filling part FIL, and the substrate SUB while having a relatively small thickness.

The filling part FIL may fill the depression of the first connection line CWL1 through an inkjet process or a coating process, but the method of forming the filling part FIL is not limited thereto.

The filling part FIL may include an organic material. For example, the filling part FIL may include at least one of acrylic resin, epoxy resin, phenolic resin, polyamide resin, and polyimide resin.

The buffer layer BF may be stacked on the planarized first connection line CWL1, the filling part FIL, and the substrate SUB. A gate insulating film GI and an interlayer insulating film ILD may be sequentially stacked on the buffer layer BF.

Figure 11:
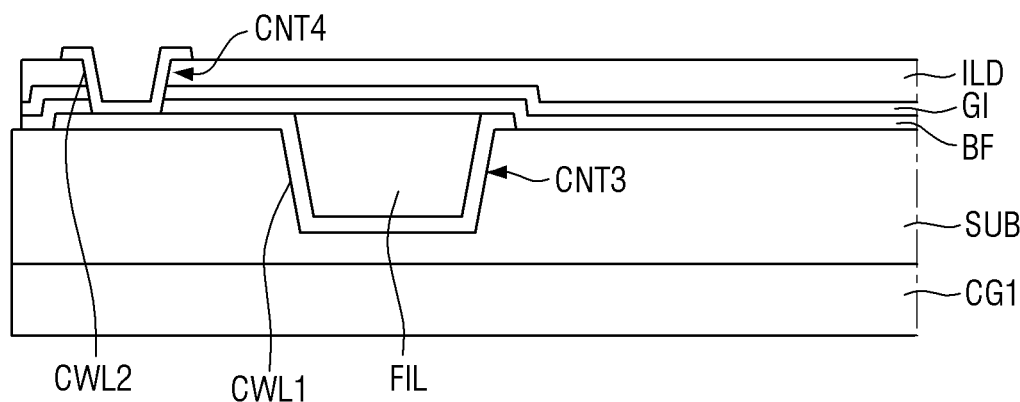

In FIG. 11, a fourth contact hole CNT4 may be formed to penetrate the interlayer insulating film ILD, the gate insulating film GI, and the buffer layer BF. The fourth contact hole CNT4 may be spaced apart from the third contact hole CNT3 in a plan view.

A second connection line CWL2 may be disposed on the interlayer insulating film ILD and may be electrically connected to the first connection line CWL1 disposed on the substrate SUB through the fourth contact hole CNT4. For example, the second connection line CWL2 and the connection electrode CNE of the thin film transistor TFT may be formed of the same material on the same layer, but the disclosure is not limited thereto.

For another example, the second connection line CWL2 and the gate electrode GE of the thin film transistor TFT may include the same material on the same layer. In case that the second connection line CWL2 and the gate electrode GE are disposed on the same layer, the second connection line CWL2 may be disposed on the gate insulating film GI.

Figure 12:
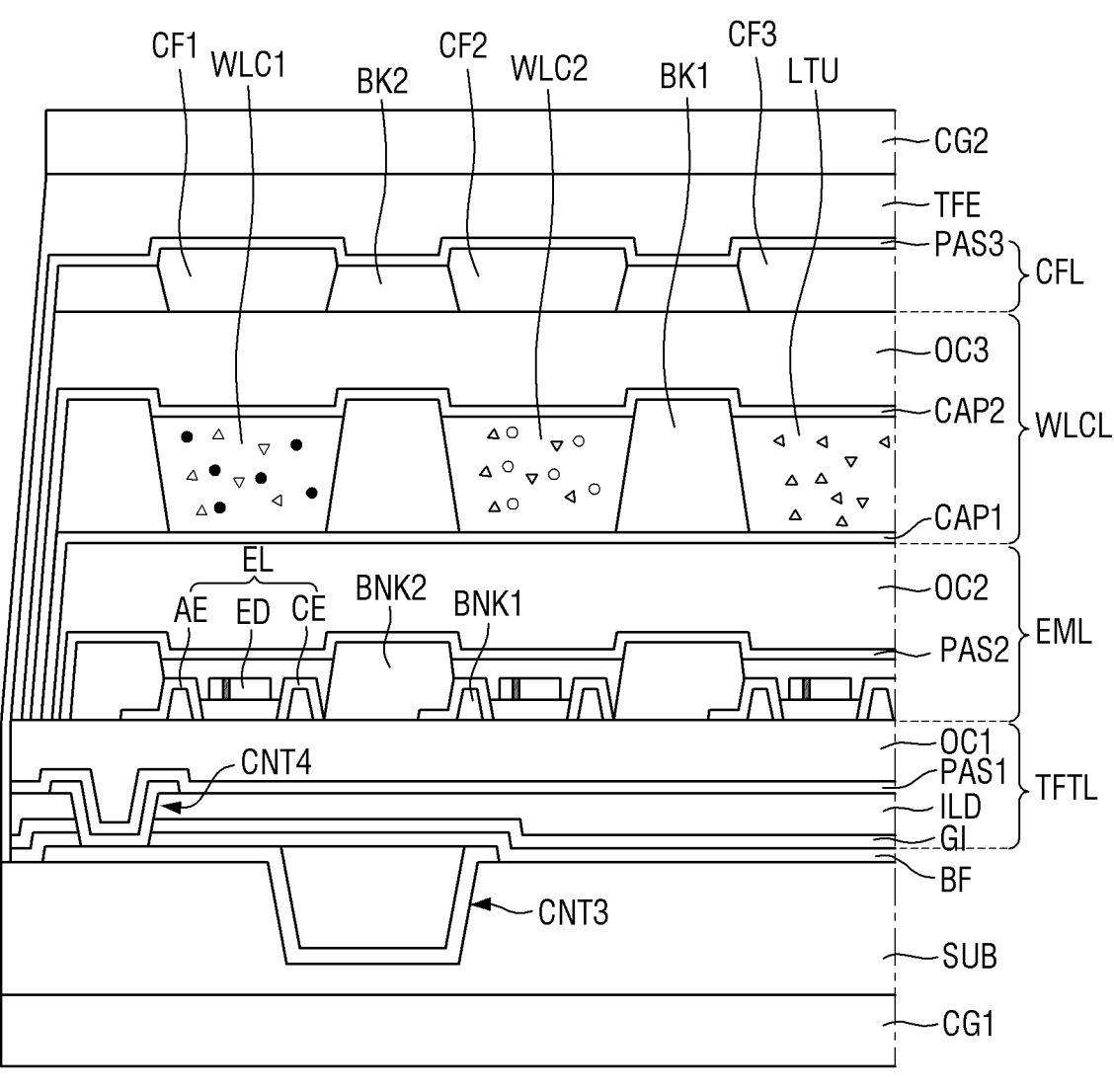

In FIG. 12, a first passivation layer PAS1 may overlap the second connection line CWL2 and the interlayer insulating film ILD, and a first planarization layer OC1 may overlap the first passivation layer PAS1.

A light emitting element layer EML, a wavelength conversion layer WLCL, a color filter layer CFL, and an encapsulation layer TFE may be sequentially stacked on a thin film transistor layer TFTL.

A second carrier substrate CG2 may be disposed on the encapsulation layer TFE. For example, the second carrier substrate CG2 may be a carrier glass but is not limited thereto. The second carrier substrate CG2 may support the display device 10 in the process of forming the first pad unit PD1 on another surface of the substrate SUB. After the second carrier substrate CG2 is disposed, the display device being manufactured may be inverted, the second carrier substrate CG2 may support the display device, and the first carrier substrate CG1 may be exposed. The first carrier substrate CG1 may be removed after the stacking of the display layer DPL and the encapsulation layer TFE is completed. Here, another part of the substrate SUB that is not penetrated by the third contact hole CNT3 separates the first connection line CWL1 inserted into the third contact hole CNT3 from the first carrier substrate CG1. Accordingly, in the display device 10, the third contact hole CNT3 does not completely penetrate the substrate SUB, and the first connection line CWL1 is spaced apart from the first carrier substrate CG1, so that the first carrier substrate CG1 may be readily removed. As such, the first carrier substrate CG1 may be readily detached during the process of manufacturing the display device 10.

Figure 13:
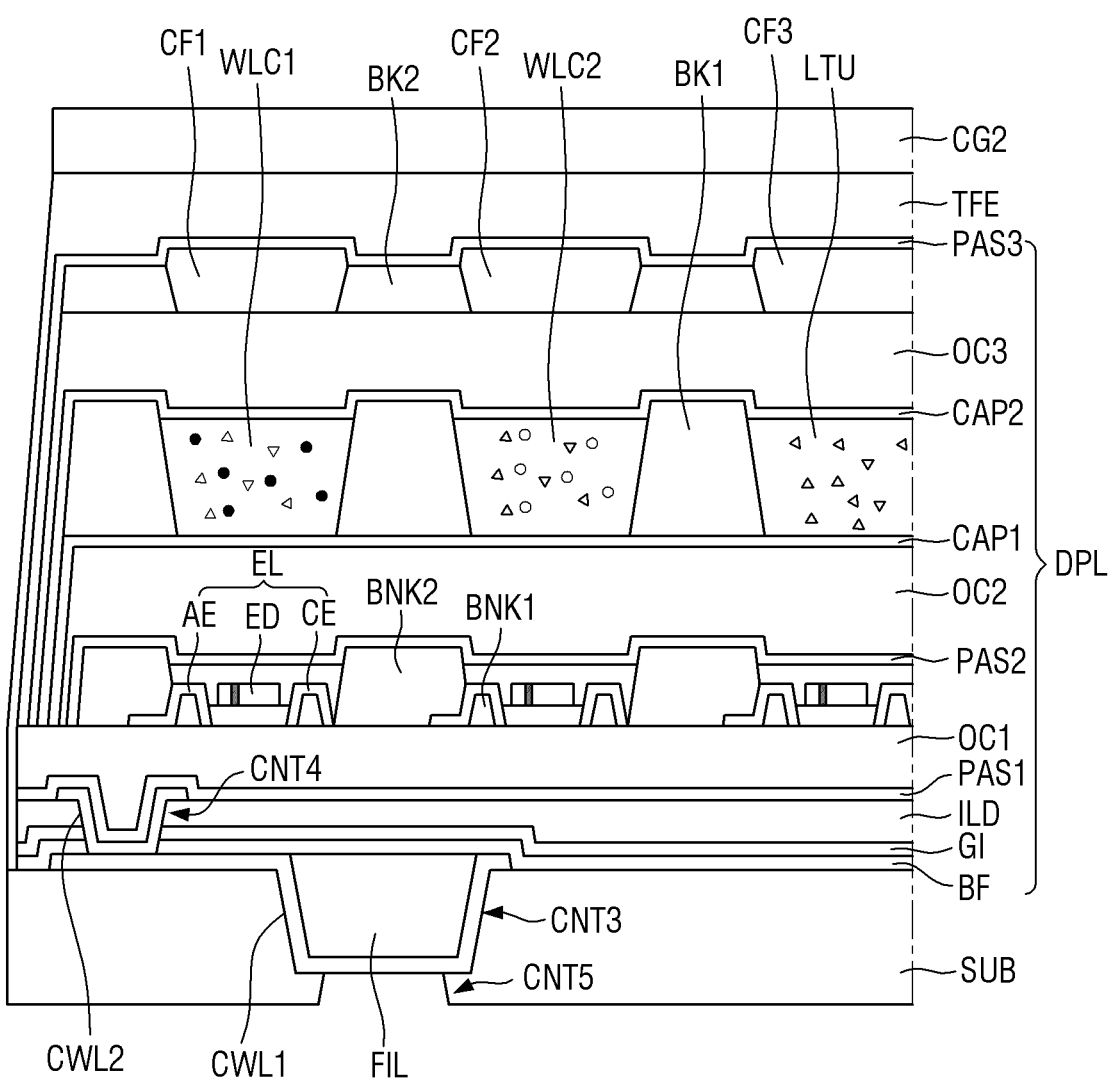

In FIG. 13, a fifth contact hole CNT5 may penetrate another part of the substrate SUB from another surface of the substrate SUB. The fifth contact hole CNT5 may be connected to the third contact hole CNT3. The first connection line CWL1 inserted into the third contact hole CNT3 may be exposed through (or in) the fifth contact hole CNT5.

Figure 14:
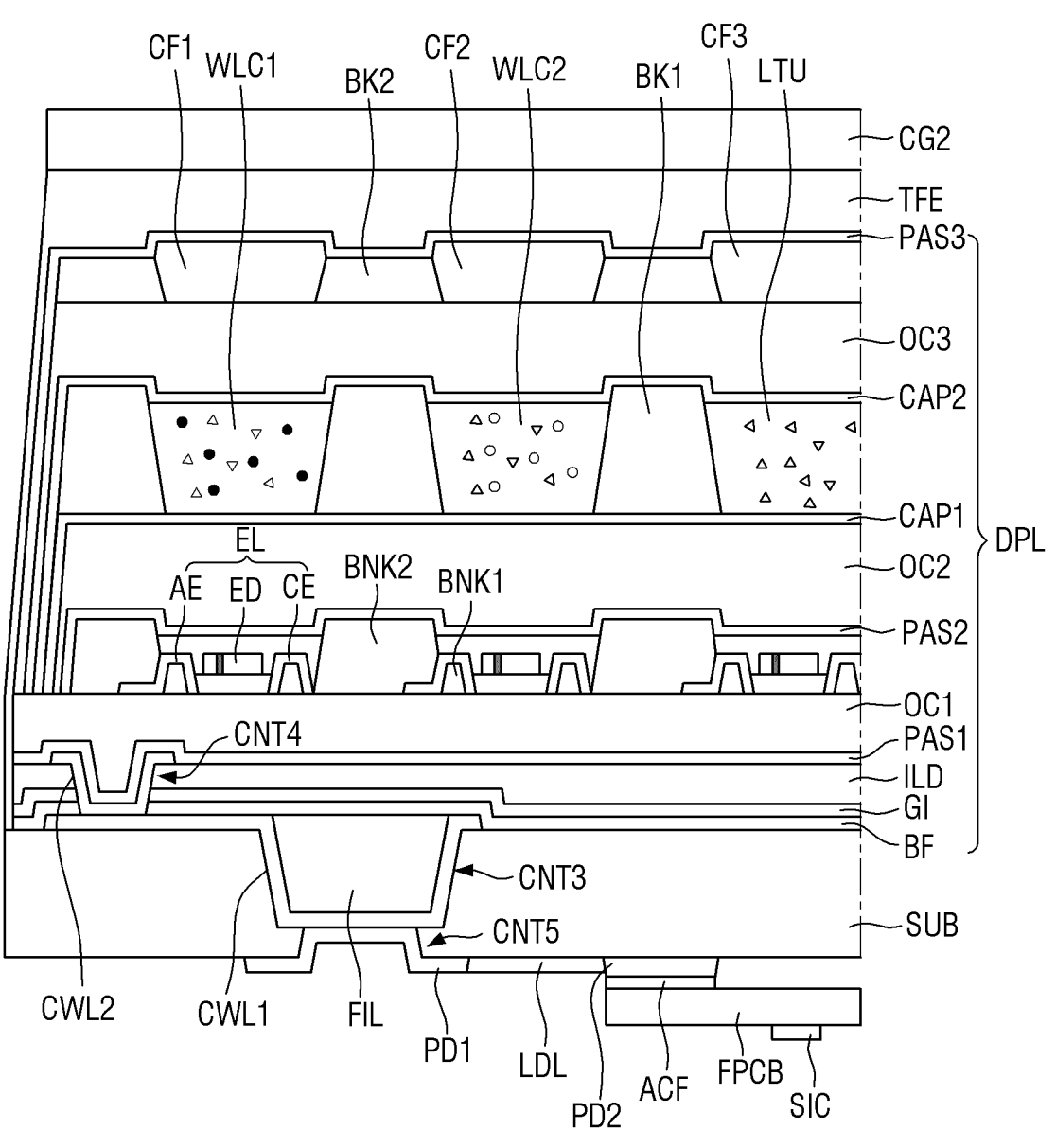

In FIG. 14, a first pad unit PD1 may be disposed on another surface of the substrate SUB and may be electrically connected to the first connection line CWL1 exposed through the fifth contact hole CNT5.

A second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

A flexible film FPCB may be disposed on the another surface of the substrate SUB. One side of the flexible film FPCB may be connected to the second pad unit PD2, and another side of the flexible film FPCB may be connected to a source circuit board (not shown) from the other side of the substrate SUB. The flexible film FPCB may transmit a signal of the source driver SIC to the display device 10.

Figure 15:
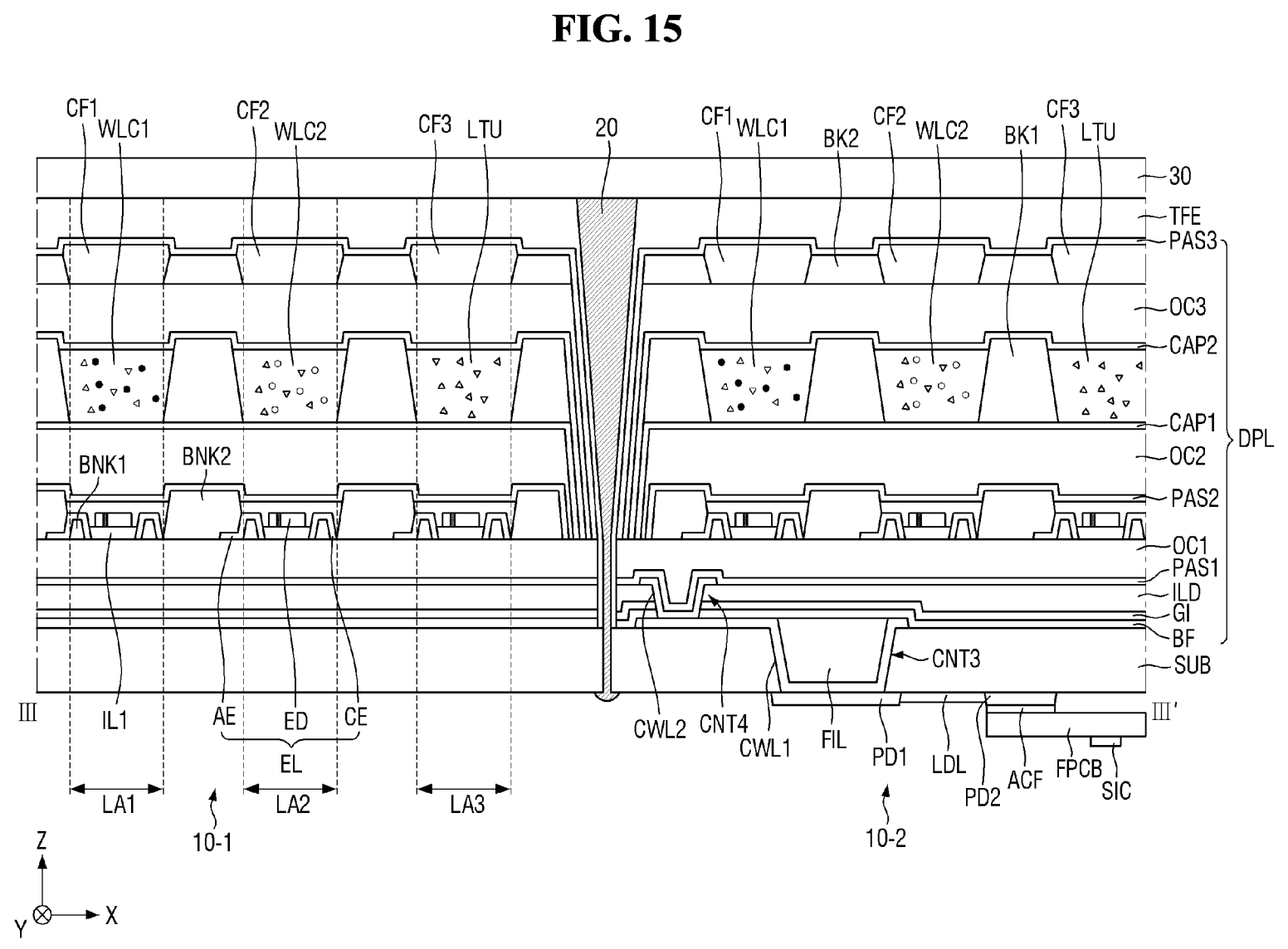

FIG. 15 s a schematic cross-sectional view of a tiled display device according to another embodiment taken along line III-III' of FIG. 7. The tiled display device of FIG. 15 is different from the tiled display device of FIG. 8 at least in the configuration of the substrate SUB, and thus the same configuration as the above-described configuration will be briefly described or omitted.

Referring to FIG. 15, the tiled display device TD may include display devices 10, a coupling member 20, and a cover member 30.

The display device 10 may include a substrate SUB, a first connection line CWL1, a filling part FIL, a display layer DPL, an encapsulation layer TFE, a first pad unit PD1, and a second pad unit. PD2, a flexible film FPCB, and a source driver SIC.

The substrate SUB may be a base plate or a base member and may include an insulating material such as a polymer resin. For example, the substrate SUB may be a flexible substrate capable of bending, folding, rolling, or the like. In case that the substrate SUB is a flexible substrate, the substrate SUB may include polyimide PI, but the material thereof is not limited thereto.

The substrate SUB may include a third contact hole CNT3 provided at one surface. For example, the third contact hole CNT3 may penetrate one surface of the substrate SUB from another surface thereof. The third contact hole CNT3 may be disposed to overlap the display area DA. The first connection line CWL1 inserted into the third contact hole CNT3 may be disposed in the display area DA. Accordingly, the display device 10 may not include a separate pad unit disposed at the outermost side, and the bezel area or dead space of the display device 10 may be reduced or minimized. Since the first paid unit PD1 is disposed on the lower surface of the display device 10, the distance between the display devices 10 may be further reduced compared to when the pad unit 10 is disposed on the outermost side of the substrate SUB or when a flexible film is disposed on the side surface of the substrate SUB.

The first connection line CWL1 may be disposed on one surface of the substrate SUB and may be electrically connected to the first pad unit PD1 provided on the another surface of the substrate SUB through the third contact hole CNT3. For example, the first connection line CWL1 may be inserted into the third contact hole CNT3 and may include a depression or a step corresponding to the size of the third contact hole CNT3. The first connection line CWL1 may supply an electric signal received from the first pad unit PD1 to the thin film transistor layer TFTL through the second connection line CWL2.

The filling part FIL may fill the depression of the first connection line CWL1 formed by the third contact hole CNT3 to planarize the upper portion of the first connection line CWL1. The upper surface of the filling part FIL and the upper surface of the first connection line CWL1 may be disposed on the same plane. The filling part FIL may fill the depression of the first connection line CWL1 provided by the third contact hole CNT3, so that the buffer layer BF may readily overlap the upper surfaces of the first connection line CWL1, the filling part FIL, and the substrate SUB while having a relatively small thickness.

The filling part FIL may include an organic material. For example, the filling part FIL may include at least one of acrylic resin, epoxy resin, phenolic resin, polyamide resin, and polyimide resin.

The display layer DPL may be disposed on the substrate SUB. The display layer DPL may include a buffer layer BF, a thin film transistor layer TFTL, a light emitting element layer EML, a wavelength conversion layer WLCL, and a color filter layer CFL.

The first pad unit PD1 may be disposed on the another surface of the substrate SUB and may be electrically connected to the first connection line CWL1 exposed to the other surface of the substrate SUB through the third contact hole CNT3.

The second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

Figure 16:
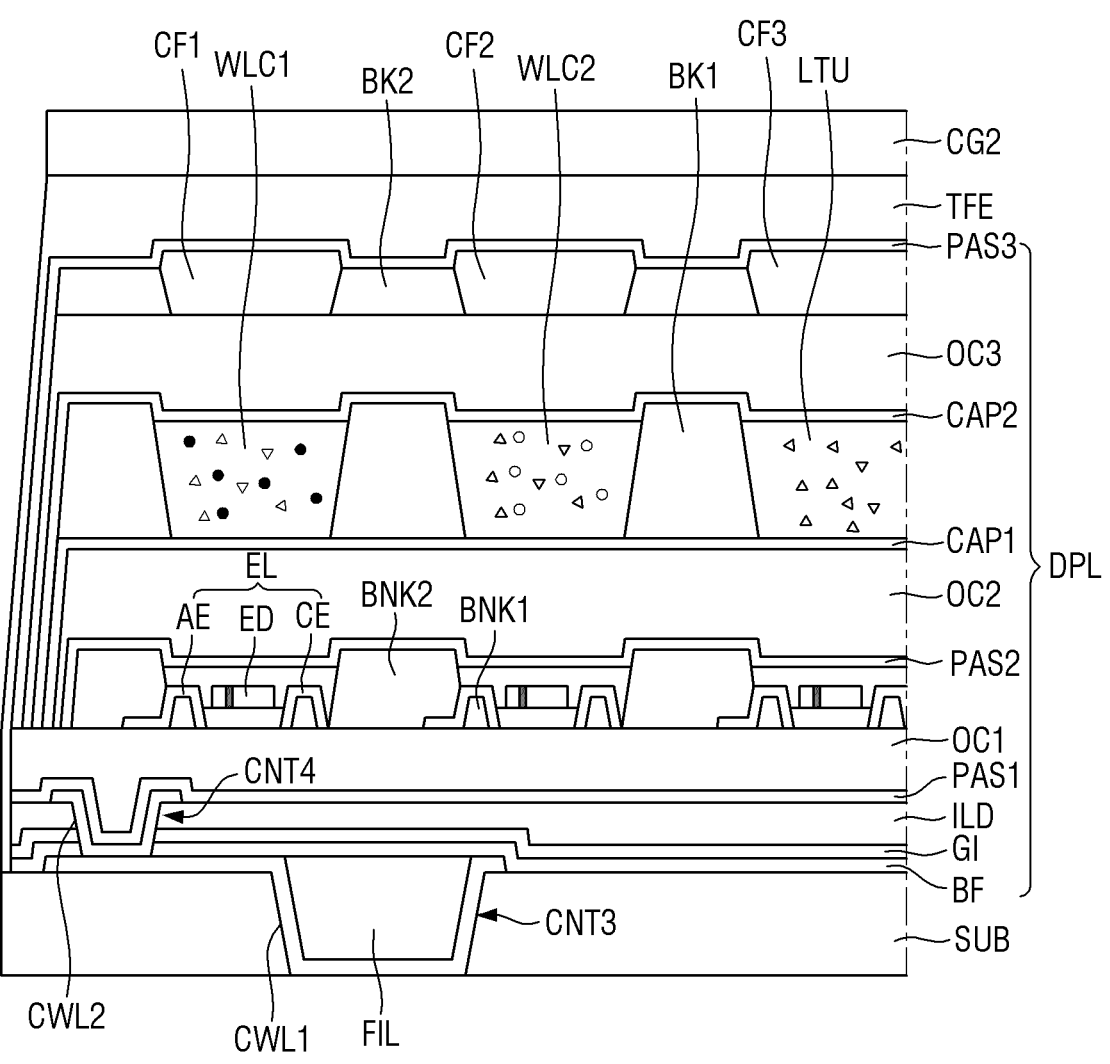
FIGS. 16 and 17 are schematic cross-sectional views illustrating a process of manufacturing the tiled display device of FIG. 15.
Figure 17:
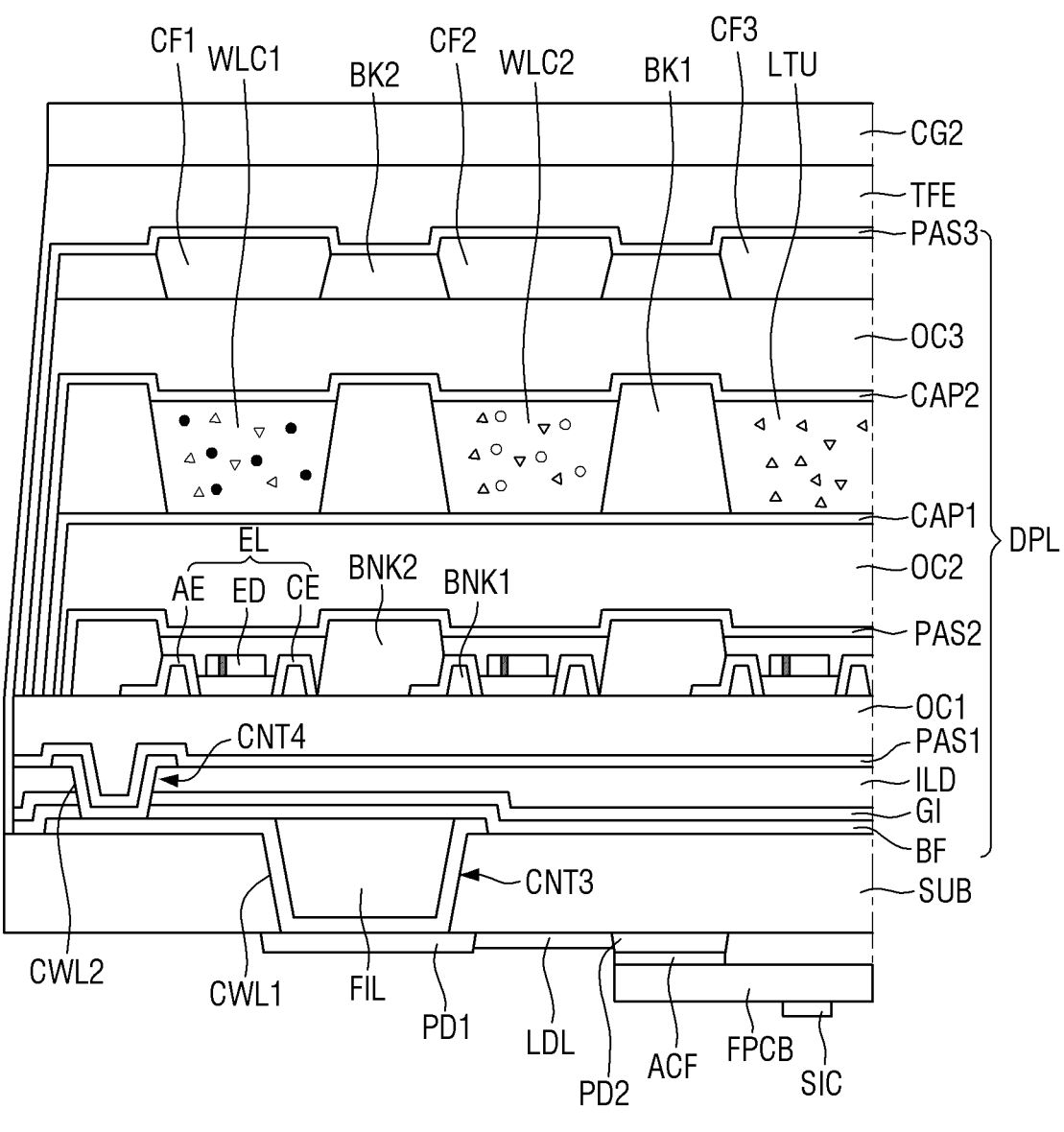

FIGS. 16 and 17 are schematic cross-sectional views illustrating a process of manufacturing the tiled display device of FIG. 15. The process of manufacturing the tiled display device illustrated in FIG. 16 may be a process following the process of manufacturing the display device illustrated in FIG. 12.

In FIG. 16, another surface of the substrate SUB may be removed until the first connection line CWL1 is exposed. The entire other surface of the substrate SUB may be etched while having a flat surface, and the first connection line CWL1 may be exposed to the another surface of the substrate SUB without an additional contact hole.

In FIG. 17, the first pad unit PD1 may be disposed on the another surface of the substrate SUB, and may be electrically connected to the first connection line CWL1 exposed to the another surface of the substrate SUB.

The second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

Figure 18:
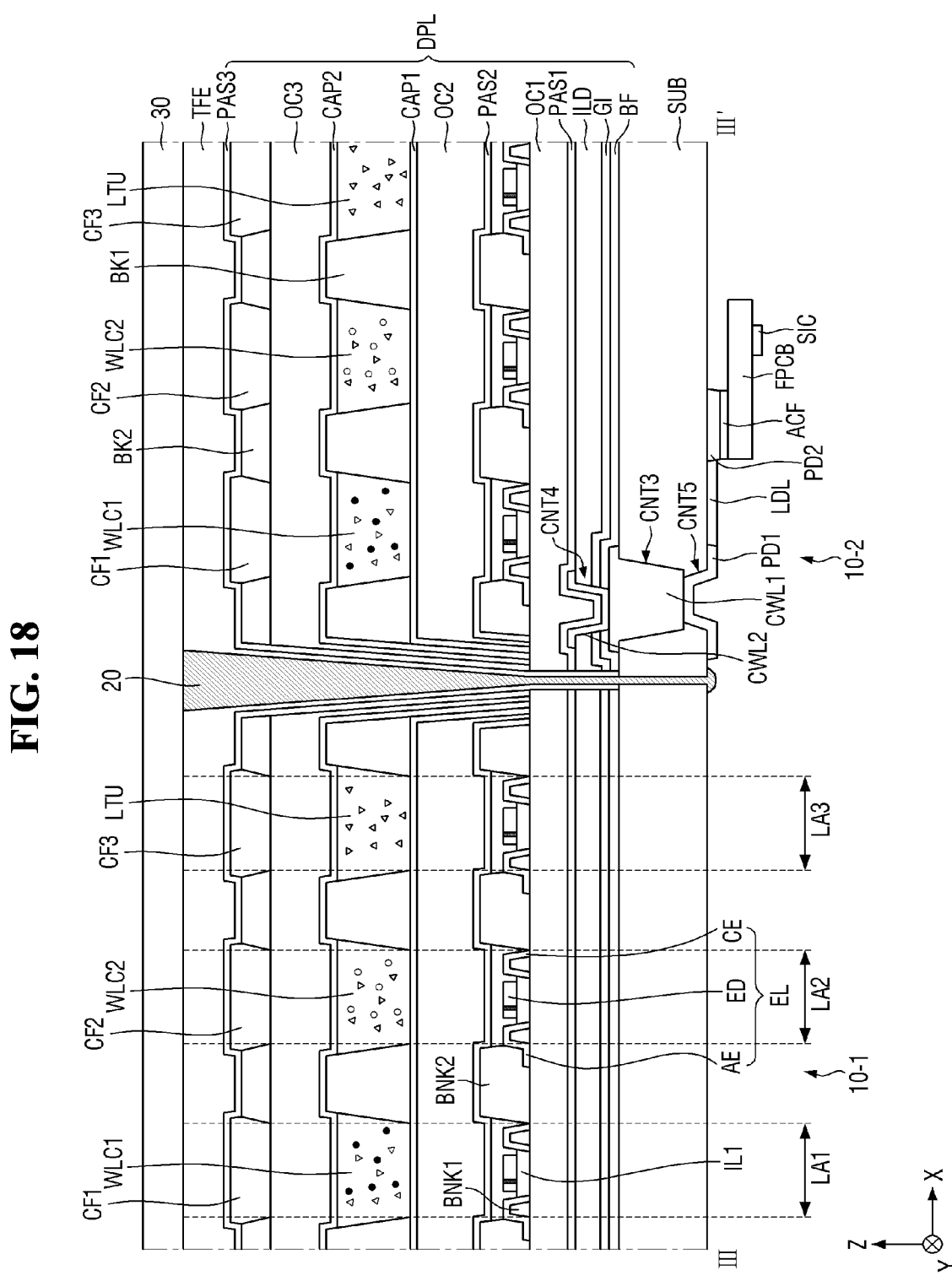
FIG. 18 is a schematic cross-sectional view of a tiled display device according to another embodiment taken along line III-III' of FIG. 7.

FIG. 18 is a schematic cross-sectional view of a tiled display device according to another embodiment taken along line III-III' of FIG. 7. The tiled display device of FIG. 18 is different from the tiled display device of FIG. 8 at least in the configuration of the substrate SUB, and the same configuration as the above-described configuration will be briefly described or omitted.

Referring to FIG. 18, the tiled display device TD may include display devices 10, a coupling member 20, and a cover member 30.

The display device 10 may include a substrate SUB, a first connection line CWL1, a display layer DPL, an encapsulation layer TFE, a first pad unit PD1, a second pad unit. PD2, a flexible film FPCB, and a source driver SIC.

The substrate SUB may be a base plate or a base member and may be made of an insulating material such as a polymer resin. For example, the substrate SUB may be a flexible substrate capable of bending, folding, rolling, or the like. In case that the substrate SUB is a flexible substrate, the substrate SUB may include polyimide PI, but the material thereof is not limited thereto.

The substrate SUB may include a third contact hole CNT3 provided at one surface and a fifth contact hole CNT5 provided at another surface opposite to the one surface. For example, the third contact hole CNT3 may penetrate a part of the substrate SUB from the upper surface of the substrate SUB, and the fifth contact hole CNT5 may penetrate another part of the substrate SUB from the lower surface of the substrate SUB. The third contact hole CNT3 and the fifth contact hole CNT5 may be connected to each other. Accordingly, the substrate SUB may be penetrated through the third contact hole CNT3 and the fifth contact hole CNT5.

The third contact hole CNT3 and the fifth contact hole CNT5 may be disposed to overlap the display area DA. The first connection line CWL1 inserted into the third contact hole CNT3 and the first pad unit PD inserted into the fifth contact hole CNT5 may be disposed in the display area DA. Accordingly, the display device 10 may not include a separate pad unit disposed at the outermost side, and the bezel area or dead space of the display device 10 may be reduced or minimized. Since the first paid unit PD1 is disposed on the lower surface of the display device 10, the distance between the display devices 10 may be further reduced compared to when the pad unit 10 is disposed on the outermost side of the substrate SUB or when a flexible film is disposed on the side surface of the substrate SUB.

The first connection line CWL1 may be disposed on one surface of the substrate SUB and may be electrically connected to the first pad unit PD1 provided on another surface of the substrate SUB through the third contact hole CNT3. The first connection line CWL1 may supply an electric signal received from the first pad unit PD1 to the thin film transistor layer TFTL through the second connection line CWL2. The first connection line CWL1 may be inserted into the third contact hole CNT3 and may have a flat upper surface. For example, the first connection line CWL1 may fill the third contact hole CNT3 through an inkjet process, a cutting process, or a plating process. Since the first connection line CWL1 may be inserted into the third contact hole CNT3 and have a flat upper surface, the buffer layer BF may have a relatively small thickness and may readily overlap the upper surfaces of the first connection line CWL1 and the substrate SUB.

The display layer DPL may be disposed on the substrate SUB. The display layer DPL may include a buffer layer BF, a thin film transistor layer TFTL, a light emitting element layer EML, a wavelength conversion layer WLCL, and a color filter layer CFL.

The buffer layer BF may be disposed on the substrate SUB and the first connection line CWL1. The gate insulating film GI may be disposed on the buffer layer BF, and the interlayer insulating film ILD may be disposed on the gate insulating film GI.

The interlayer insulating film ILD, the gate insulating film GI, and the buffer layer BF may include a fourth contact hole CNT4 through which the second connection line CWL2 passes. The fourth contact hole CNT4 may overlap the third contact hole CNT3 in the thickness direction.

The thin film transistor layer TFTL may further include a second connection line CWL2 disposed on the interlayer insulating film ILD. The second connection line CWL2 may be electrically connected to the first connection line CWL1 disposed on the substrate SUB through the fourth contact hole CNT4. The second connection line CWL2 may be electrically connected to data lines to supply a data voltage and may be electrically connected to scan lines to supply a scan signal. For example, the second connection line CWL2 and the connection electrode CNE of the thin film transistor TFT may be formed of the same material on the same layer, but the disclosure is not limited thereto. For another example, the second connection line CWL2 and the gate electrode GE of the thin film transistor TFT may be formed of the same material on the same layer.

The display device 10 may include the third contact hole CNT3 provided in one surface of the substrate SUB and the fourth contact hole CNT4 provided in the buffer layer BF, the gate insulating film GI, and the interlayer insulating film ILD, and thus a signal of the first pad unit PD1 may be supplied to the thin film transistor layer TFTL by using the first connection line CWL1 and the second connection line CWL2. In the display device 10, double contact holes including the third contact hole CNT3 and the fourth contact hole CNT4, and thus the depth of a contact hole may be reduced as compared with a case where only one contact hole penetrating the substrate SUB from the interlayer insulating film ILD is formed.

The first pad unit PD1 may be disposed on another surface of the substrate SUB and may be electrically connected to the first connection line CWL1 exposed through the fifth contact hole CNT5. The third contact hole CNT3 through which the first connection line CWL1 passes and the fifth contact hole CNT5 through which the first pad unit PD1 passes may be connected to each other.

The second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

FIGS. 19 to 24 are schematic cross-sectional views illustrating a process of manufacturing the tiled display device of FIG. 18.

Figure 19:
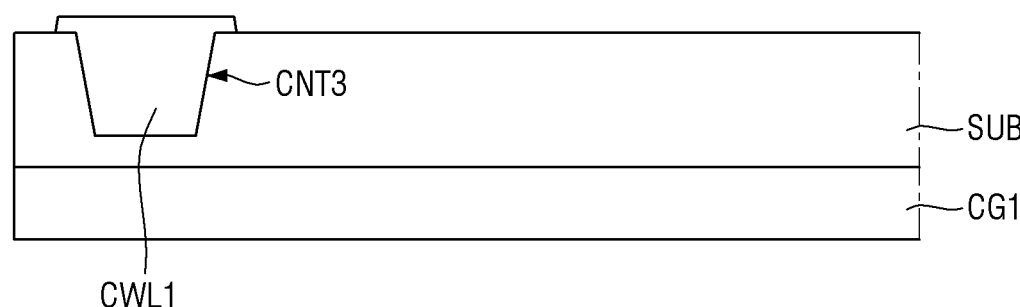
FIGS. 19 to 24 are schematic cross-sectional views illustrating a process of manufacturing the tiled display device of FIG. 18.

In FIG. 19, a substrate SUB may be provided on a first carrier substrate CG1. For example, the first carrier substrate CG1 may be a carrier glass but is not limited thereto. The first carrier substrate CG1 may support the substrate SUB in the process of forming a display layer DPL and an encapsulation layer TFE on the substrate SUB.

A third contact hole CNT3 may penetrate a part of the substrate SUB from one surface of the substrate SUB. Another part of the substrate SUB that is not penetrated by the third contact hole CNT3 may separate a first connection line CWL1 inserted into the third contact hole CNT3 from the first carrier substrate CG1.

A first connection line CWL1 may be disposed on one surface of the substrate SUB, may be inserted into the third contact hole CNT3, and may have a flat upper surface. For example, the first connection line CWL1 may fill the third contact hole CNT3 through an inkjet process, a cutting process, or a plating process.

Figure 20:
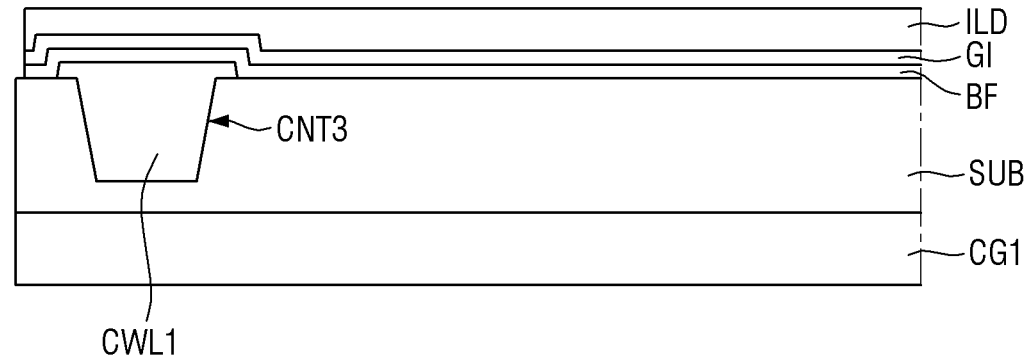

In FIG. 20, a buffer layer BF may be stacked on the planarized first connection line CWL1 and the substrate SUB. A gate insulating film GI and an interlayer insulating film ILD may be sequentially stacked on the buffer layer BF.

Since the first connection line CWL1 is inserted into the third contact hole CNT3 and has a flat upper surface, the buffer layer BF may have a relatively small thickness, and may readily overlap the upper surfaces of the first connection line CWL1 and the substrate SUB.

Figure 21:
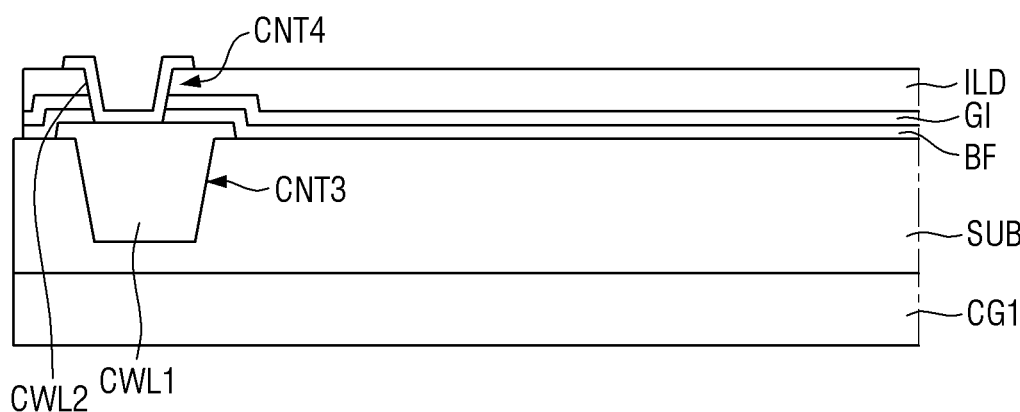

In FIG. 21, a fourth contact hole CNT4 may be formed to penetrate the interlayer insulating film ILD, the gate insulating film GI, and the buffer layer BF. The fourth contact hole CNT4 may overlap the third contact hole CNT3 in the thickness direction.

A second connection line CWL2 may be disposed on the interlayer insulating film ILD and may be connected to the first connection line CWL1 disposed on the substrate SUB through the fourth contact hole CNT4.

Figure 22:
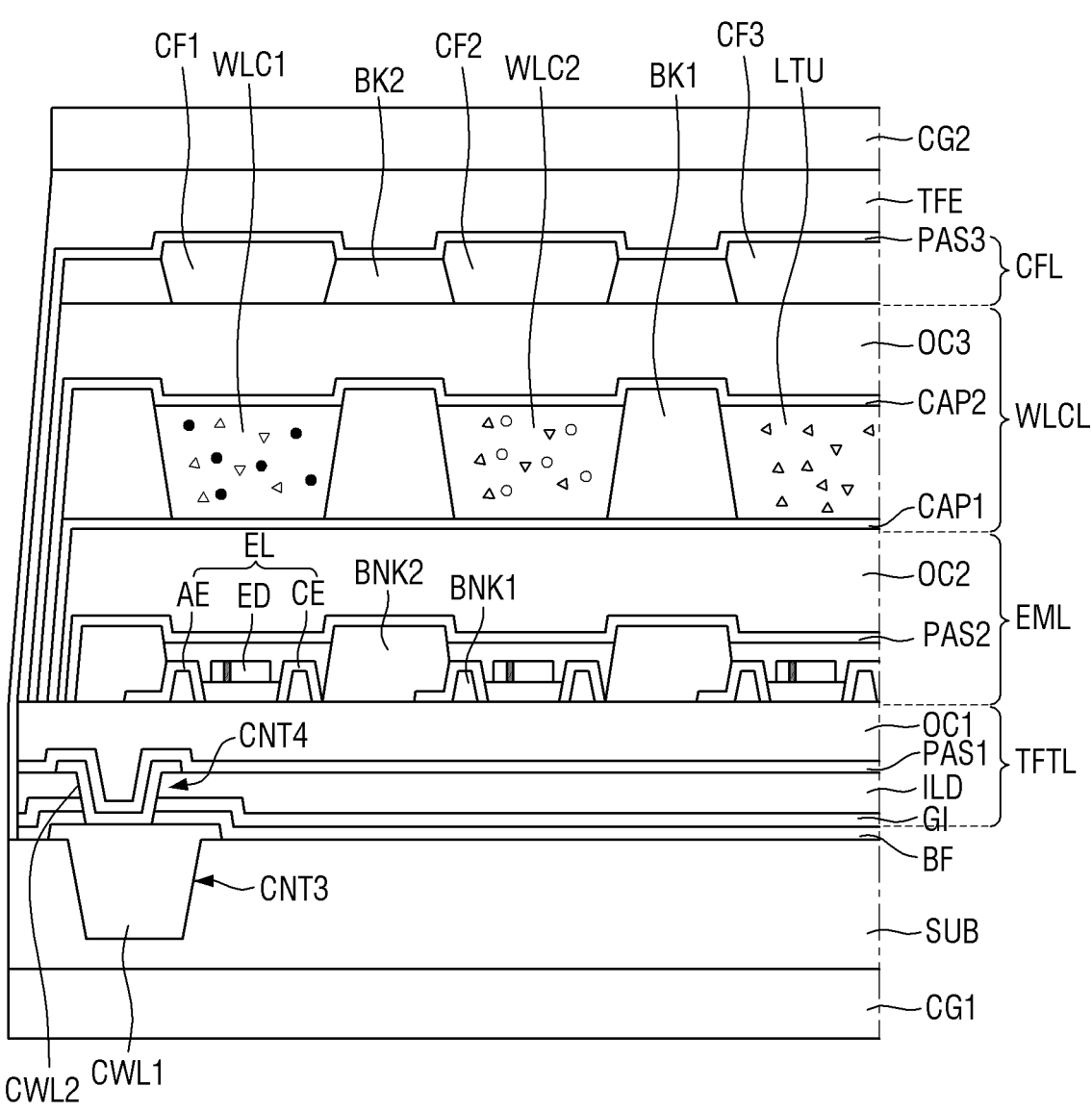

In FIG. 22, a first passivation layer PAS1 may overlap the second connection line CWL2 and the interlayer insulating film ILD, and a first planarization layer OC1 may cover the first passivation layer PAS1.

A light emitting element layer EML, a wavelength conversion layer WLCL, a color filter layer CFL, and an encapsulation layer TFE may be sequentially stacked on a thin film transistor layer TFTL.

A second carrier substrate CG2 may be disposed on the encapsulation layer TFE. For example, the second carrier substrate CG2 may be a carrier glass but is not limited thereto. The second carrier substrate CG2 may support the display device 10 in the process of forming the first pad unit PD1 on the other surface of the substrate SUB. After the second carrier substrate CG2 is disposed, the display device 10 being manufactured may be inverted, the second carrier substrate CG2 may support the display device 10, and the first carrier substrate CG1 may be exposed. The first carrier substrate CG1 may be removed after stacking of the display layer DPL and the encapsulation layer TFE is completed. Here, another part of the substrate SUB that is not penetrated by the third contact hole CNT3 separates the first connection line CWL1 inserted into the third contact hole CNT3 from the first carrier substrate CG1. Accordingly, in the display device 10, the third contact hole CNT3 does not completely penetrate the substrate SUB, and the first connection line CWL1 is spaced apart from the first carrier substrate CG1, so that the first carrier substrate CG1 may be readily removed. As such, the first carrier substrate CG1 may be readily detached during the process of manufacturing the display device 10.

Figure 23:
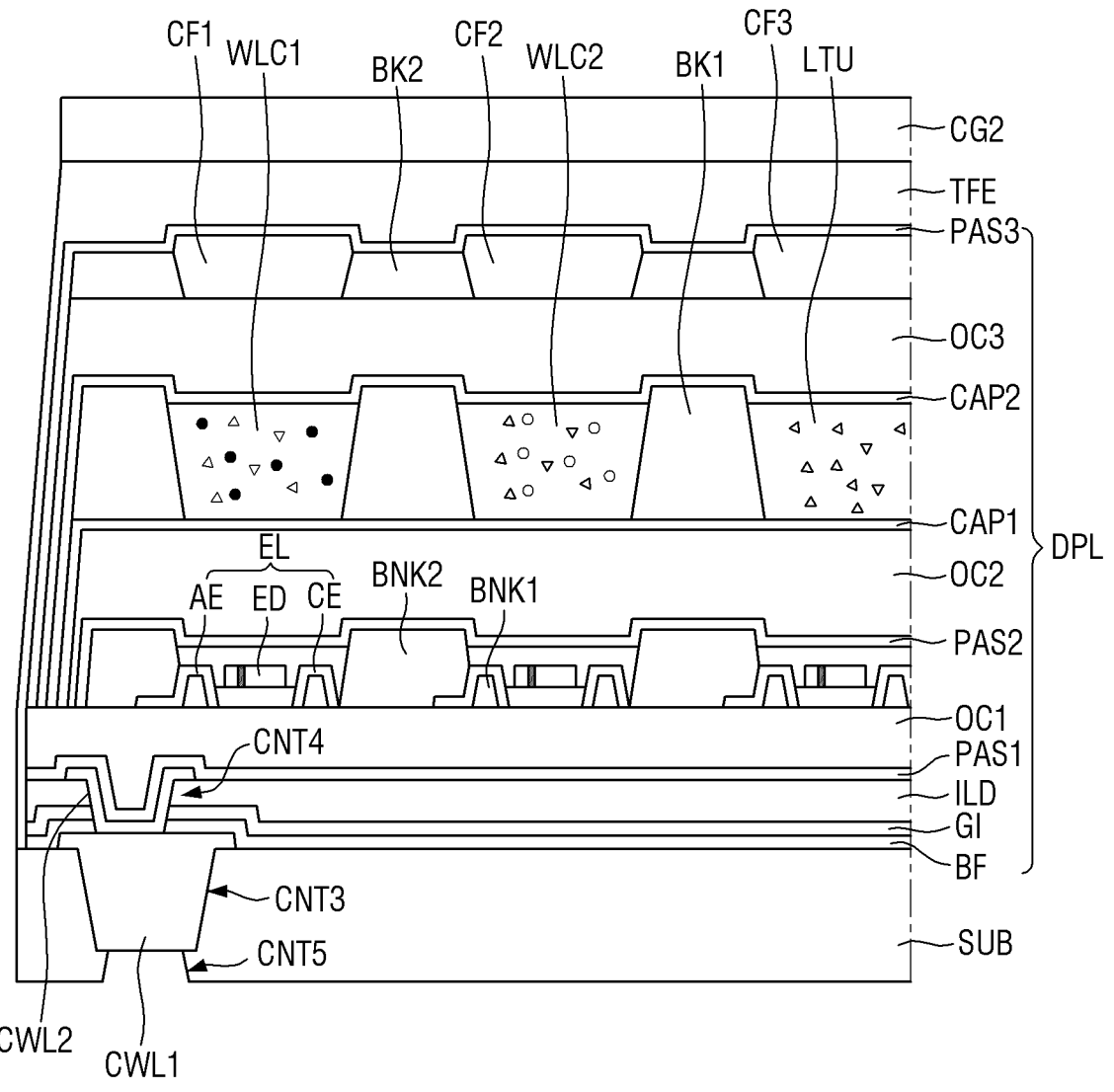

In FIG. 23, a fifth contact hole CNT5 may penetrate another part of the substrate SUB from another surface of the substrate SUB. The fifth contact hole CNT5 may be connected to the third contact hole CNT3. The first connection line CWL1 inserted into the third contact hole CNT3 may be exposed through the fifth contact hole CNT5.

Figure 24:
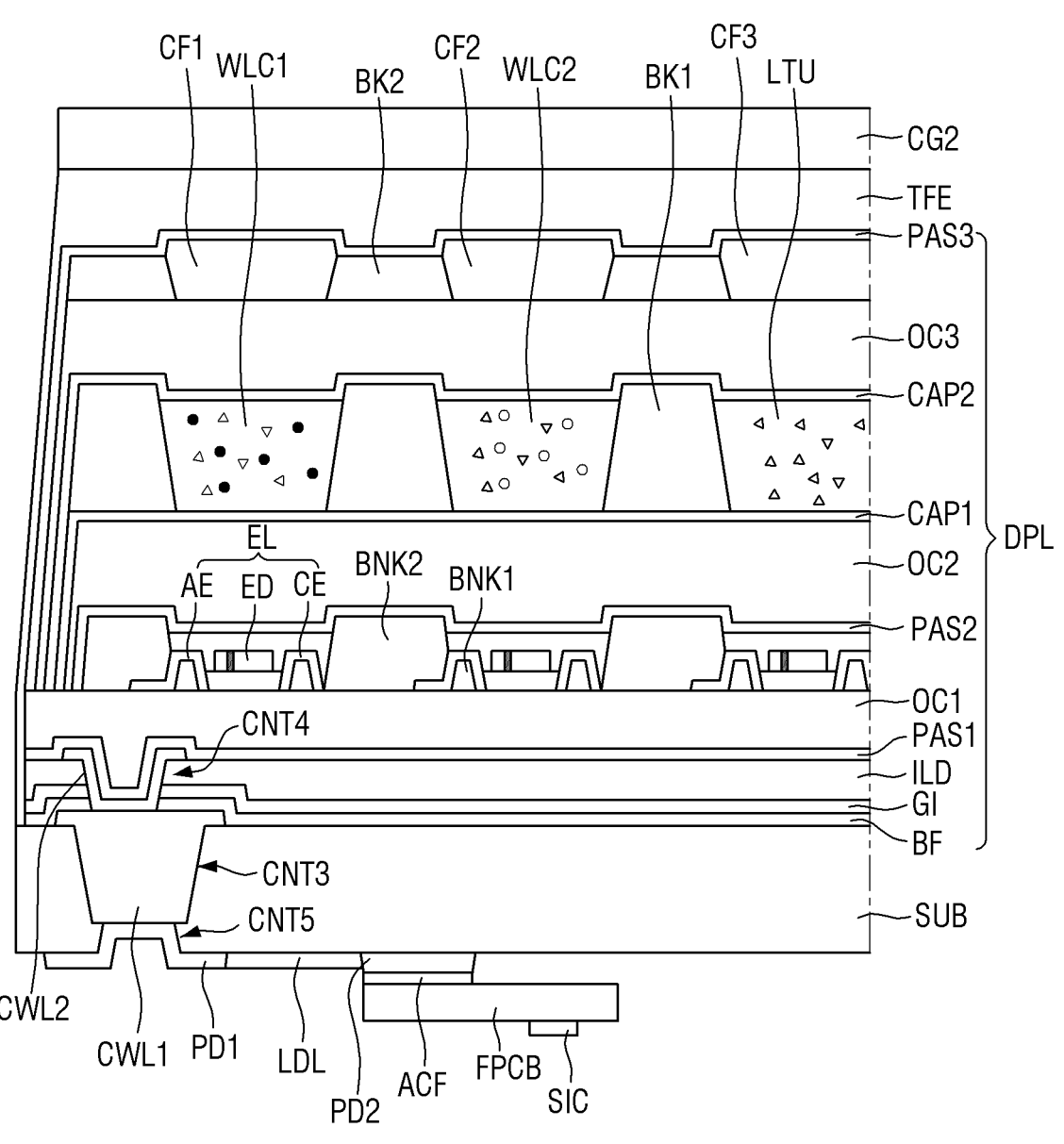

In FIG. 24, a first pad unit PD1 may be disposed on the another surface of the substrate SUB and may be electrically connected to the first connection line CWL1 exposed through the fifth contact hole CNT5.

A second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

A flexible film FPCB may be disposed on the another surface of the substrate SUB. One side of the flexible film FPCB may be connected to the second pad unit PD2, and another side of the flexible film FPCB may be connected to a source circuit board (not shown) from the other side of the substrate SUB. The flexible film FPCB may transmit a signal of the source driver SIC to the display device 10.

Figure 25:
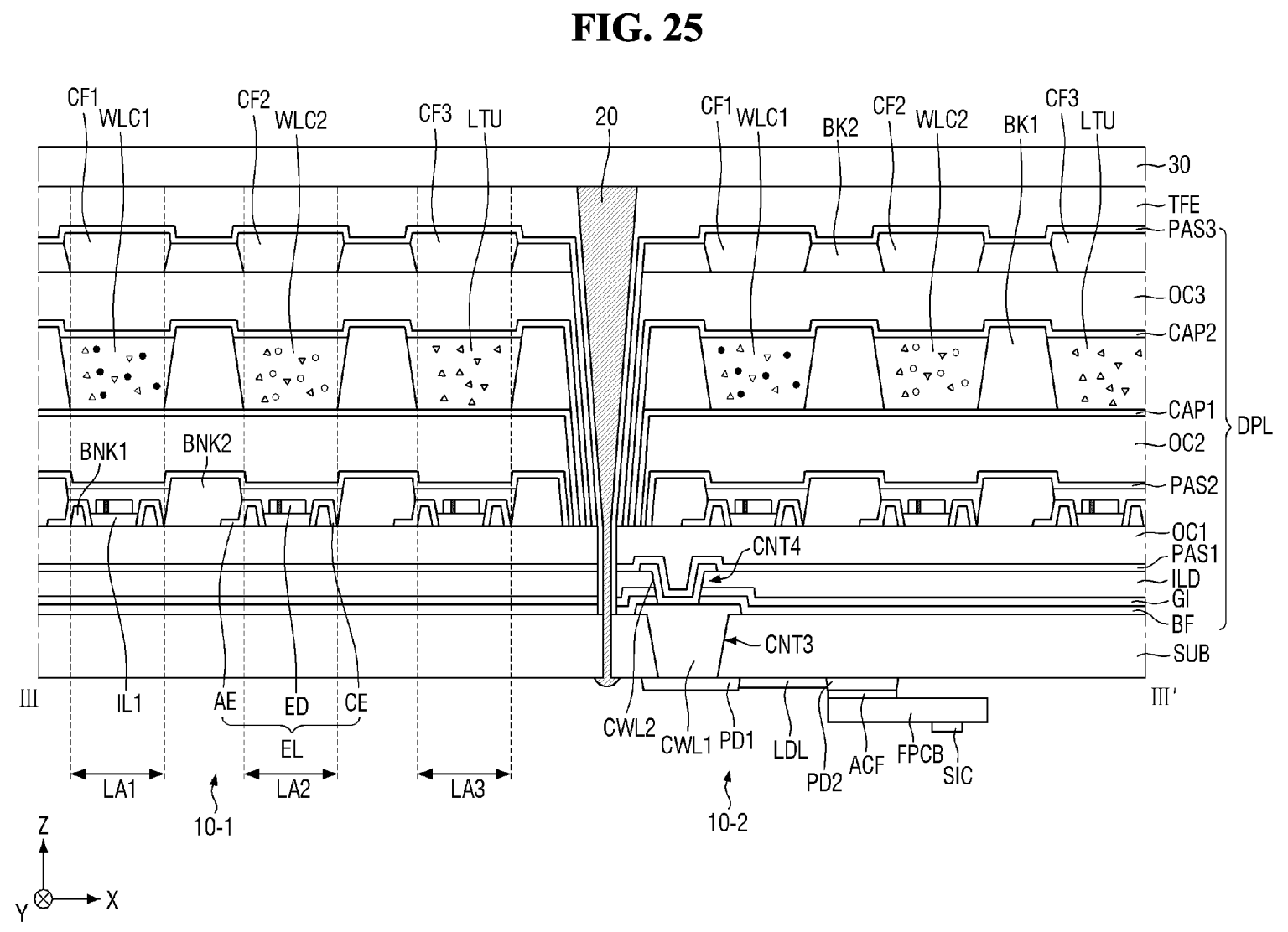

FIG. 25 s a schematic cross-sectional view of a tiled display device according to another embodiment taken along line III-III' of FIG. 7. The tiled display device of FIG. 25 is different from the tiled display device of FIG. 18 at least in the configuration of the substrate SUB, and the same configuration as the above-described configuration will be briefly described or omitted.

Referring to FIG. 25, the tiled display device TD may include display devices 10, a coupling member 20, and a cover member 30.

The display device 10 may include a substrate SUB, a first connection line CWL1, a display layer DPL, an encapsulation layer TFE, a first pad unit PD1, a second pad unit. PD2, a flexible film FPCB, and a source driver SIC.

The substrate SUB may be a base plate or a base member and may include an insulating material such as a polymer resin. For example, the substrate SUB may be a flexible substrate capable of bending, folding, rolling, or the like. In case that the substrate SUB is a flexible substrate, the substrate SUB may include polyimide PI, but the material thereof is not limited thereto.

The substrate SUB may include a third contact hole CNT3 provided at one surface. For example, the third contact hole CNT3 may penetrate one surface of the substrate SUB from another surface thereof. The third contact hole CNT3 may be disposed to overlap the display area DA. The first connection line CWL1 inserted into the third contact hole CNT3 may be disposed in the display area DA. Accordingly, the display device 10 may not include a separate pad unit disposed at the outermost side, and the bezel area or dead space of the display device 10 may be minimized. Since the first paid unit PD1 is disposed on the lower surface of the display device 10, the distance between the display devices 10 may be further reduced compared with when the pad unit 10 is disposed on the outermost side of the substrate SUB or when a flexible film is disposed on the side surface of the substrate SUB.

The first connection line CWL1 may be disposed on one surface of the substrate SUB and may be connected to the first pad unit PD1 provided on another surface of the substrate SUB through the third contact hole CNT3. The first connection line CWL1 may be inserted into the third contact hole CNT3 and may have a flat upper surface. Since the first connection line CWL1 is inserted into the third contact hole CNT3 and has a flat upper surface, the buffer layer BF may have a relatively small thickness and may readily overlap the upper surfaces of the first connection line CWL1 and the substrate SUB.

The display layer DPL may be disposed on the substrate SUB. The display layer DPL may include a buffer layer BF, a thin film transistor layer TFTL, a light emitting element layer EML, a wavelength conversion layer WLCL, and a color filter layer CFL.

The first pad unit PD1 may be disposed on the another surface of the substrate SUB and may be electrically connected to the first connection line CWL1 exposed to the another surface of the substrate SUB through the third contact hole CNT3.

The second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

Figure 26:
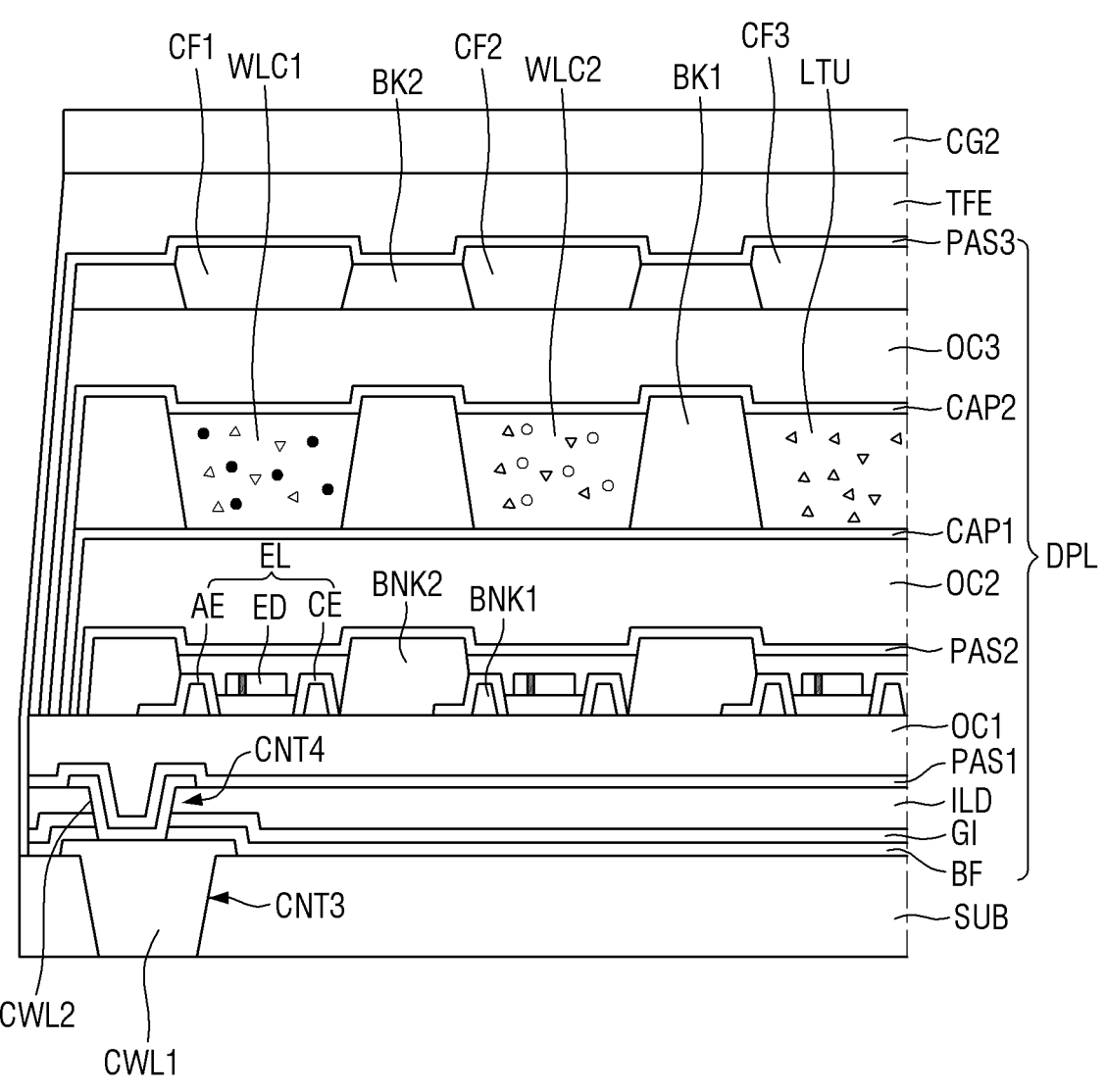
FIGS. 26 and 27 are schematic cross-sectional views illustrating a process of manufacturing the tiled display device of FIG. 25.
Figure 27:
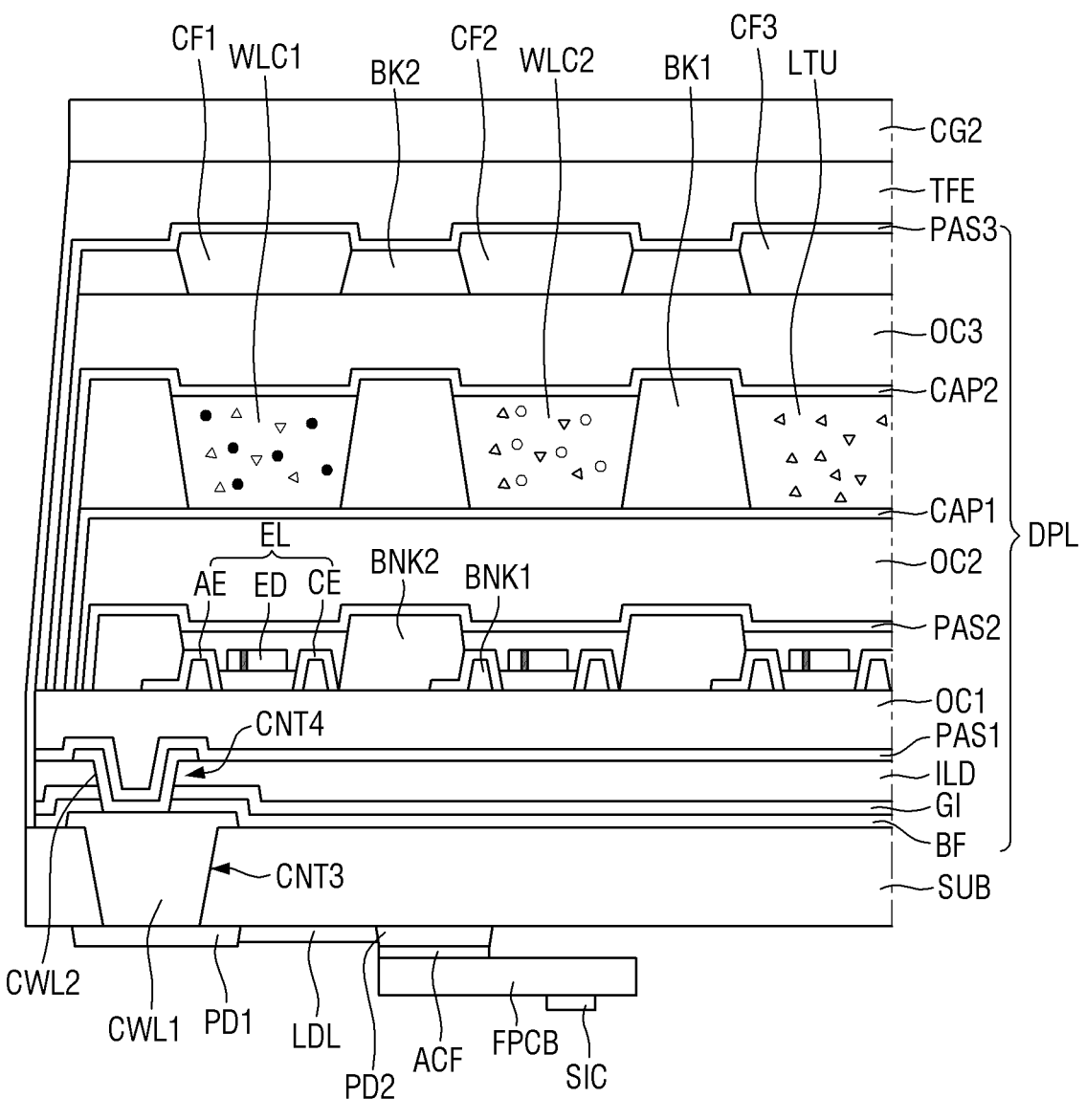

FIGS. 26 and 27 are schematically cross-sectional views illustrating a process of manufacturing the tiled display device of FIG. 25. The process of manufacturing the tiled display device illustrated in FIG. 26 may be a process following the process of manufacturing the display device illustrated in FIG. 22.

In FIG. 26, the another surface of the substrate SUB may be removed until the first connection line CWL1 is exposed. All of the another surface of the substrate SUB may be etched while having a flat surface, and the first connection line CWL1 may be exposed to the another surface of the substrate SUB without an additional contact hole.

In FIG. 27, the first pad unit PD1 may be disposed on another surface of the substrate SUB and may be electrically connected to the first connection line CWL1 exposed to the another surface of the substrate SUB.

The second pad unit PD2 may be disposed on the another surface of the substrate SUB and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

Figure 28:
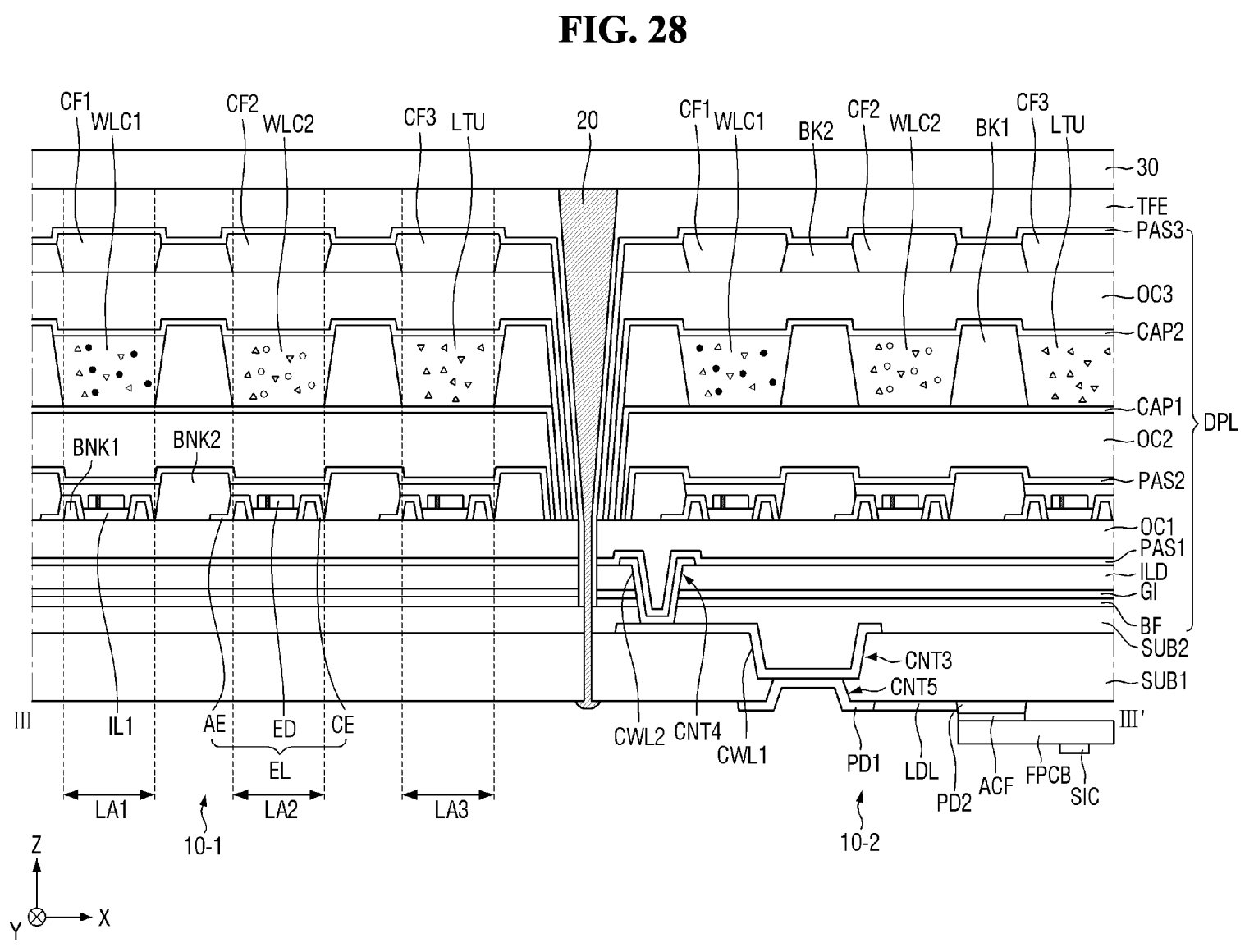

FIG. 28 is a schematic cross-sectional view of a tiled display device according to another embodiment taken along line III-III' of FIG. 7. The tiled display device of FIG. 28 is different from the tiled display device of FIG. 8 or FIG. 18 at least in the configuration of the substrate SUB, and the same configuration as the above-described configuration will be briefly described or omitted.

Referring to FIG. 28, the tiled display device TD may include display devices 10, a coupling member 20, and a cover member 30.

The display device 10 may include a first substrate SUB1, a first connection line CWL1, a second substrate SUB2, a display layer DPL, an encapsulation layer TFE, a first pad unit PD1, a second pad unit. PD2, a flexible film FPCB, and a source driver SIC.

The first substrate SUB1 may be a base plate or a base member and may include an insulating material such as a polymer resin. For example, the first substrate SUB1 may be a flexible substrate capable of bending, folding, rolling, or the like. In case that the first substrate SUB1 is a flexible substrate, the substrate SUB may include polyimide PI, but the material thereof is not limited thereto.

The first substrate SUB1 may include a third contact hole CNT3 provided at one surface and a fifth contact hole CNT5 provided at another surface opposite to the one surface. For example, the third contact hole CNT3 may penetrate a part of the first substrate SUB1 from the upper surface of the first substrate SUB1, and the fifth contact hole CNT5 may penetrate another part of the first substrate SUB1 from the lower surface of the first substrate SUB1. The third contact hole CNT3 and the fifth contact hole CNT5 may be connected to each other. Accordingly, the first substrate SUB1 may be penetrated through the third contact hole CNT3 and the fifth contact hole CNT5.

The third contact hole CNT3 and the fifth contact hole CNT5 may be disposed to overlap the display area DA. The first connection line CWL1 inserted into the third contact hole CNT3 and the first pad unit PD inserted into the fifth contact hole CNT5 may be disposed in the display area DA. Accordingly, the display device 10 may not include a separate pad unit disposed at the outermost side, and the bezel area or dead space of the display device 10 may be minimized. Since the first paid unit PD1 is disposed on the lower surface of the display device 10, the distance between the display devices 10 may be further reduced compared with when the pad unit 10 is disposed on the outermost side of the first substrate SUB1 or when a flexible film is disposed on the side surface of the first substrate SUB1.

The first connection line CWL1 may be disposed on one surface of the first substrate SUB1 and may be electrically connected to the first pad unit PD1 provided on another surface of the first substrate SUB1 through the third contact hole CNT3. For example, the first connection line CWL1 may be inserted into the third contact hole CNT3 and may include a depression or a step corresponding to the size of the third contact hole CNT3. The first connection line CWL1 may supply an electric signal received from the first pad unit PD1 to the thin film transistor layer TFTL through the second connection line CWL2.

The second substrate SUB2 may fill the depression of the first connection line CWL1 formed by the third contact hole CNT3 and may planarize the upper portions of the first substrate SUB1 and the first connection line CWL1. The second substrate SUB2 may be made of (or include) an insulating material such as a polymer resin. For example, the second substrate SUB2 and the first substrate SUB1 may be made of the same material, but the material thereof is not limited thereto. The second substrate SUB2 may include polyimide (PI), but the material thereof is not limited thereto.

The display layer DPL may be disposed on the second substrate SUB2. The display layer DPL may include a buffer layer BF, a thin film transistor layer TFTL, a light emitting element layer EML, a wavelength conversion layer WLCL, and a color filter layer CFL.

The buffer layer BF may be disposed on the second substrate SUB2. The gate insulating film GI may be disposed on the buffer layer BF, and the interlayer insulating film ILD may be disposed on the gate insulating film GI.

The interlayer insulating film ILD, the gate insulating film GI, the buffer layer BF, and the second substrate SUB2 may include a fourth contact hole CNT4 through which the second connection line CWL2 passes. The fourth contact hole CNT4 may be spaced apart from the third contact hole CNT3 in a plan view.

The thin film transistor layer TFTL may further include a second connection line CWL2 disposed on the interlayer insulating film ILD. The second connection line CWL2 may be electrically connected to the first connection line CWL1 disposed on the first substrate SUB1 through the fourth contact hole CNT4. The second connection line CWL2 may be electrically connected to data lines to supply a data voltage and may be electrically connected to scan lines to supply a scan signal.

The display device 10 may include the third contact hole CNT3 provided in one surface of the first substrate SUB1 and the fourth contact hole CNT4 provided in the second substrate SUB2, the buffer layer BF, the gate insulating film GI, and the interlayer insulating film ILD, and thus a signal of the first pad unit PD1 may be supplied to the thin film transistor layer TFTL by using the first connection line CWL1 and the second connection line CWL2. In the display device 10, double contact holes including the third contact hole CNT3 and the fourth contact hole CNT4, and thus the depth of a contact hole may be reduced as compared with a case where only one contact hole penetrating the first substrate SUB1 from the interlayer insulating film ILD is formed.

The first pad unit PD1 may be disposed on another surface of the first substrate SUB1 and may be electrically connected to the first connection line CWL1 exposed through the fifth contact hole CNT5. The third contact hole CNT3 through which the first connection line CWL1 passes and the fifth contact hole CNT5 through which the first pad unit PD1 passes may be electrically connected to each other.

The second pad unit PD2 may be disposed on the another surface of the first substrate SUB1 and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

FIGS. 29 to 34 are schematic cross-sectional views illustrating a process of manufacturing the tiled display device of FIG. 28.

Figure 29:
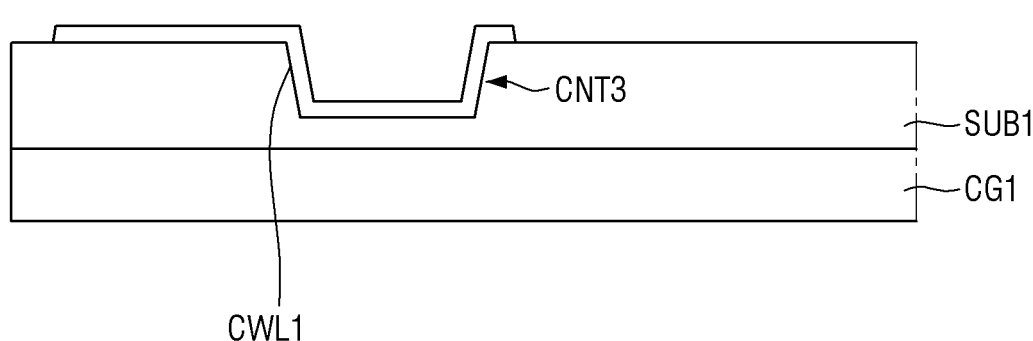
FIGS. 29 to 34 are schematic cross-sectional views illustrating a process of manufacturing the tiled display device of FIG. 28.

In FIG. 29, a first substrate SUB1 may be provided on a first carrier substrate CG1. For example, the first carrier substrate CG1 may be a carrier glass but is not limited thereto. The first carrier substrate CG1 may support the first substrate SUB1 in the process of forming a display layer DPL and an encapsulation layer TFE on the first substrate SUB1.

A third contact hole CNT3 may penetrate a part of the first substrate SUB1 from one surface of the first substrate SUB1. Another part of the first substrate SUB1 that is not penetrated by the third contact hole CNT3 may separate a first connection line CWL1 inserted into the third contact hole CNT3 from the first carrier substrate CG1.

A first connection line CWL1 may be disposed on one surface of the first substrate SUB1 and may be inserted into the third contact hole CNT3. The first connection line CWL1 may include a depression or a step corresponding to the size of the third contact hole CNT3.

Figure 30:
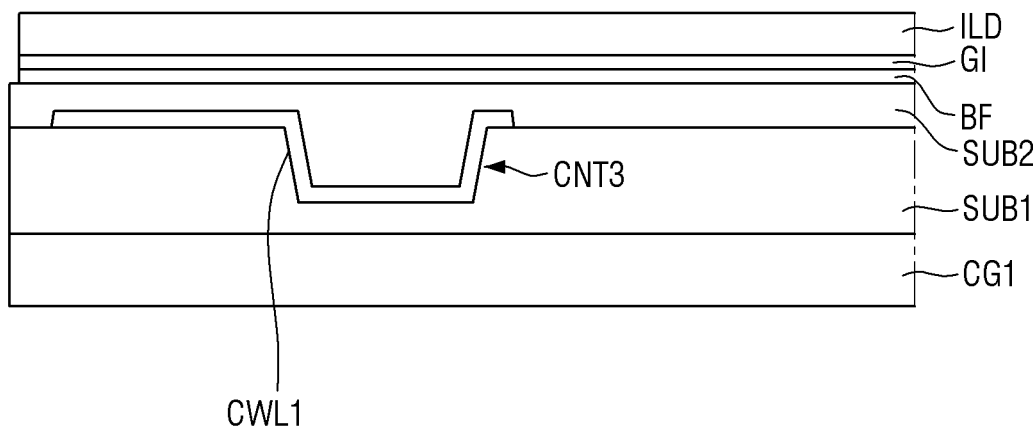

In FIG. 30, a second substrate SUB2 may fill the depression of the first connection line CWL1 formed by the third contact hole CNT3 and may planarize the upper portions of the first substrate SUB1 and the first connection line CWL1. The second substrate SUB2 may be made of an insulating material such as a polymer resin. For example, the second substrate SUB2 and the first substrate SUB1 may be made of the same material, but the material thereof is not limited thereto. The second substrate SUB2 may include polyimide (PI), but the material thereof is not limited thereto.

A buffer layer BF may be disposed on the planarized second substrate SUB2. A gate insulating film GI and an interlayer insulating film ILD may be sequentially stacked on the buffer layer BF.

Figure 31:
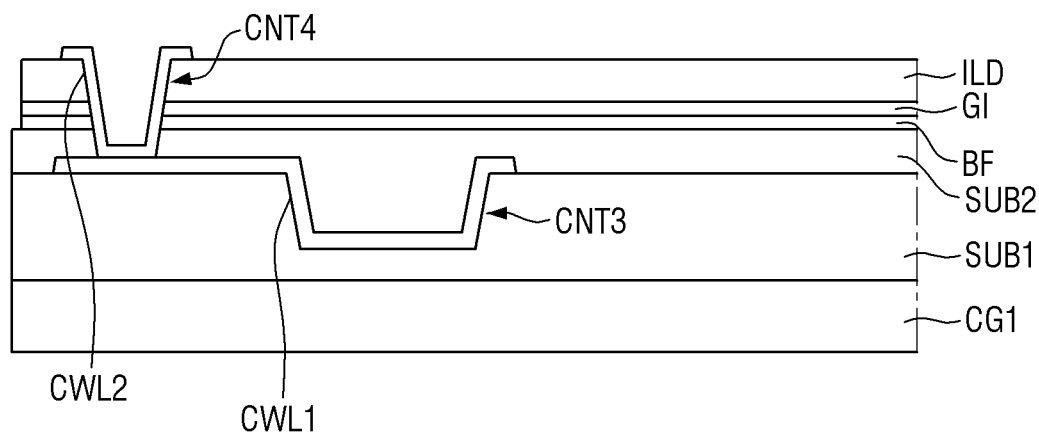

In FIG. 31, a fourth contact hole CNT4 may be formed to penetrate the interlayer insulating film ILD, the gate insulating film GI, the buffer layer BF, and the second substrate SUB2. The fourth contact hole CNT4 may overlap the third contact hole CNT3 in a plan view.

A second connection line CWL2 may be disposed on the interlayer insulating film ILD and may be electrically connected to the first connection line CWL1 disposed on the first substrate SUB1 through the fourth contact hole CNT4. For example, the second connection line CWL2 and a connection electrode CNE of a thin film transistor TFT may be formed of the same material on the same layer, but the disclosure is not limited thereto.

Figure 32:
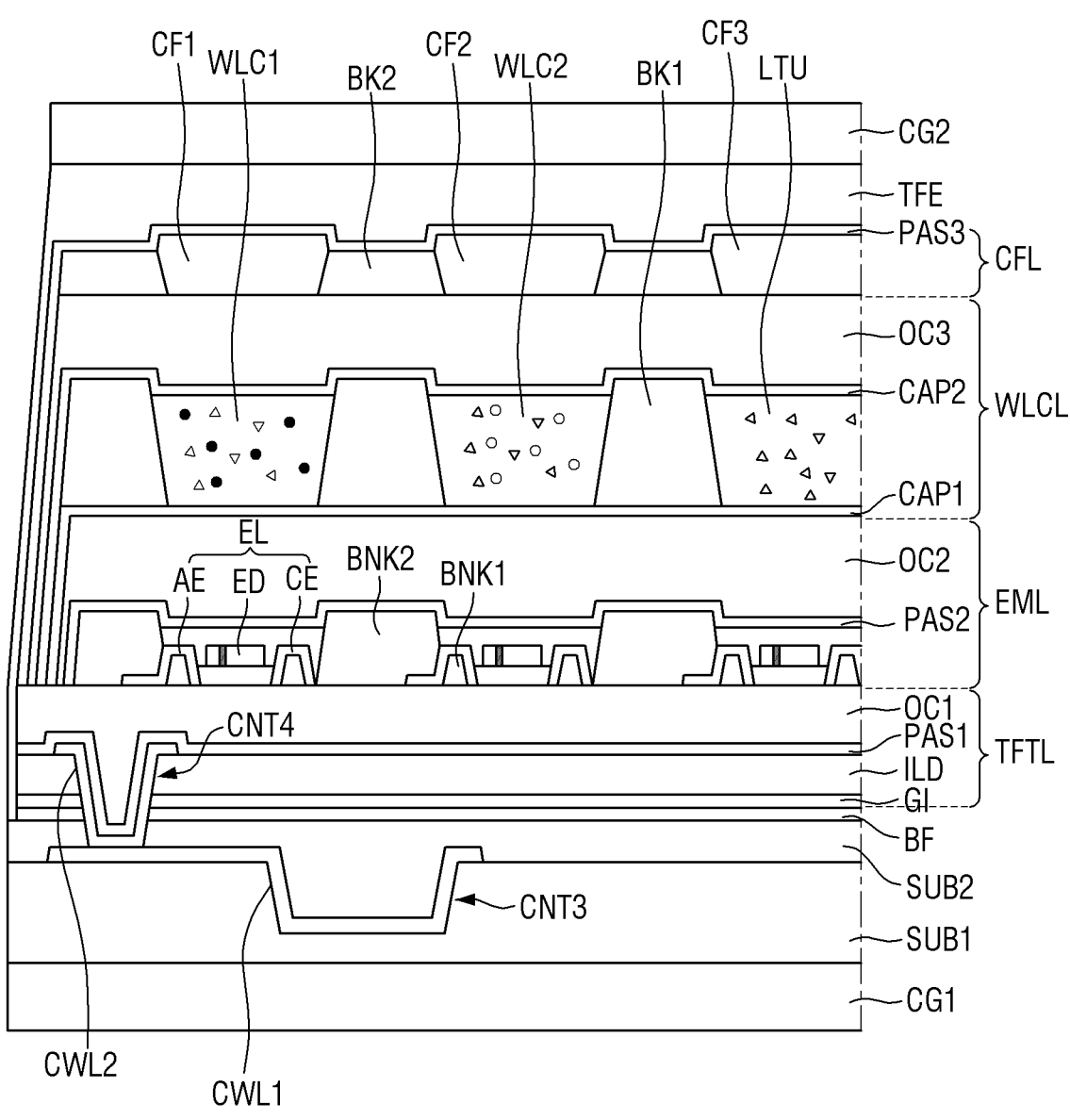

In FIG. 32, a first passivation layer PAS1 may overlap the second connection line CWL2 and the interlayer insulating film ILD, and a first planarization layer OC1 may overlap the first passivation layer PAS1.

A light emitting element layer EML, a wavelength conversion layer WLCL, a color filter layer CFL, and an encapsulation layer TFE may be sequentially stacked on a thin film transistor layer TFTL.

A second carrier substrate CG2 may be disposed on the encapsulation layer TFE. For example, the second carrier substrate CG2 may be a carrier glass but is not limited thereto. The second carrier substrate CG2 may support the display device 10 in the process of forming the first pad unit PD1 on another surface of the first substrate SUB1. After the second carrier substrate CG2 is disposed, the display device 10 being manufactured may be inverted, the second carrier substrate CG2 may support the display device 10, and the first carrier substrate CG1 may be exposed. The first carrier substrate CG1 may be removed after stacking of the display layer DPL and the encapsulation layer TFE is completed. Here, another part of the substrate SUB that is not penetrated by the third contact hole CNT3 separates the first connection line CWL1 inserted into the third contact hole CNT3 from the first carrier substrate CG1. Accordingly, in the display device 10, the third contact hole CNT3 does not completely penetrate the first substrate SUB1, and the first connection line CWL1 is spaced apart from the first carrier substrate CG1, so that the first carrier substrate CG1 may be readily removed. As such, the first carrier substrate CG1 may be easily detached during the process of manufacturing the display device 10.

Figure 33:
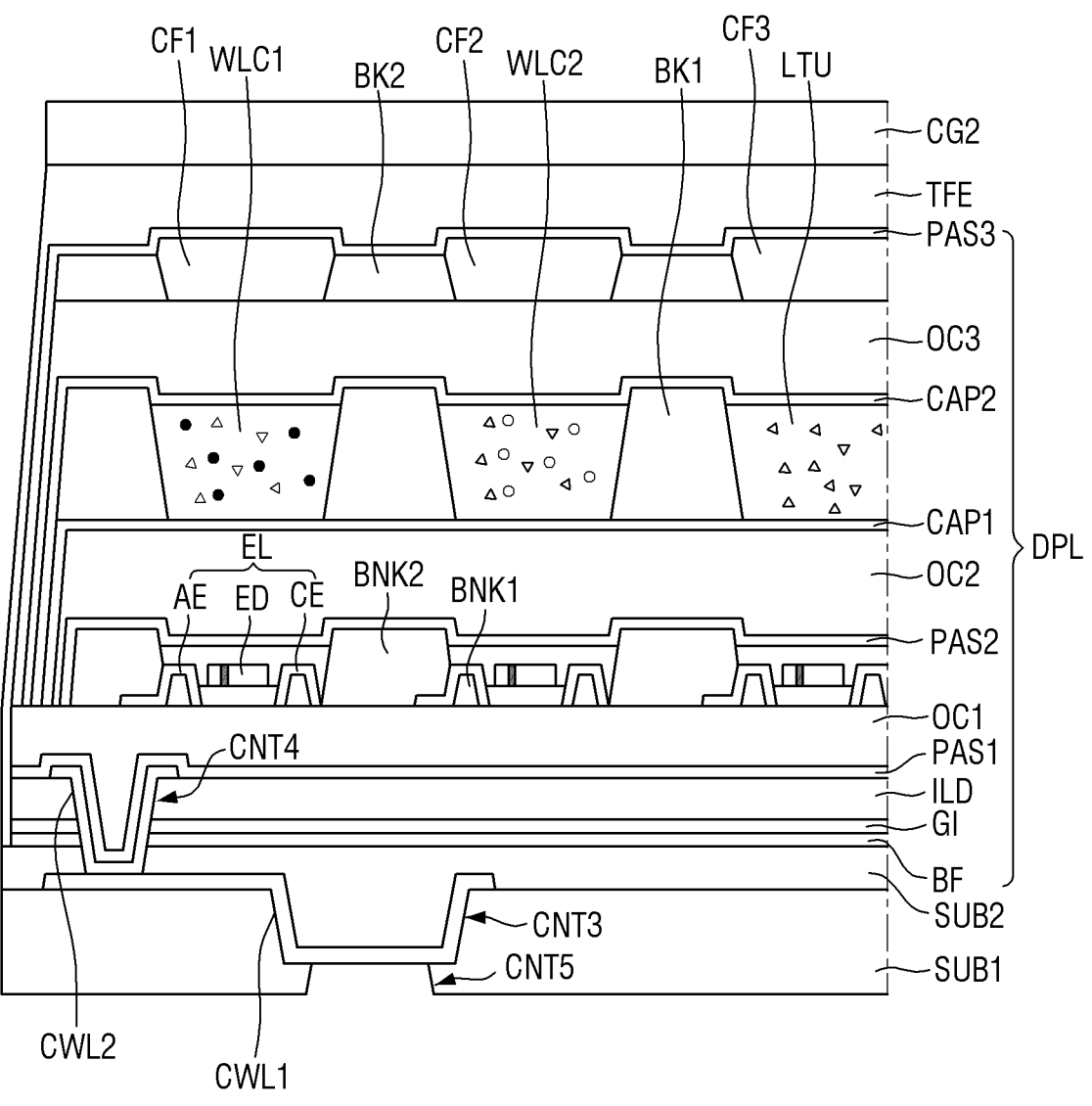

In FIG. 33, a fifth contact hole CNT5 may penetrate another part of the first substrate SUB1 from another surface of the first substrate SUB1. The fifth contact hole CNT5 may be connected to the third contact hole CNT3. The first connection line CWL1 inserted into the third contact hole CNT3 may be exposed through the fifth contact hole CNT5.

Figure 34:
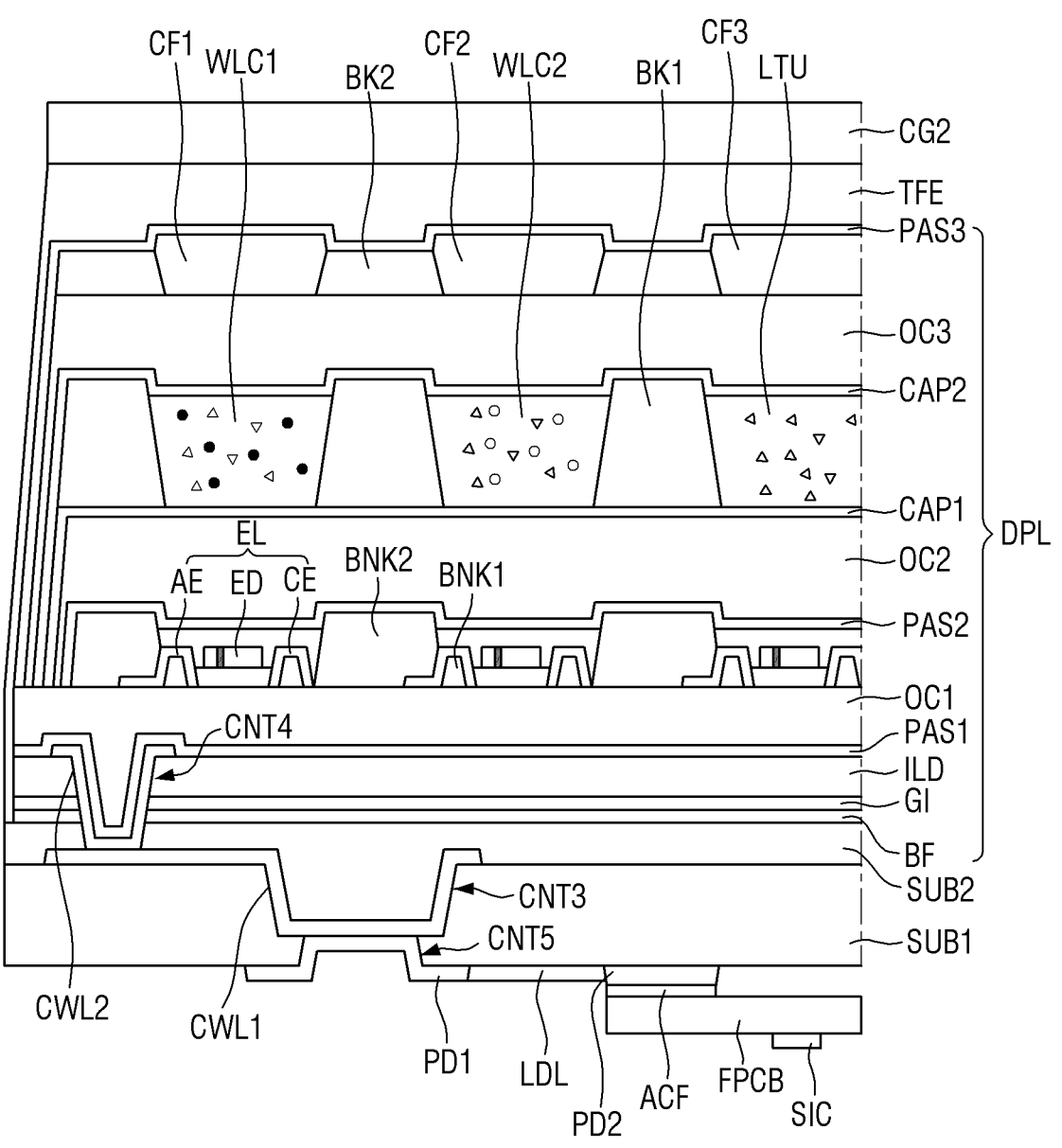

In FIG. 34, a first pad unit PD1 may be disposed on another surface of the first substrate SUB1 and may be electrically connected to the first connection line CWL1 exposed through the fifth contact hole CNT5.

A second pad unit PD2 may be disposed on the another surface of the first substrate SUB1 and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

A flexible film FPCB may be disposed on the another surface of the first substrate SUB1. One side of the flexible film FPCB may be connected to the second pad unit PD2, and another side of the flexible film FPCB may be connected to a source circuit board (not shown) from the other side of the substrate SUB. The flexible film FPCB may transmit a signal of the source driver SIC to the display device 10.

Figure 35:
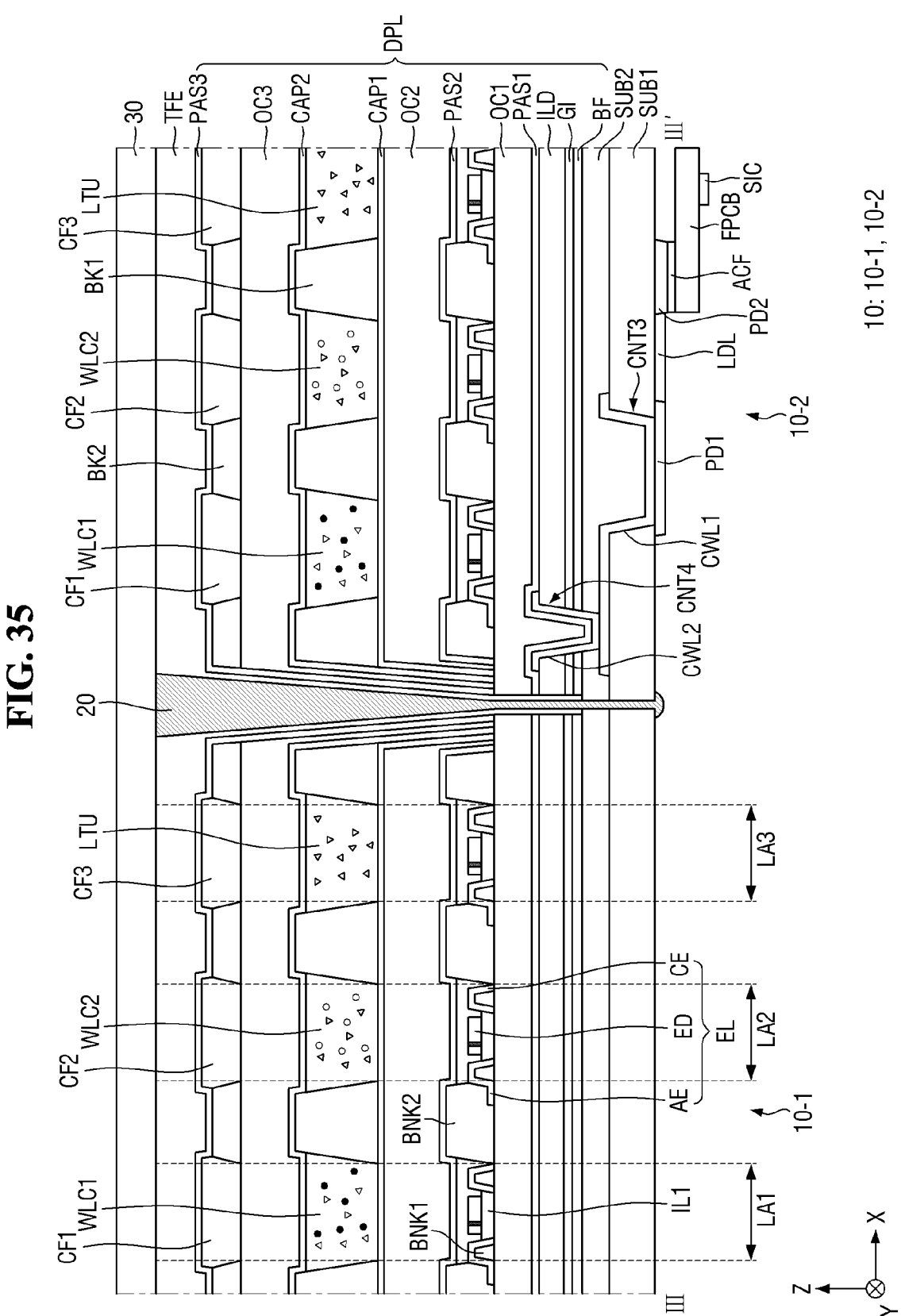
FIG. 35 is a schematic cross-sectional view of a tiled display device according to another embodiment taken along line III-III' of FIG. 7.

FIG. 35 a schematic cross-sectional view of a tiled display device according to another embodiment taken along line III-III' of FIG. 7. The tiled display device of FIG. 35 is different from the tiled display device of FIG. 28 at least in the configuration of the first substrate SUB1, and the same configuration as the above-described configuration will be briefly described or omitted.

Referring to FIG. 35, the tiled display device TD may include display devices 10, a coupling member 20, and a cover member 30.

The display device 10 may include a first substrate SUB1, a first connection line CWL1, a second substrate SUB2, a display layer DPL, an encapsulation layer TFE, a first pad unit PD1, a second pad unit. PD2, a flexible film FPCB, and a source driver SIC.

The first substrate SUB1 may be a base plate or a base member and may be made of an insulating material such as a polymer resin. For example, the first substrate SUB1 may be a flexible substrate capable of bending, folding, rolling, or the like. In case that the first substrate SUB1 is a flexible substrate, the first substrate SUB1 may include polyimide PI, but the material thereof is not limited thereto.

The first substrate SUB1 may include a third contact hole CNT3 provided at one surface. For example, the third contact hole CNT3 may penetrate one surface of the first substrate SUB1 from another surface thereof. The third contact hole CNT3 may be disposed to overlap the display area DA. The first connection line CWL1 inserted into the third contact hole CNT3 may be disposed in the display area DA. Accordingly, the display device 10 may not include a separate pad unit disposed at the outermost side, and the bezel area or dead space of the display device 10 may be reduced or minimized. Since the first paid unit PD1 is disposed on the lower surface of the display device 10, the distance between the display devices 10 may be further reduced compared with when the pad unit 10 is disposed on the outermost side of the first substrate SUB1 or when a flexible film is disposed on the side surface of the first substrate SUB1.

The first connection line CWL1 may be disposed on one surface of the first substrate SUB1 and may be electrically connected to the first pad unit PD1 provided on another surface of the first substrate SUB1 through the third contact hole CNT3. For example, the first connection line CWL1 may be inserted into the third contact hole CNT3 and may have a depression or a step corresponding to the size of the third contact hole CNT3. The first connection line CWL1 may supply an electric signal received from the first pad unit PD1 to a thin film transistor layer TFTL through the second connection line CWL2.

The second substrate SUB2 may fill the depression of the first connection line CWL1 formed by the third contact hole CNT3 and may planarize the upper portions of the first substrate SUB1 and the first connection line CWL1. The second substrate SUB2 may be made of (or include) an insulating material such as a polymer resin. For example, the second substrate SUB2 and the first substrate SUB1 may be made of the same material, but the material thereof is not limited thereto. The second substrate SUB2 may include polyimide (PI), but the material thereof is not limited thereto.

The display layer DPL may be disposed on the first substrate SUB1. The display layer DPL may include a buffer layer BF, a thin film transistor layer TFTL, a light emitting element layer EML, a wavelength conversion layer WLCL, and a color filter layer CFL.

The first pad unit PD1 may be disposed on another surface of the first substrate SUB1 and may be electrically connected to the first connection line CWL1 exposed to another of the first substrate SUB1 through the third contact hole CNT3.

The second pad unit PD2 may be disposed on the another surface of the first substrate SUB1 and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

Figure 36:
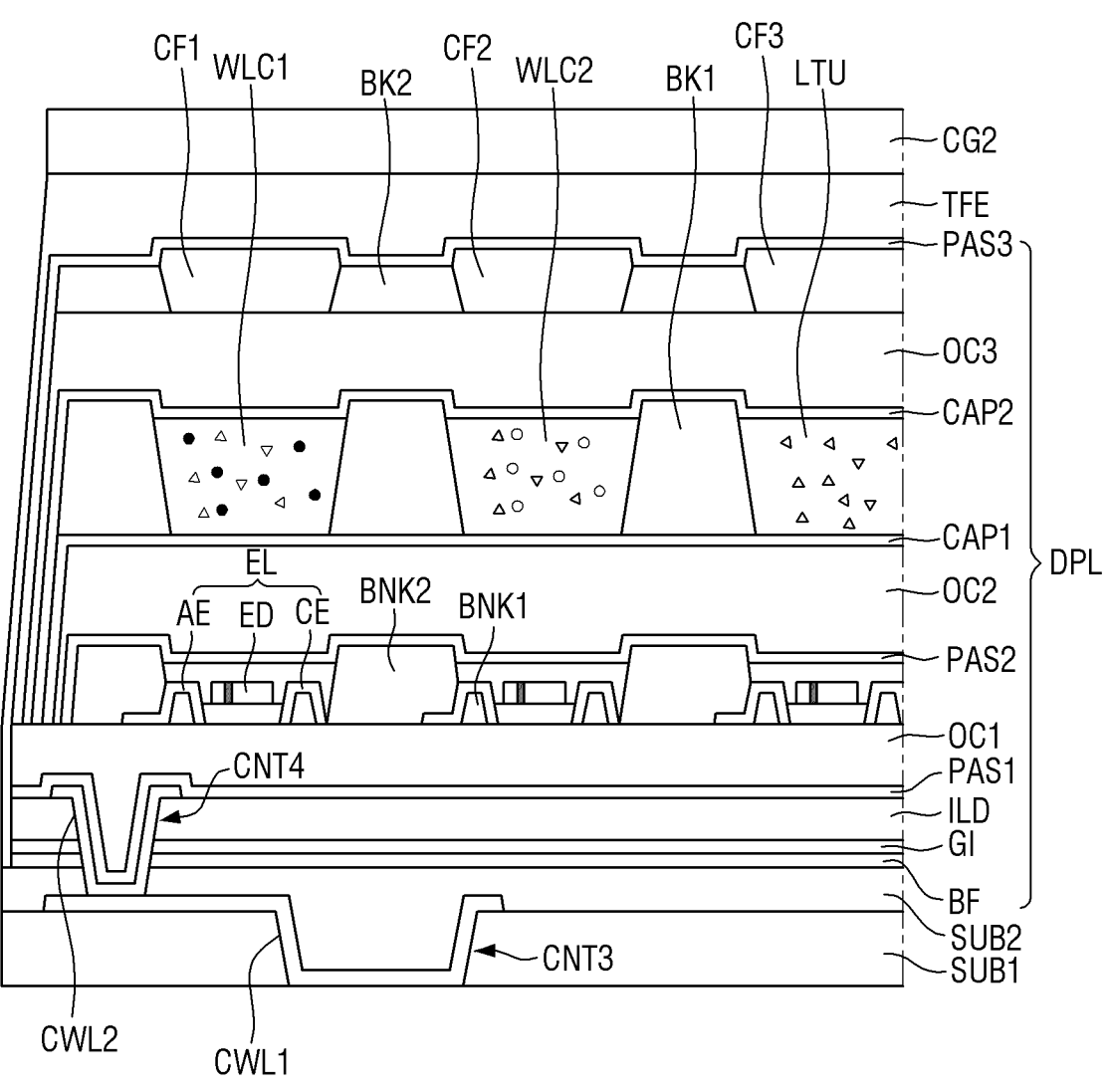
FIGS. 36 and 37 are schematic cross-sectional views illustrating a process of manufacturing the tiled display device of FIG. 35.
Figure 37:
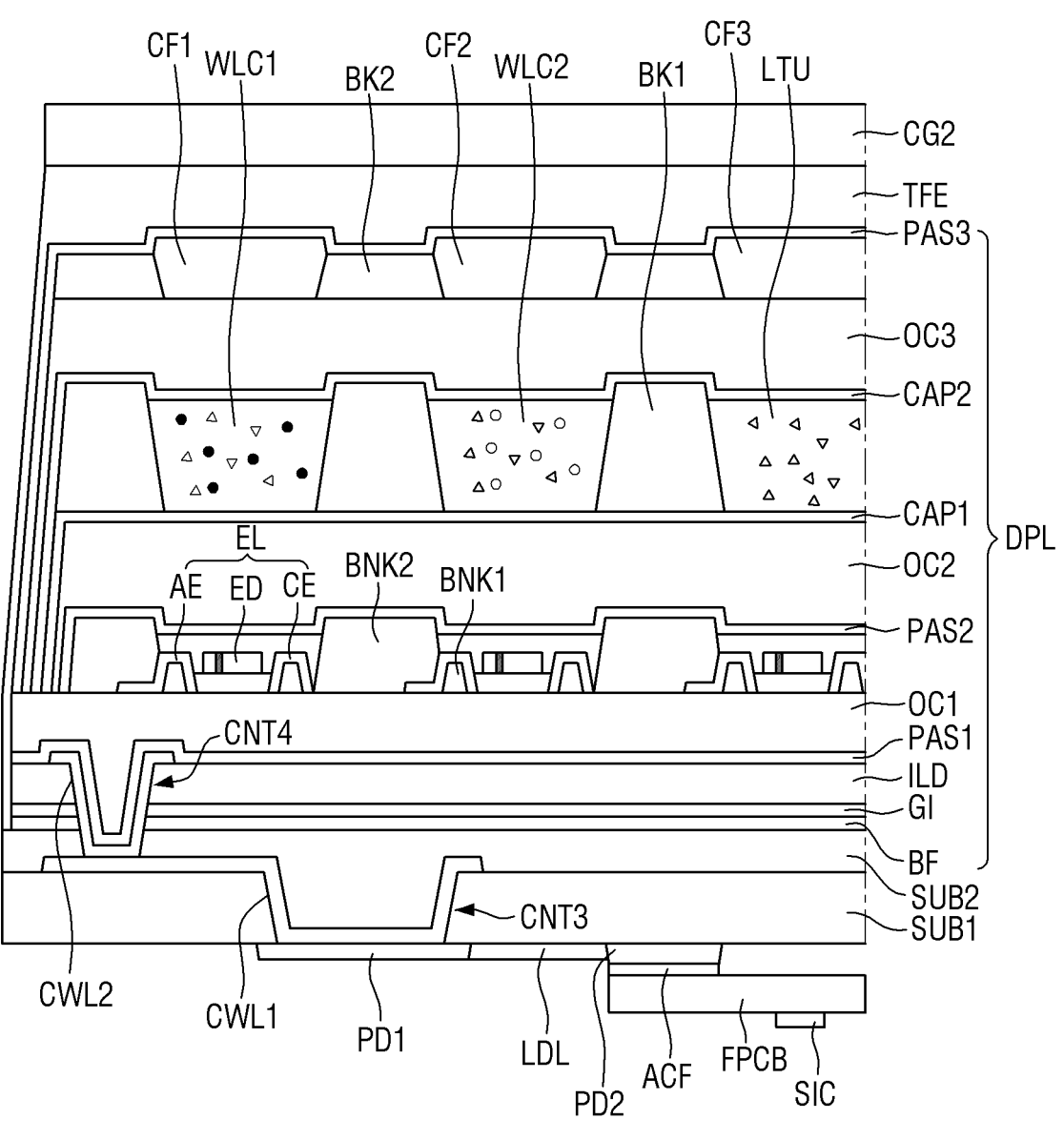

FIGS. 36 and 37 are schematic cross-sectional views illustrating a process of manufacturing the tiled display device of FIG. 35. The process of manufacturing the tiled display device illustrated in FIG. 36 may be a process following the process of manufacturing the display device illustrated in FIG. 32.

In FIG. 36, another surface of the first substrate SUB1 may be removed until the first connection line CWL1 is exposed. All of the another surface of the first substrate SUB1 may be etched while having a flat surface, and the first connection line CWL1 may be exposed to the another surface of the first substrate SUB1 without an additional contact hole.

In FIG. 37, the first pad unit PD1 may be disposed on the another surface of the first substrate SUB1 and may be electrically connected to the first connection line CWL1 exposed to the another surface of the first substrate SUB1.

The second pad unit PD2 may be disposed on the another surface of the first substrate SUB1 and may be spaced apart from the first pad unit PD1. The second pad unit PD2 may be electrically connected to the first pad unit PD1 through a lead line LDL. The second pad unit PD2 may receive various voltages or signals from the flexible film FPCB and may supply the voltages or signals to the first pad unit PD1, the first connection line CWL1, and the second connection line CWL2.

Although the some embodiments of the disclosure have been disclosed for illustrative purposes, those skilled in the art will appreciate that various modifications, additions and substitutions are possible, without departing from the scope and spirit of the claimed invention as disclosed in the accompanying claims.

What is claimed is:

1. A display device, comprising:
a substrate comprising a first contact hole disposed in the substrate;
a first connection line disposed on a surface of the substrate and electrically connected to a pad unit disposed on another surface opposite to the surface of the substrate through the first contact hole, the surface and the another surface being on opposite sides of the substrate in the thickness direction;
an organic filling part filling a depression of the first connection line formed in the first contact hole to planarize an upper surface of the first connection line such that an upper surface of the organic filling part is coplanar with the upper surface of the first connection line;
a thin film transistor layer disposed on the substrate and the first connection line, the thin film transistor layer comprising at least one thin film transistor and at least one insulating film; and
a light emitting element layer disposed on the thin film transistor layer, the light emitting element layer including a light emitting element electrically connected to the at least one thin film transistor, wherein
the thin film transistor layer comprises a second connection line electrically connecting the first connection line and the at least one thin film transistor through a second contact hole in the at least one insulating film,
the first contact hole, in which the first connection line is disposed, and the second contact hole, in which the second connection line is disposed, are laterally spaced apart from each other in a widthwise direction of the substrate perpendicular to the thickness direction,
the first connection line extends continuously from the first contact hole to overlap a center portion of the second contact hole in the thickness direction of the substrate,
the first connection line is between the organic filling part and the pad unit such that the organic filling part and the pad unit are spaced apart from each other,
a first insulating film of the at least one insulating film directly contacts the upper surface of the organic filling part, and
a material of the first insulating film of the at least one insulating film is different than a material of the organic filling part.

2. The display device of claim 1, wherein the material of the organic filling part includes at least one of acrylic resin, epoxy resin, phenolic resin, polyamide resin, and polyimide resin.

3. The display device of claim 1, wherein the at least one insulating film of the thin film transistor layer further comprises:
a gate insulating film disposed on the first connection line and the substrate;
an interlayer insulating film disposed on the gate insulating film; and
wherein the thin film transistor layer further comprises:
a connection electrode disposed on the interlayer insulating film and electrically connected to the at least one thin film transistor, and the second connection line and the connection electrode are disposed on a same layer.

4. The display device of claim 3, wherein the second connection line is electrically connected to the first connection line through the second contact hole penetrating the at least one insulating film.

5. The display device of claim 1, wherein
the substrate comprises another contact hole disposed on the another surface of the substrate and connected to the first contact hole, and
the pad unit is electrically connected to the first connection line through the another contact hole.

6. The display device of claim 1, wherein the first connection line is exposed at the another surface of the substrate through the first contact hole and is electrically connected to the pad unit.

7. The display device of claim 1, wherein
the substrate comprises a plurality of light emitting areas and a plurality of light blocking areas surrounding the plurality of light emitting areas, and
the display device further comprises:
a wavelength conversion layer disposed on the light emitting element layer, the wavelength conversion layer including a wavelength conversion unit corresponding to a part of the plurality of light emitting areas and a light transmission unit corresponding to another part of the plurality of light emitting areas; and
a color filter layer disposed on the wavelength conversion layer and including a plurality of color filters respectively corresponding to the plurality of light emitting areas.

8. The display device of claim 1, further comprising:
a flexible film disposed on the another surface of the substrate and connected to the pad unit; and
a source driver disposed on the flexible film and supplying a voltage to the second connection line.

9. A tiled display device, comprising:
a plurality of display devices each including a display area including a plurality of pixels and a non-display area adjacent to the display area; and
a coupling member connecting the plurality of display devices, wherein each of the plurality of display devices comprises:
a substrate comprising a first contact hole disposed in the substrate;
a first connection line disposed on a surface of the substrate and electrically connected to a pad unit disposed on another surface opposite to the surface of the substrate through the first contact hole, the surface and the another surface being on opposite sides of the substrate in the thickness direction;

an organic filling part filling a depression of the first connection line formed in the first contact hole to planarize an upper surface of the first connection line such that an upper surface of the organic filling part is coplanar with the upper surface of the first connection line;

a thin film transistor layer disposed on the substrate and the first connection line, the thin film transistor layer comprising at least one thin film transistor and at least one insulating film; and a light emitting element layer disposed on the thin film transistor layer, the light emitting element layer including a light emitting element electrically connected to the at least one thin film transistor, wherein the thin film transistor layer comprises a second connection line electrically connecting the first connection line and the at least one thin film transistor through a second contact hole in the at least one insulating film, the first contact hole, in which the first connection line is disposed, and the second contact hole, in which the second connection line is disposed, are laterally spaced apart from each other in a widthwise direction of the substrate perpendicular to the thickness direction, the first connection line extends continuously from the first contact hole to overlap a center portion of the second contact hole in the thickness direction of the substrate, the first connection line is between the organic filling part and the pad unit such that the organic filling part and the pad unit are spaced apart from each other, a first insulating film of the at least one insulating film directly contacts the upper surface of the organic filling part, and a material of the first insulating film of the at least one insulating film is different than a material of the organic filling part.

10. The display device of claim 1, wherein:

the first connection line extends to contact a bottom portion of the second connection line disposed in the center portion of the second contact hole, and the second contact hole is disposed at a higher level than the first contact hole.

\*  \*  \*  \*  \*